(12) United States Patent
Futatsuyama et al.

(10) Patent No.: US 10,629,265 B2
(45) Date of Patent: Apr. 21, 2020

(54) SEMICONDUCTOR MEMORY DEVICE

(71) Applicant: TOSHIBA MEMORY CORPORATION, Minato-ku, Tokyo (JP)

(72) Inventors: Takuya Futatsuyama, Yokohama Kanagawa (JP); Masanobu Shirakawa, Chigasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/659,407

(22) Filed: Oct. 21, 2019

(65) Prior Publication Data

US 2020/0051640 A1 Feb. 13, 2020

Related U.S. Application Data

(63) Continuation of application No. 15/919,480, filed on Mar. 13, 2018, now Pat. No. 10,504,597, which is a
(Continued)

(51) Int. Cl.
*G11C 16/04* (2006.01)
*G11C 16/26* (2006.01)
(Continued)

(52) U.S. Cl.
CPC .......... *G11C 16/0483* (2013.01); *G11C 7/062* (2013.01); *G11C 7/1042* (2013.01);
(Continued)

(58) Field of Classification Search
None
See application file for complete search history.

(56) References Cited

U.S. PATENT DOCUMENTS

2004/0088470 A1* 5/2004 Kawamura ........ G11C 16/0483
711/1
2009/0267128 A1 10/2009 Maejima
(Continued)

FOREIGN PATENT DOCUMENTS

JP 2004087002 A 3/2004
JP 2012514283 A 6/2012
(Continued)

OTHER PUBLICATIONS

International Search Report (ISR) dated Jan. 19, 2016 issued in International Application No. PCT/JP2015/081658.
(Continued)

*Primary Examiner* — James G Norman
(74) *Attorney, Agent, or Firm* — Holtz, Holtz & Volek PC

(57) ABSTRACT

A semiconductor memory device includes first and second read modes, a first memory cell and a second memory cell; a first word line electrically connected to a gate of the first memory cell and a gate of the second memory cell; a first bit line electrically connected to the first memory cell; a second bit line electrically connected to the second memory cell; a first sense amplifier configured to determine data read from the first memory cell at a first timing in the first and second read modes; a second sense amplifier configured to determine data read from the second memory cell at a second timing different from the first timing in the first read mode; a second sense amplifier configured to determine data read
(Continued)

from the second memory cell at a second timing different from the first timing in the first read mode; a delay circuit; and a controller.

7 Claims, 60 Drawing Sheets

Related U.S. Application Data continuation of application No. PCT/JP2015/081658, filed on Nov. 10, 2015.

(51) Int. Cl.
| | |
|---|---|
| G11C 16/10 | (2006.01) |
| G11C 7/10 | (2006.01) |
| G11C 11/56 | (2006.01) |
| G11C 16/32 | (2006.01) |
| G11C 16/34 | (2006.01) |
| G11C 16/08 | (2006.01) |
| G11C 7/06 | (2006.01) |
| G11C 8/08 | (2006.01) |

(52) U.S. Cl.
CPC ............ *G11C 8/08* (2013.01); *G11C 11/5642* (2013.01); *G11C 16/08* (2013.01); *G11C 16/10* (2013.01); *G11C 16/26* (2013.01); *G11C 16/32* (2013.01); *G11C 16/3427* (2013.01)

(56) References Cited

U.S. PATENT DOCUMENTS

| | | |
|---|---|---|
| 2009/0268522 A1 | 10/2009 | Maejima |
| 2010/0165743 A1 | 7/2010 | Cernea |
| 2010/0207195 A1 | 8/2010 | Fukuzumi et al. |
| 2011/0284946 A1 | 11/2011 | Kiyotoshi |
| 2011/0305089 A1 | 12/2011 | Abe et al. |
| 2013/0148436 A1 | 6/2013 | Kurosawa |
| 2014/0003149 A1 | 1/2014 | Maejima |
| 2014/0085979 A1 | 3/2014 | Kono |
| 2014/0233309 A1 | 8/2014 | Shibata |
| 2014/0247671 A1 | 9/2014 | Ito et al. |

FOREIGN PATENT DOCUMENTS

| | | |
|---|---|---|
| JP | 2014011192 A | 1/2014 |
| JP | 2014067942 A | 4/2014 |
| JP | 2014157650 A | 8/2014 |
| JP | 2014170599 A | 9/2014 |

OTHER PUBLICATIONS

Written Opinion dated Jan. 19, 2016 issued in International Application No. PCT/JP2015/081658.

\* cited by examiner

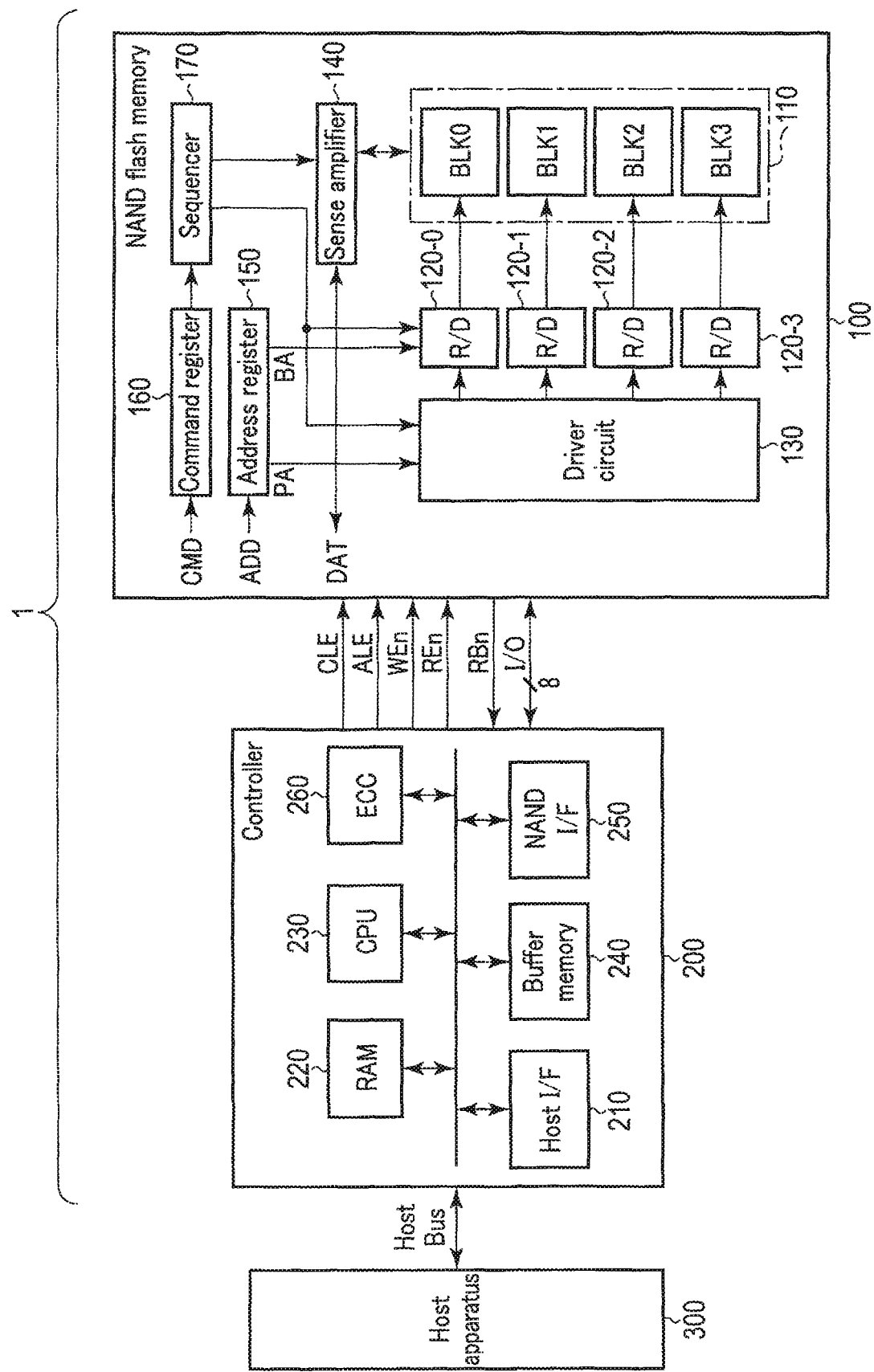
F I G. 1

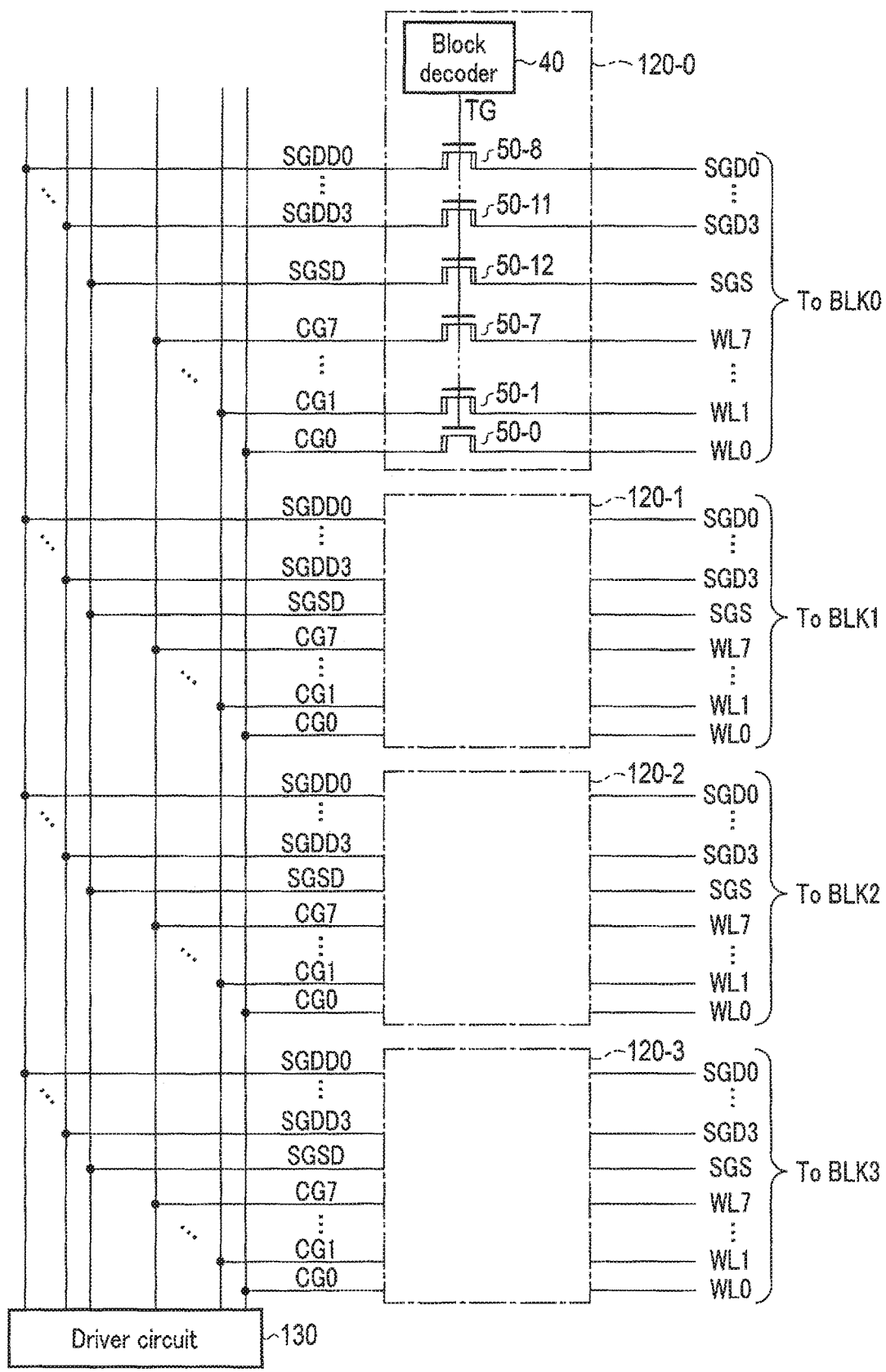
F I G. 3

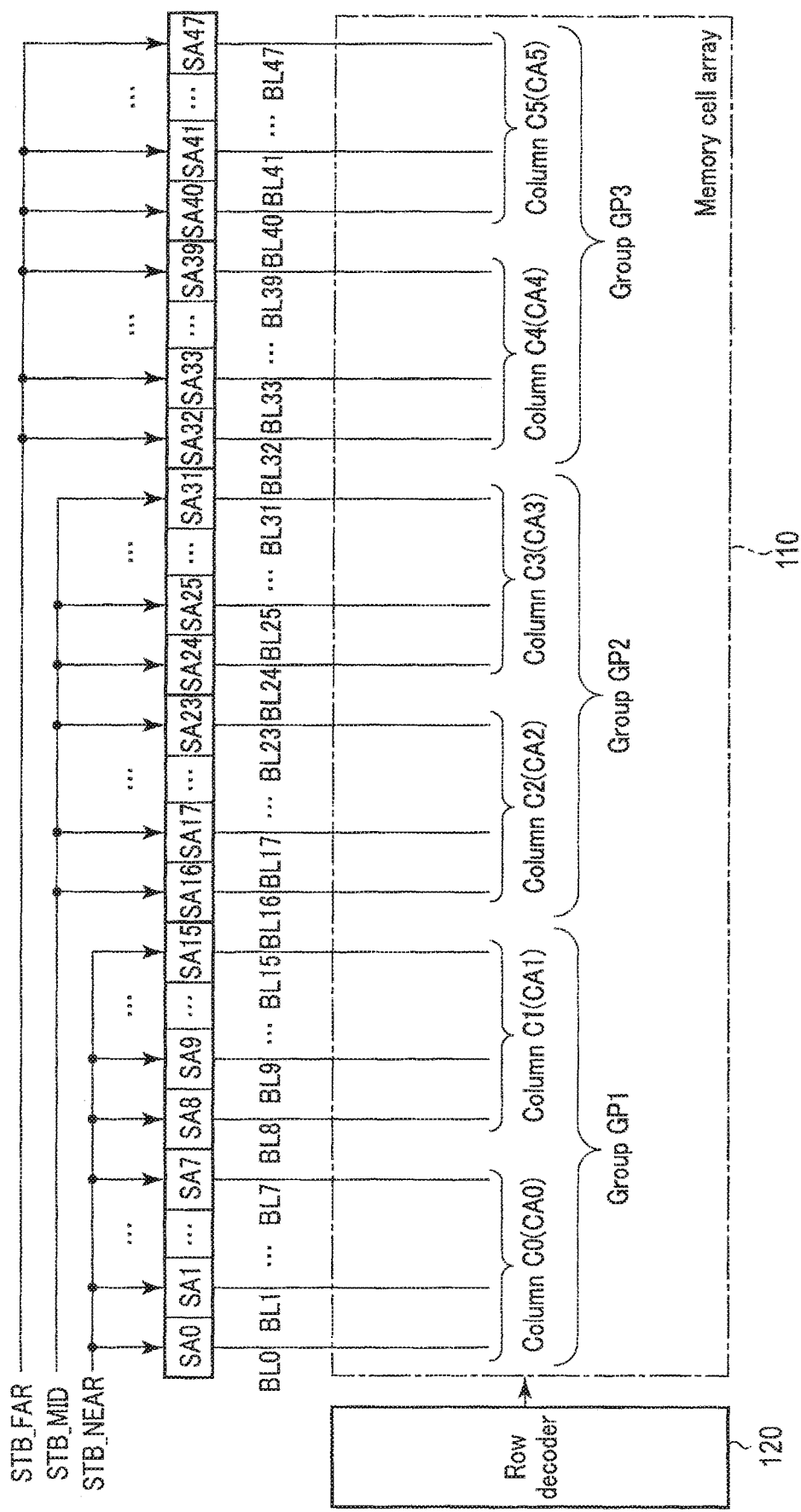
F I G. 5

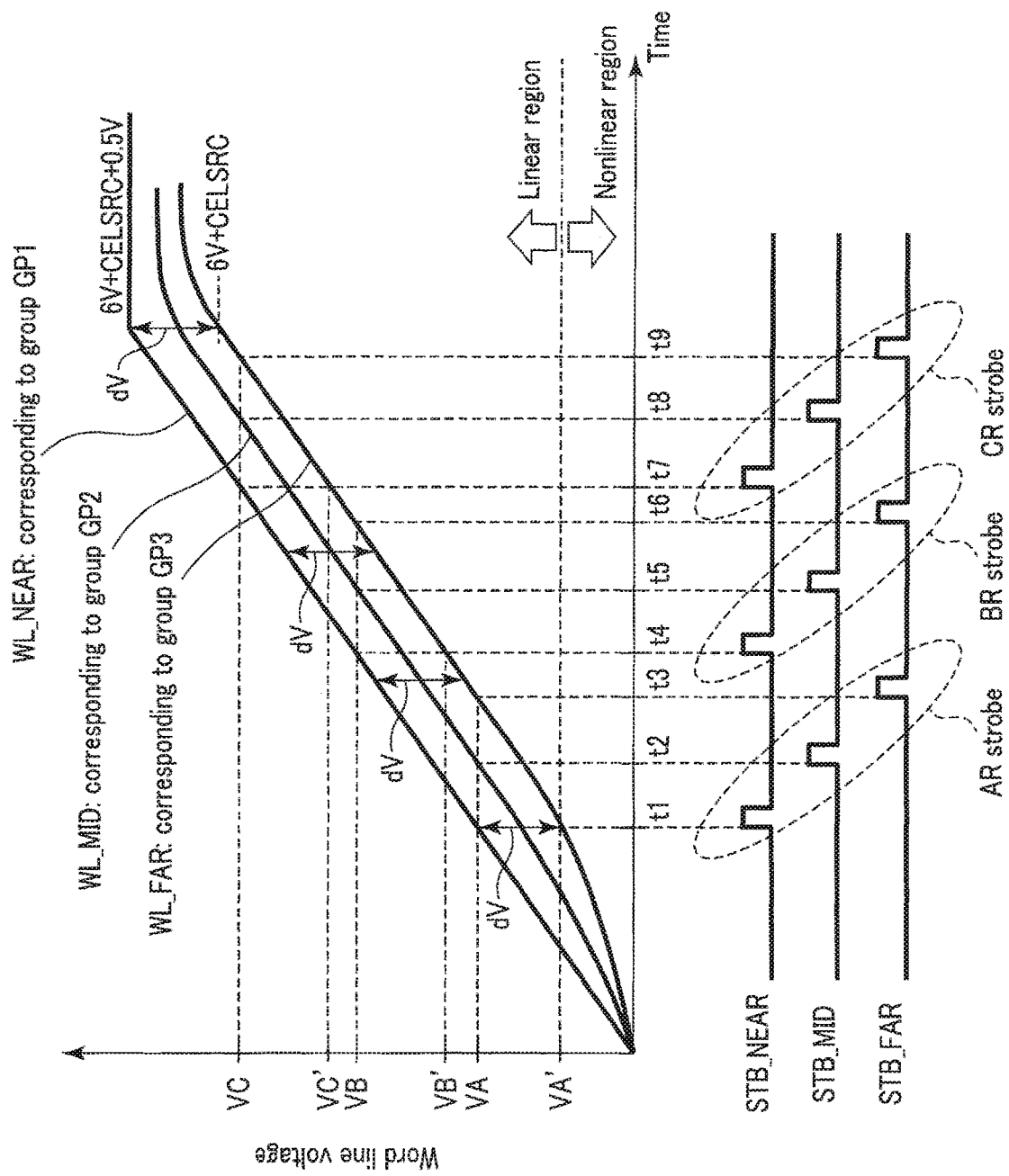
F I G. 9

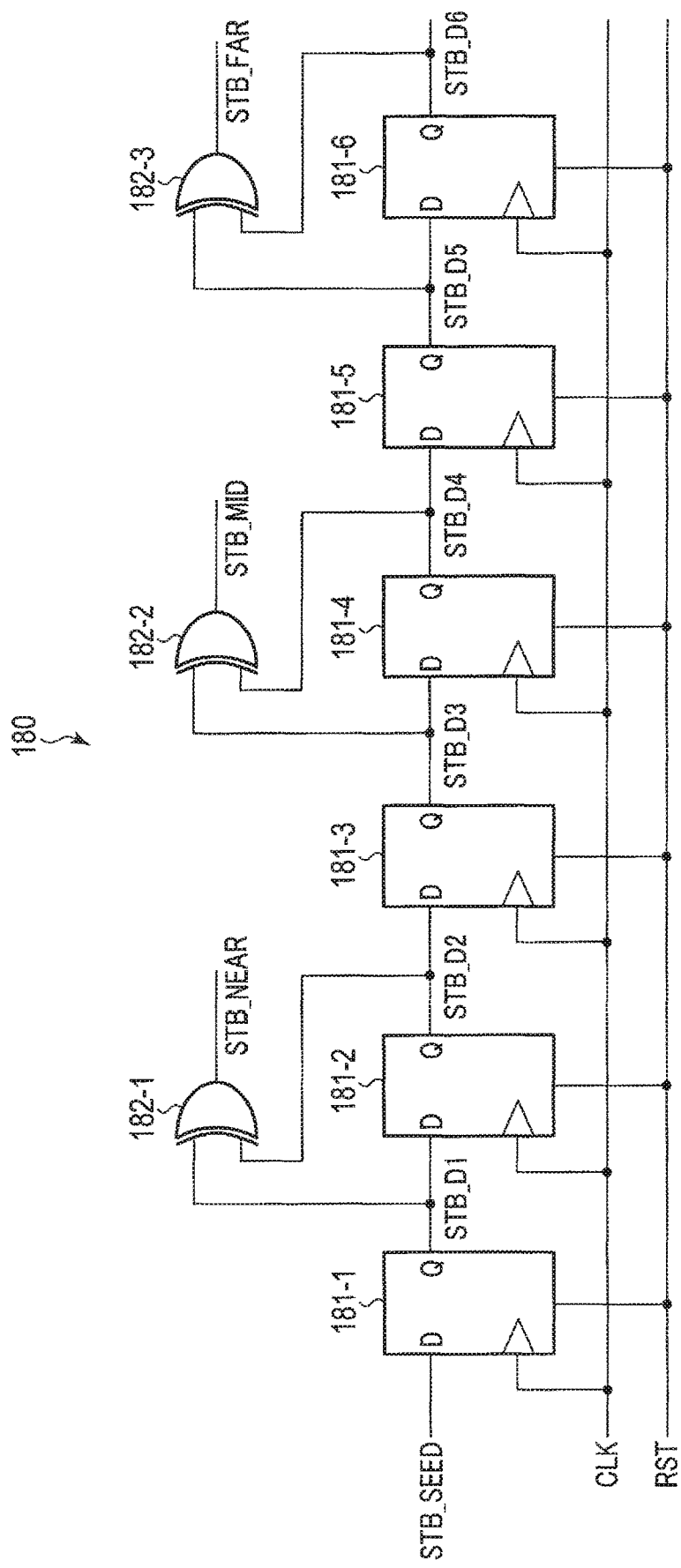
F I G. 12

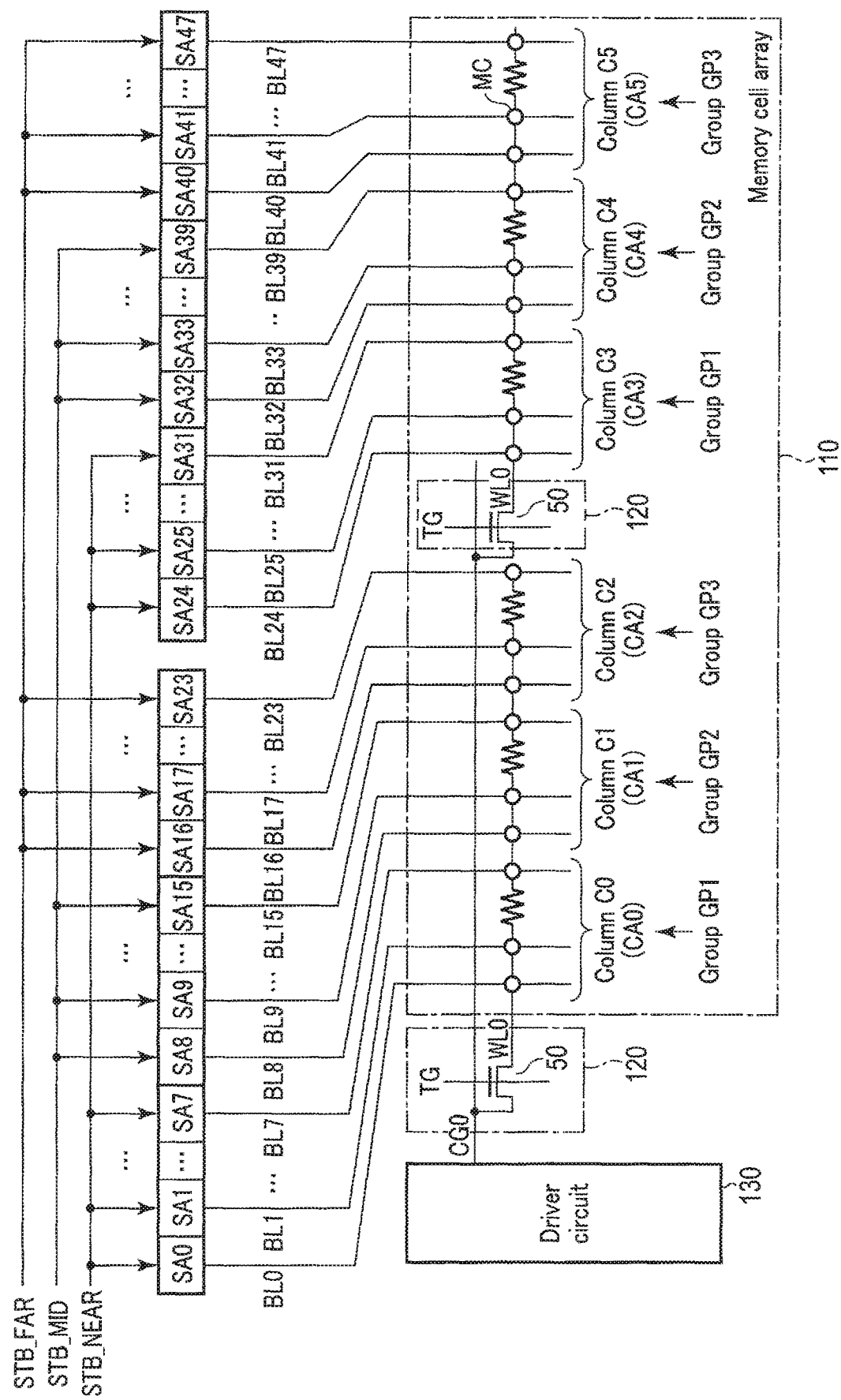
F I G. 24

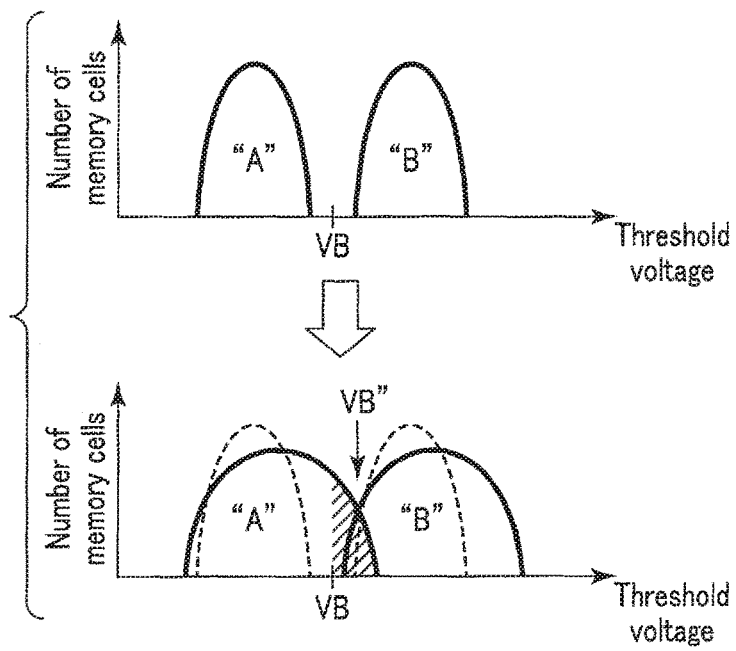
F I G. 25
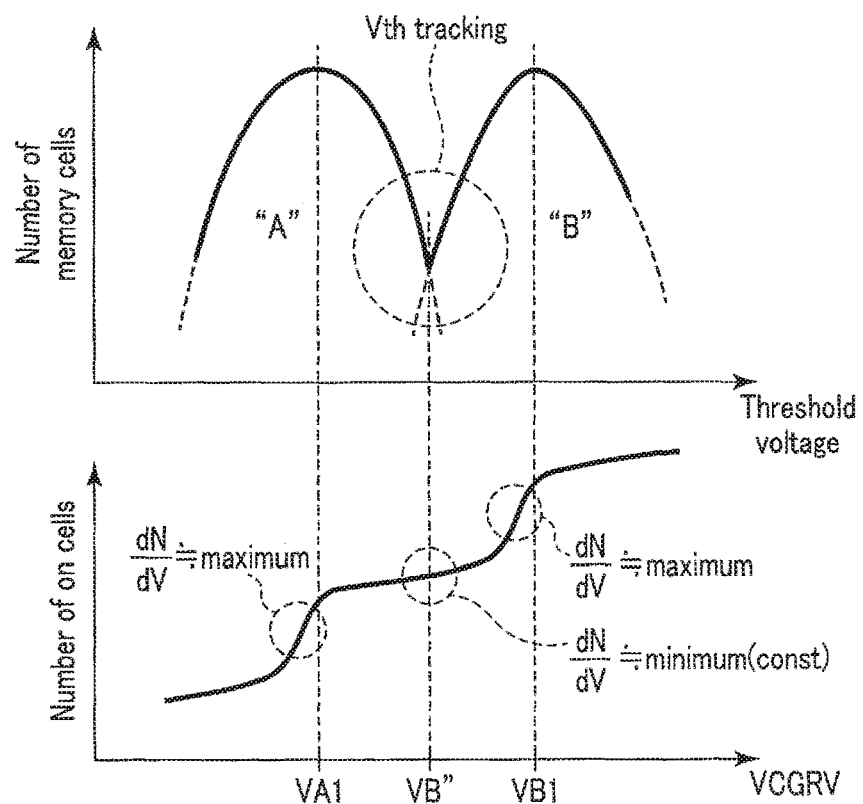
F I G. 26

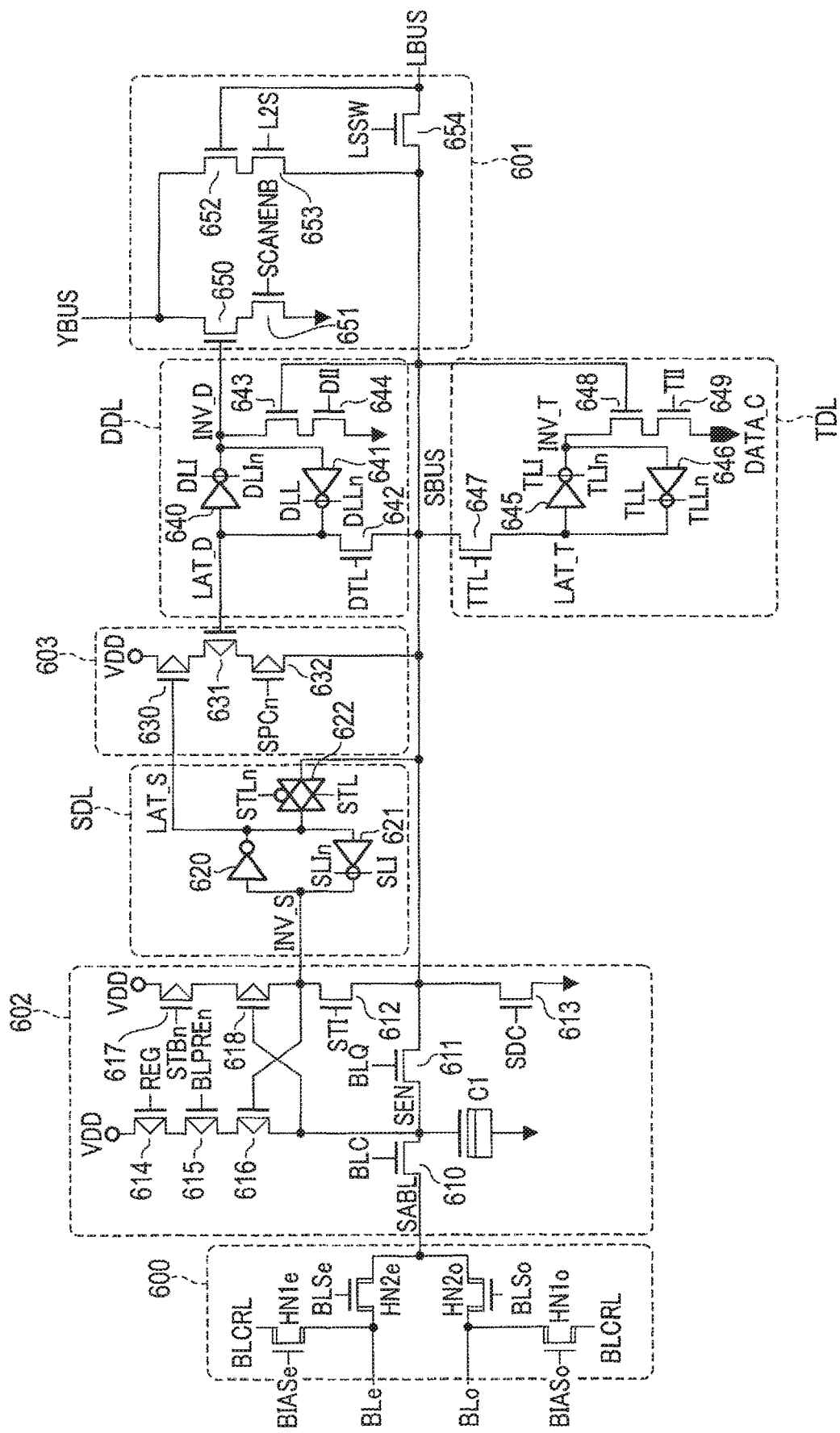
F I G. 29A

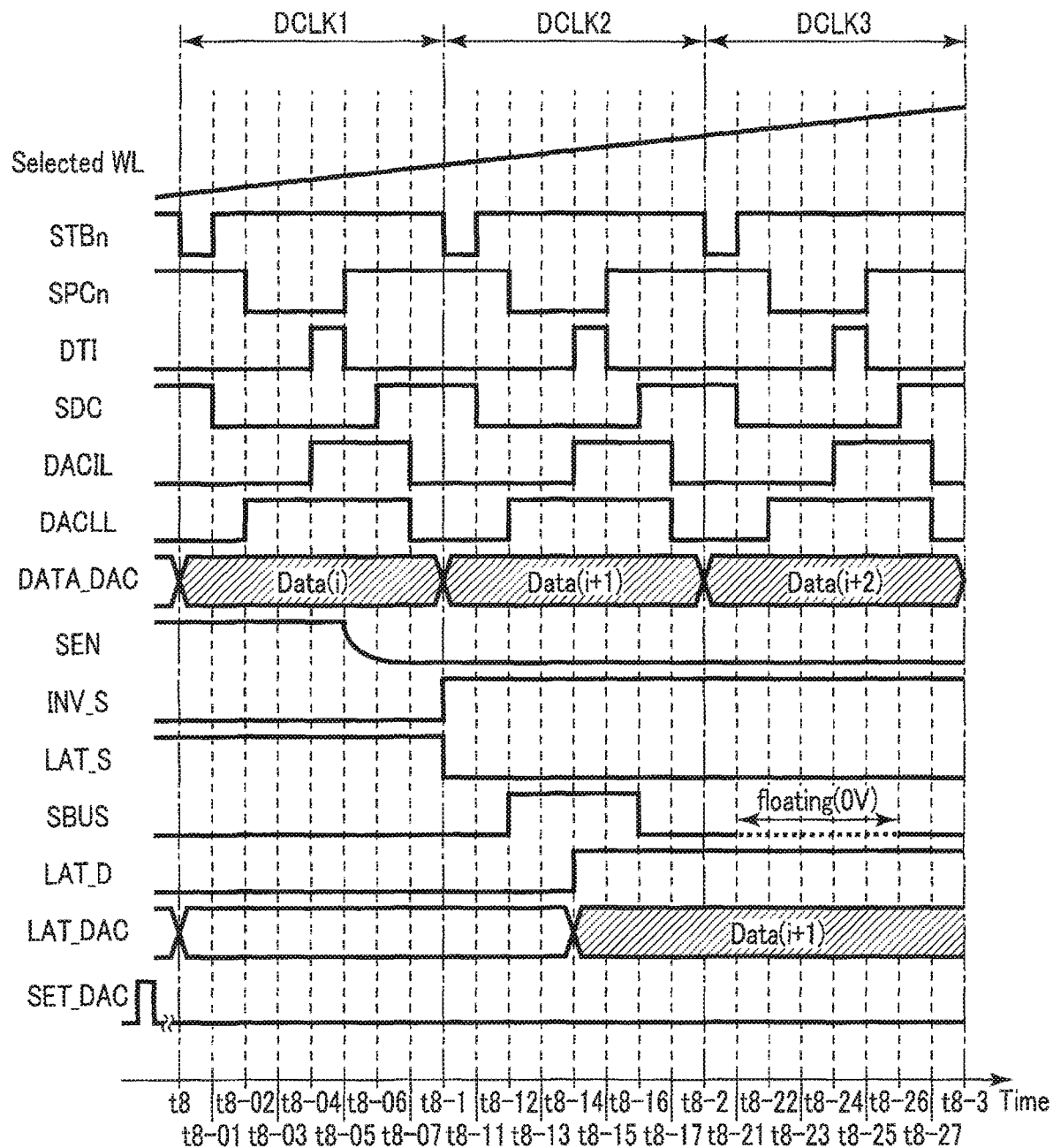
F I G. 30B

| Voltage of WL (number of times of STB) | | 0 | 1 | 2 | 3 | 4 | 5 | 6 | 7 | 8 | ...... | 62 | 63 |
|---|---|---|---|---|---|---|---|---|---|---|---|---|---|
| DATA_DAC | ⟨5⟩ | 0 | 0 | 0 | 0 | 0 | 0 | 0 | 0 | 0 | ...... | 1 | 1 |
| | ⟨4⟩ | 0 | 0 | 0 | 0 | 0 | 0 | 0 | 0 | 0 | ...... | 1 | 1 |
| | ⟨3⟩ | 0 | 0 | 0 | 0 | 0 | 0 | 0 | 0 | 1 | ...... | 1 | 1 |
| | ⟨2⟩ | 0 | 0 | 0 | 0 | 1 | 1 | 1 | 1 | 0 | ...... | 1 | 1 |
| | ⟨1⟩ | 0 | 0 | 1 | 1 | 0 | 0 | 1 | 1 | 0 | ...... | 1 | 1 |
| | ⟨0⟩ | 0 | 1 | 0 | 1 | 0 | 1 | 0 | 1 | 1 | ...... | 0 | 1 |

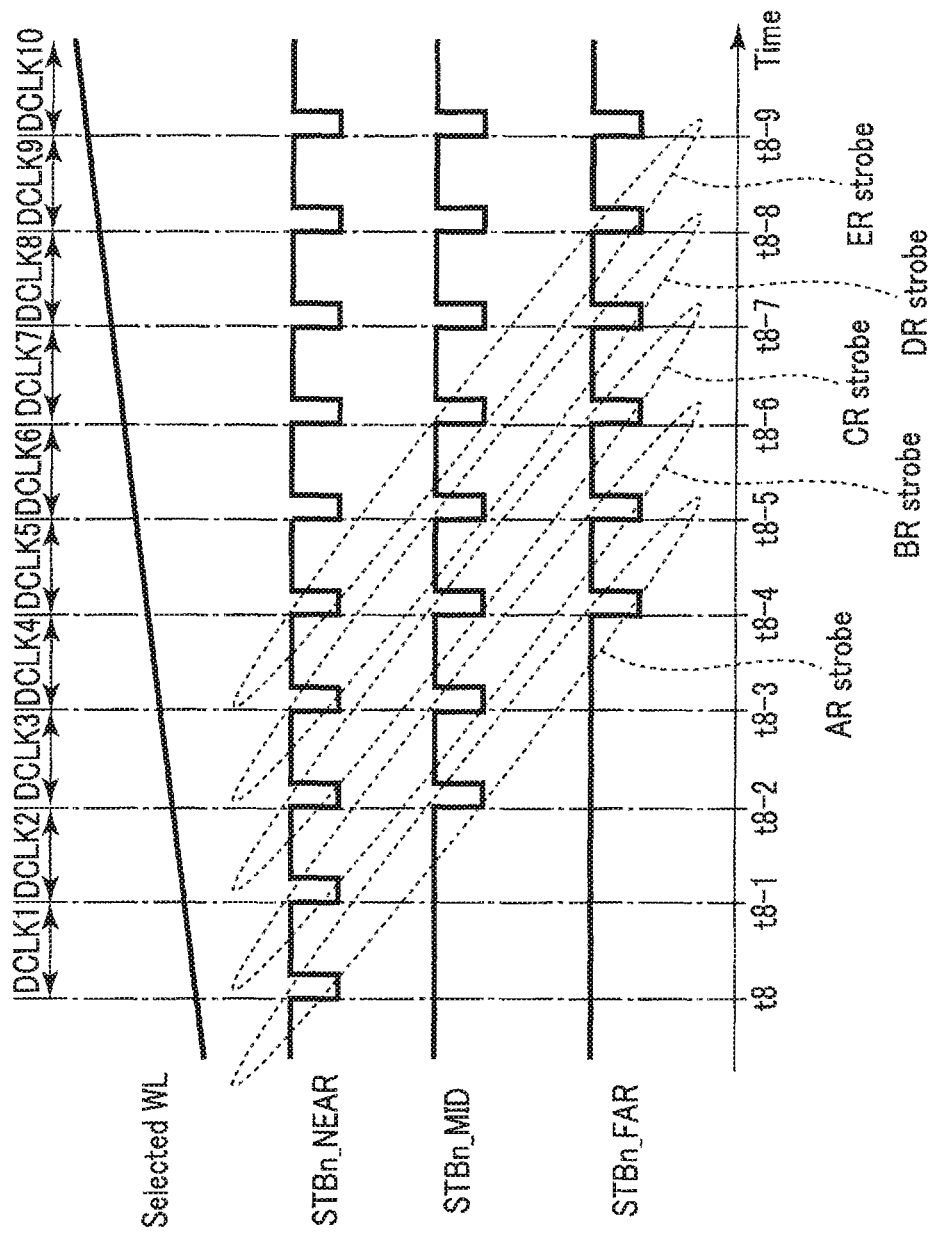
F I G. 30E

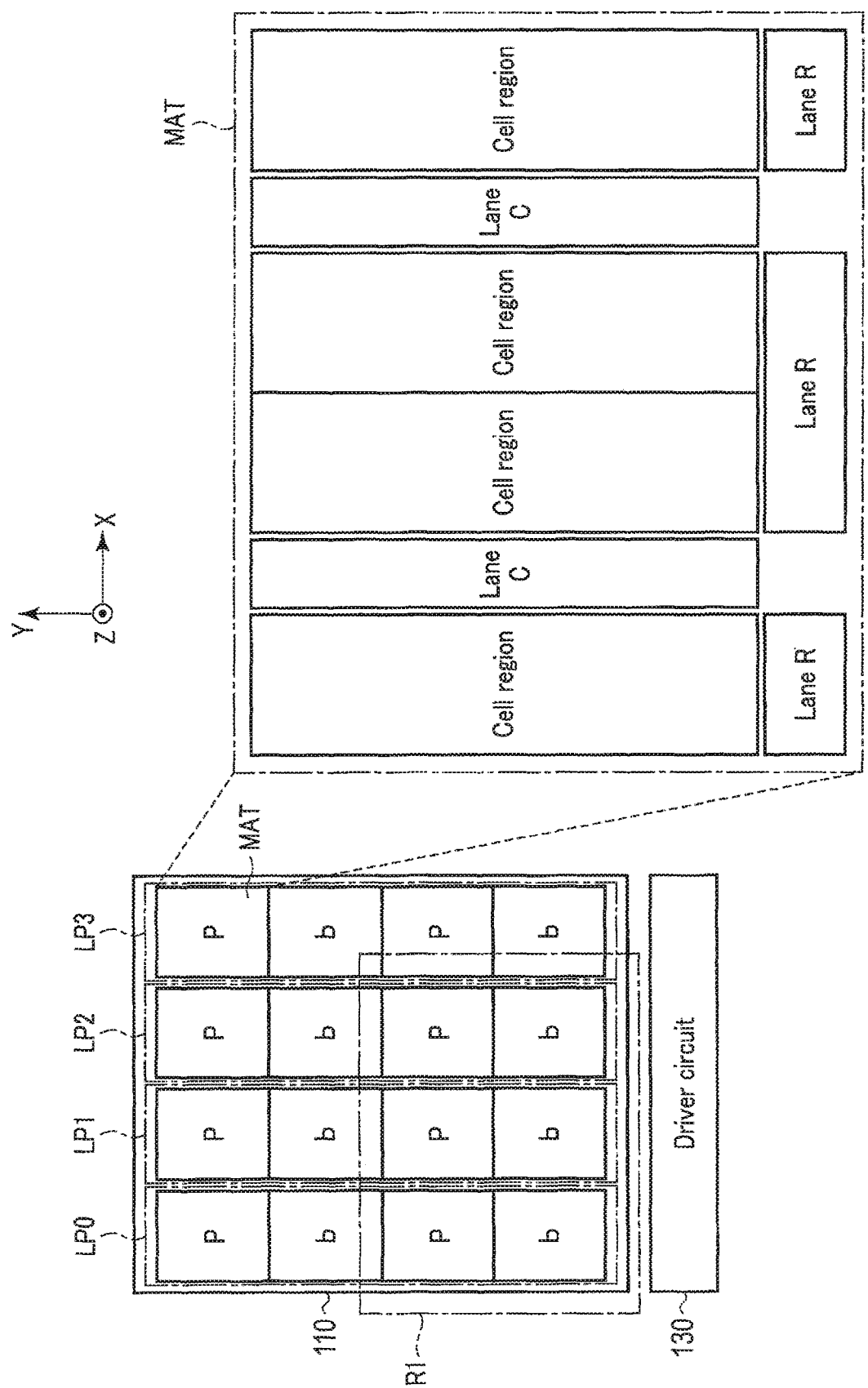
F I G. 31

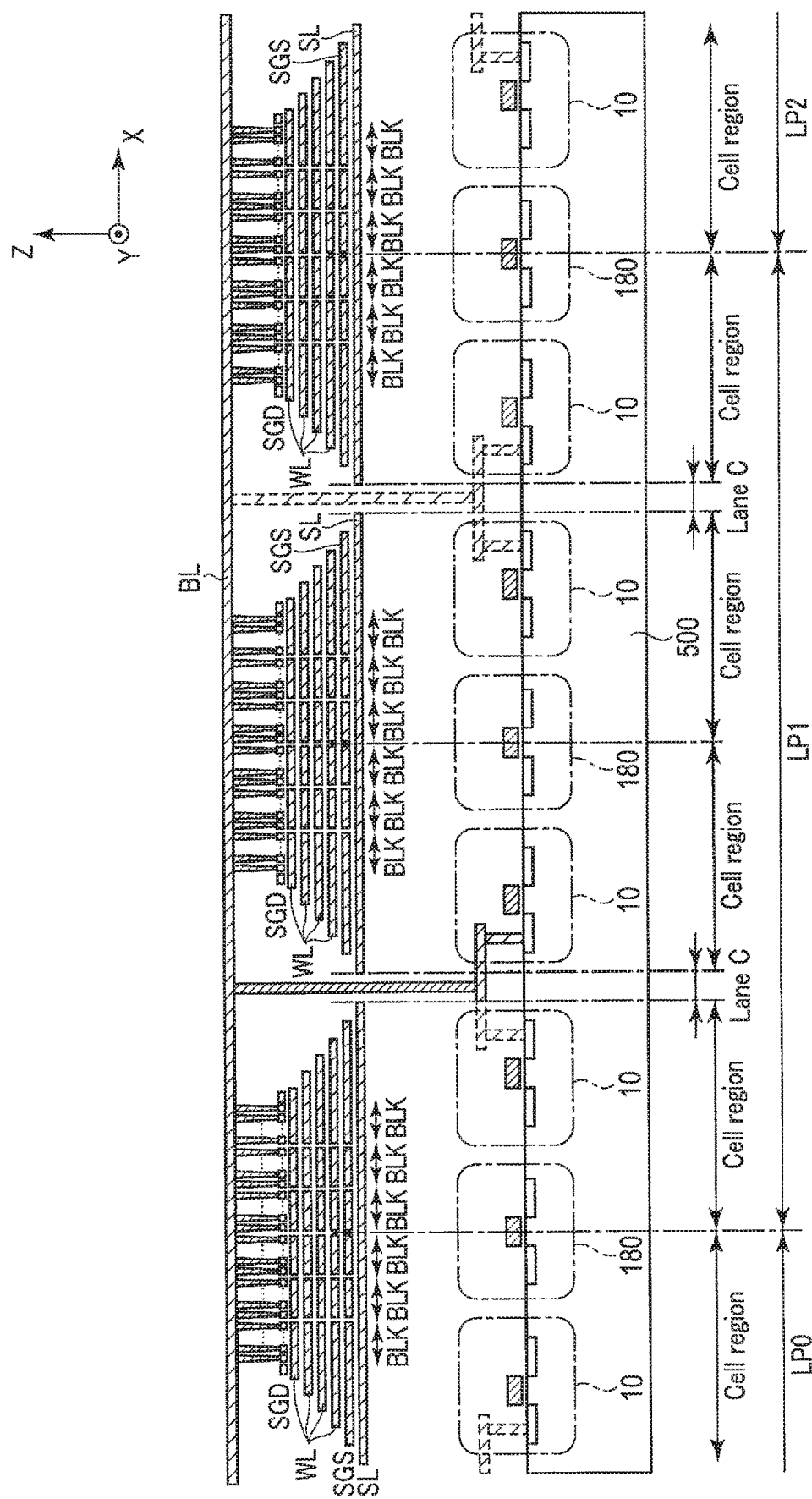
F I G. 33

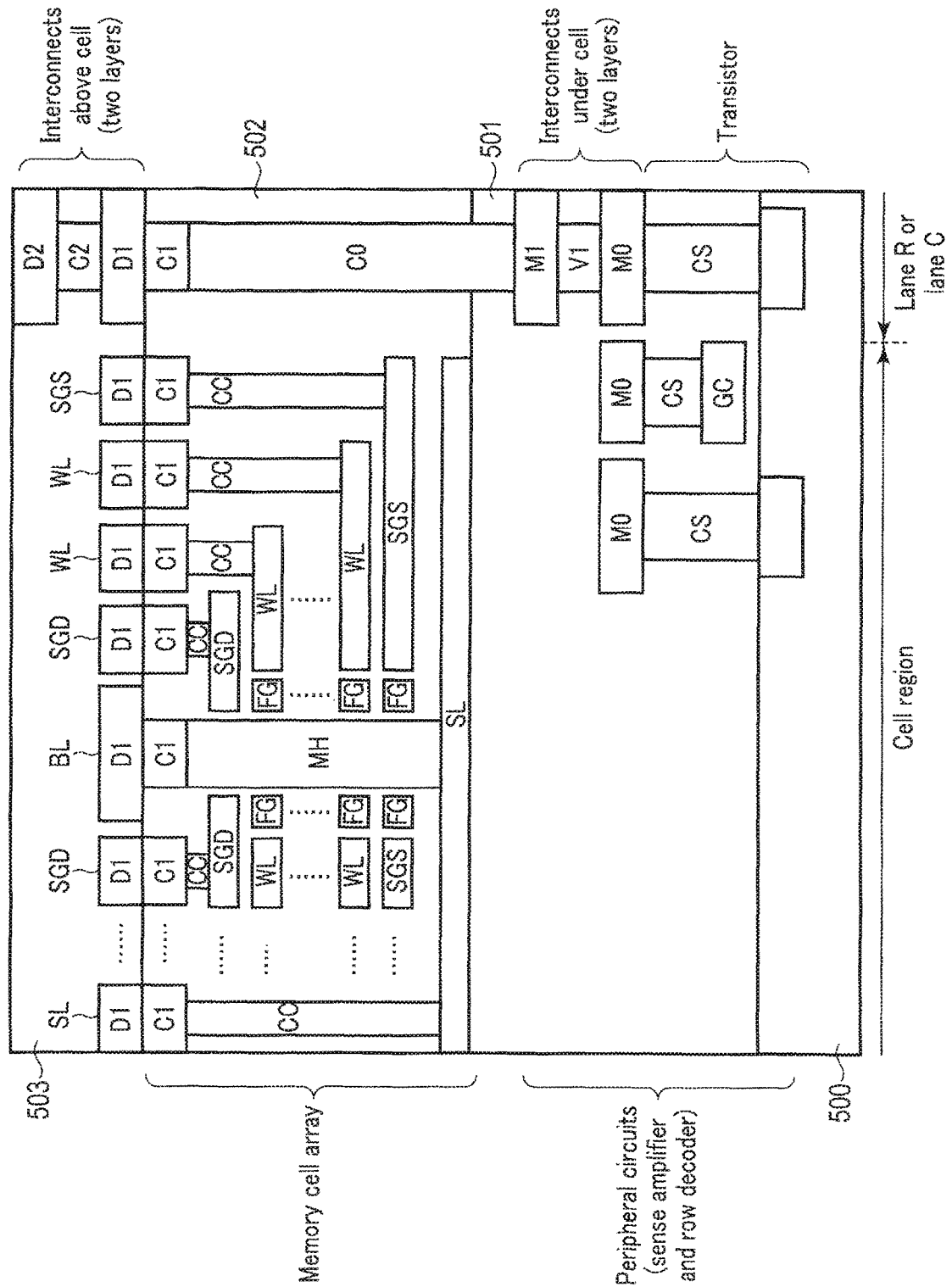
F I G. 38

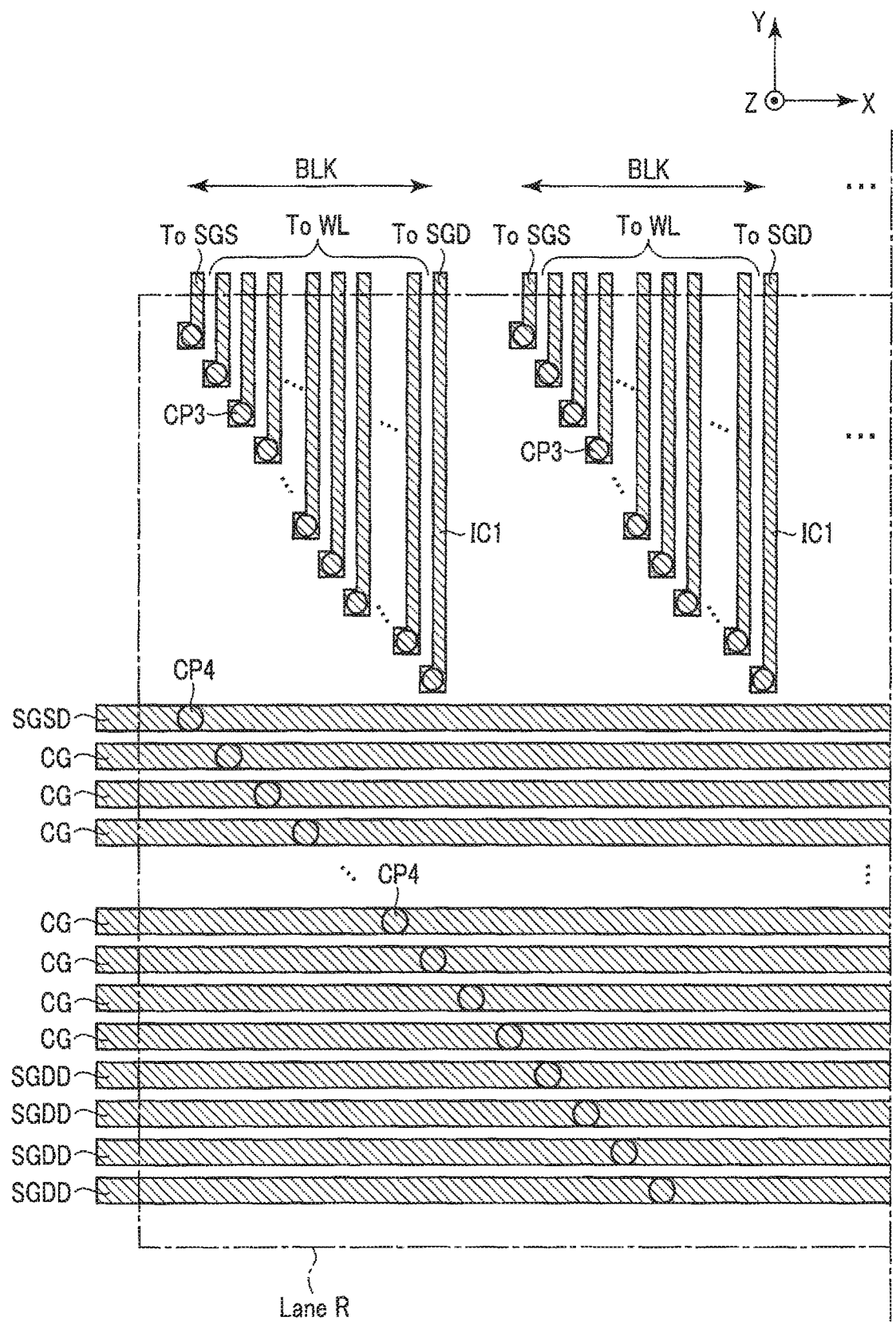
F I G. 45A

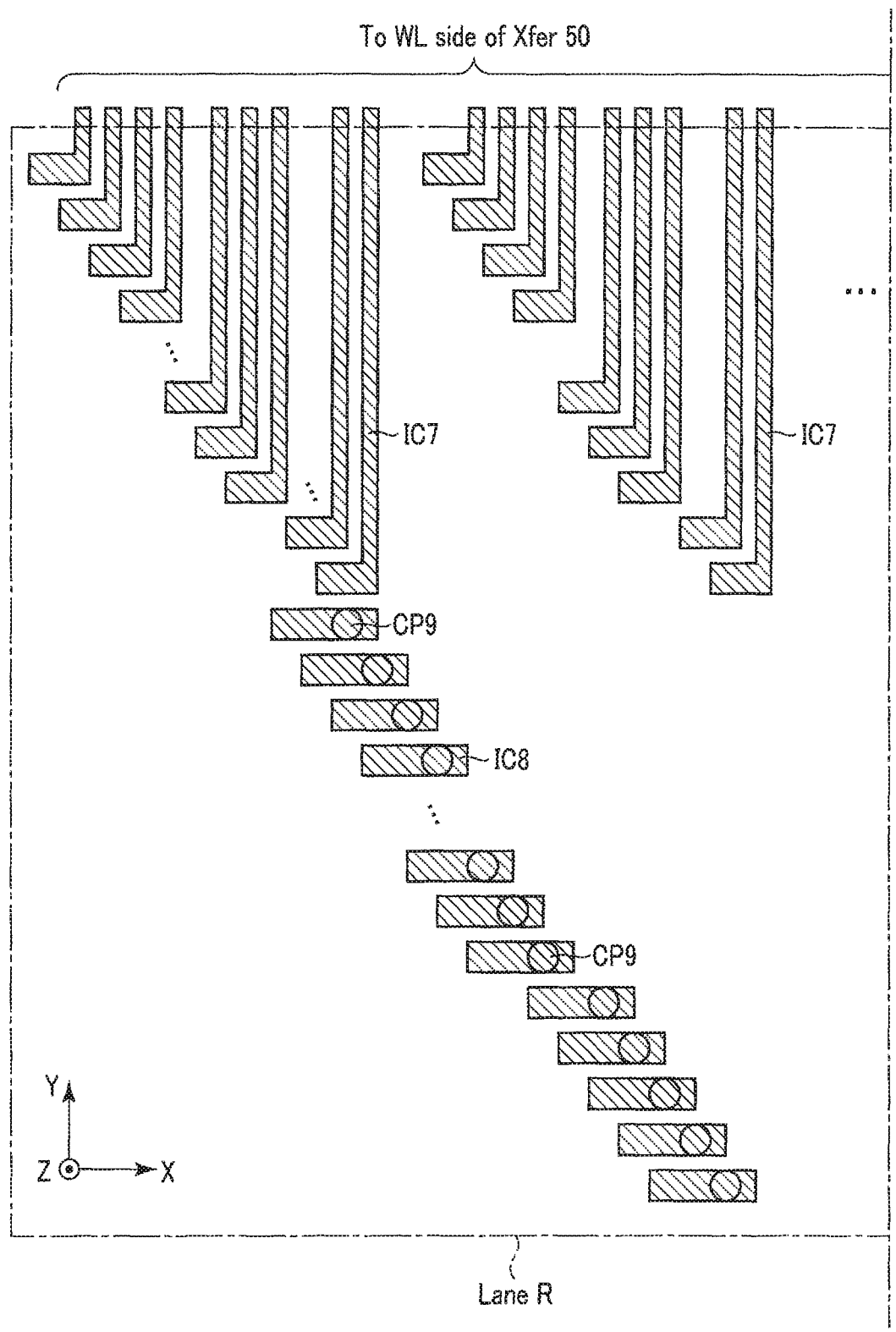
F I G. 47A

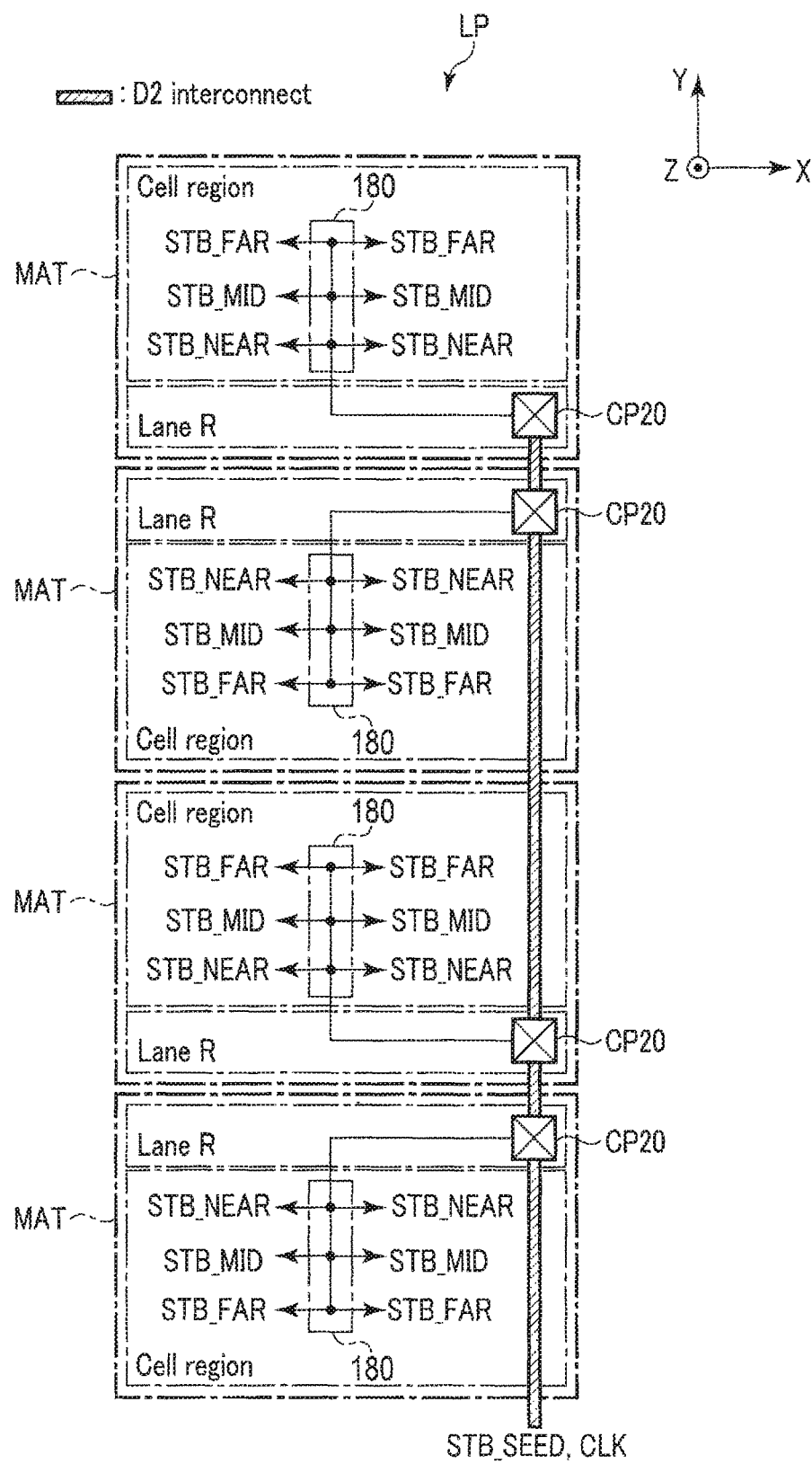
F I G. 50

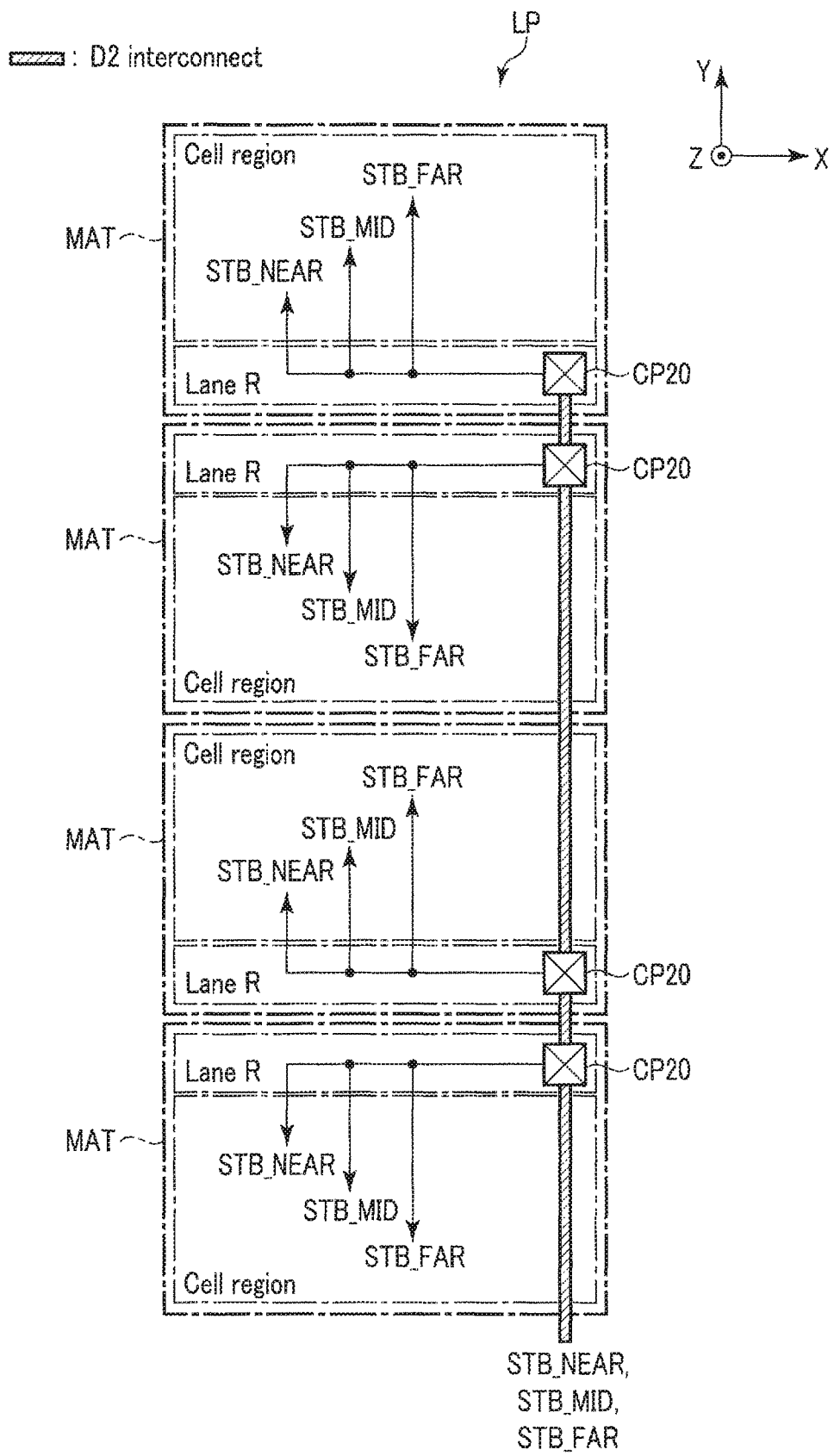
F I G. 52

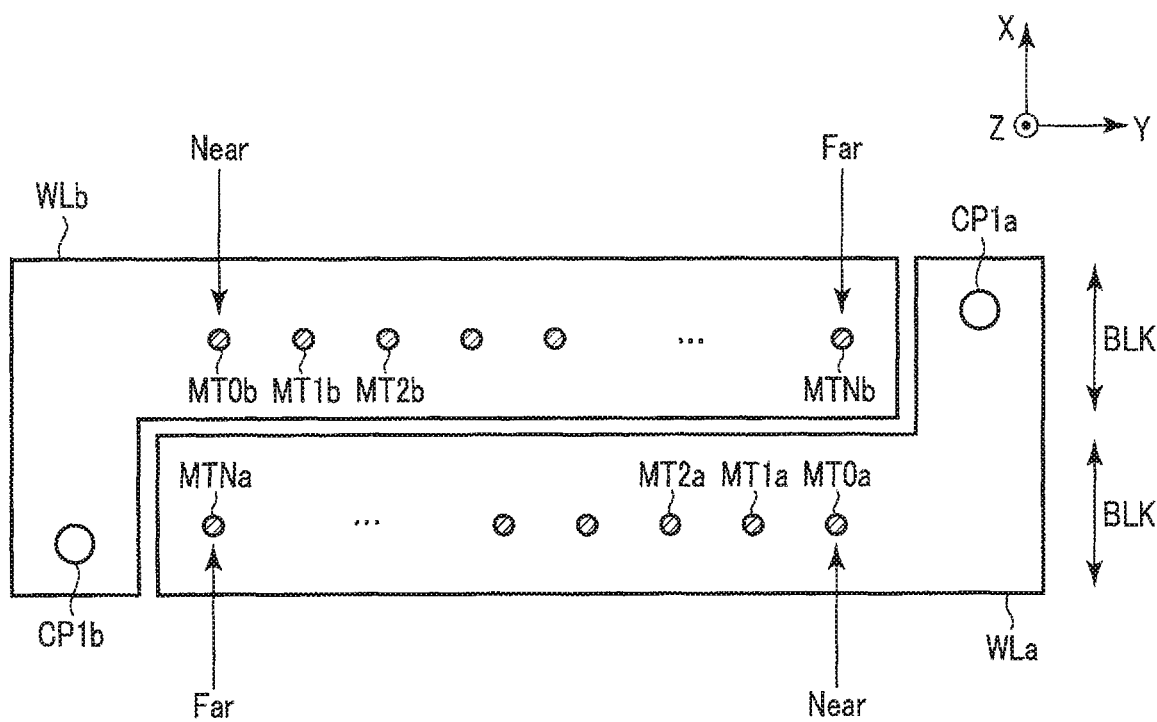
F I G. 55

SEMICONDUCTOR MEMORY DEVICE

CROSS-REFERENCE TO RELATED APPLICATIONS

This application is a Continuation Application of U.S. Ser. No. 15/919,480, filed Mar. 13, 2018, which is a Continuation Application of PCT Application No. PCT/JP2015/081658, filed Nov. 10, 2015, the entire contents of which both of which are incorporated herein by reference.

FIELD

Embodiments described herein relate generally to a semiconductor memory device.

BACKGROUND

There is known a semiconductor memory in which memory cells are three-dimensionally arranged.

BRIEF DESCRIPTION OF THE DRAWINGS

FIG. 1 is a block diagram of a memory system according to the first embodiment;

FIG. 3 is a circuit diagram of row decoders according to the first embodiment;

FIG. 5 is a schematic view of the memory cell array and the sense amplifier according to the first embodiment;

FIG. 9 is a timing chart of a word line voltage variation and the signal STB in a read operation according to the first embodiment;

FIG. 12 is a circuit diagram of an STB generation circuit according to the second embodiment;

FIG. 24 is a schematic view of a memory cell array and a sense amplifier according to the third embodiment;

FIG. 25 is a graph showing changes in the threshold distributions of memory cells according to the fourth embodiment;

FIG. 26 and FIG. 27 are schematic views showing distribution read according to the fourth embodiment;

FIG. 29A and FIG. 29B are circuit diagrams of the sense amplifier according to the fifth embodiment;

FIG. 30A and FIG. 30B are timing charts showing the voltage of each node in the memory cell array and the sense amplifier according to the fifth embodiment;

FIG. 30C is a diagram showing the relationship between a read count and data in latch circuits in a read operation according to the fifth embodiment;

FIG. 30D and FIG. 30E are timing charts of the signal STB in the sense amplifier according to the fifth embodiment;

FIG. 31 is an upper surface layout diagram of a memory cell array and a driver according to the sixth embodiment;

FIG. 33, FIG. 34, and FIG. 35 are sectional views schematically showing the memory cell array according to the sixth embodiment;

FIG. 38 is a sectional view of the memory cell array according to the sixth embodiment;

FIG. 45A and FIG. 45B are layout diagrams of the interconnect D1 in the lane R according to the sixth embodiment;

FIG. 47A and FIG. 47B are layout diagrams of the interconnect M1 under the memory cell array in the lane R according to the sixth embodiment;

FIG. 50 is a schematic view showing the first example of a transfer method of the signal STB in a semiconductor memory device according to the sixth embodiment;

FIG. 52 is a schematic view showing the third example of the transfer method of the signal STB in the semiconductor memory device according to the sixth embodiment;

FIG. 55 is a plan view of a word line in a semiconductor memory device according to the second modification of the sixth embodiment.

DETAILED DESCRIPTION

Figure 2:
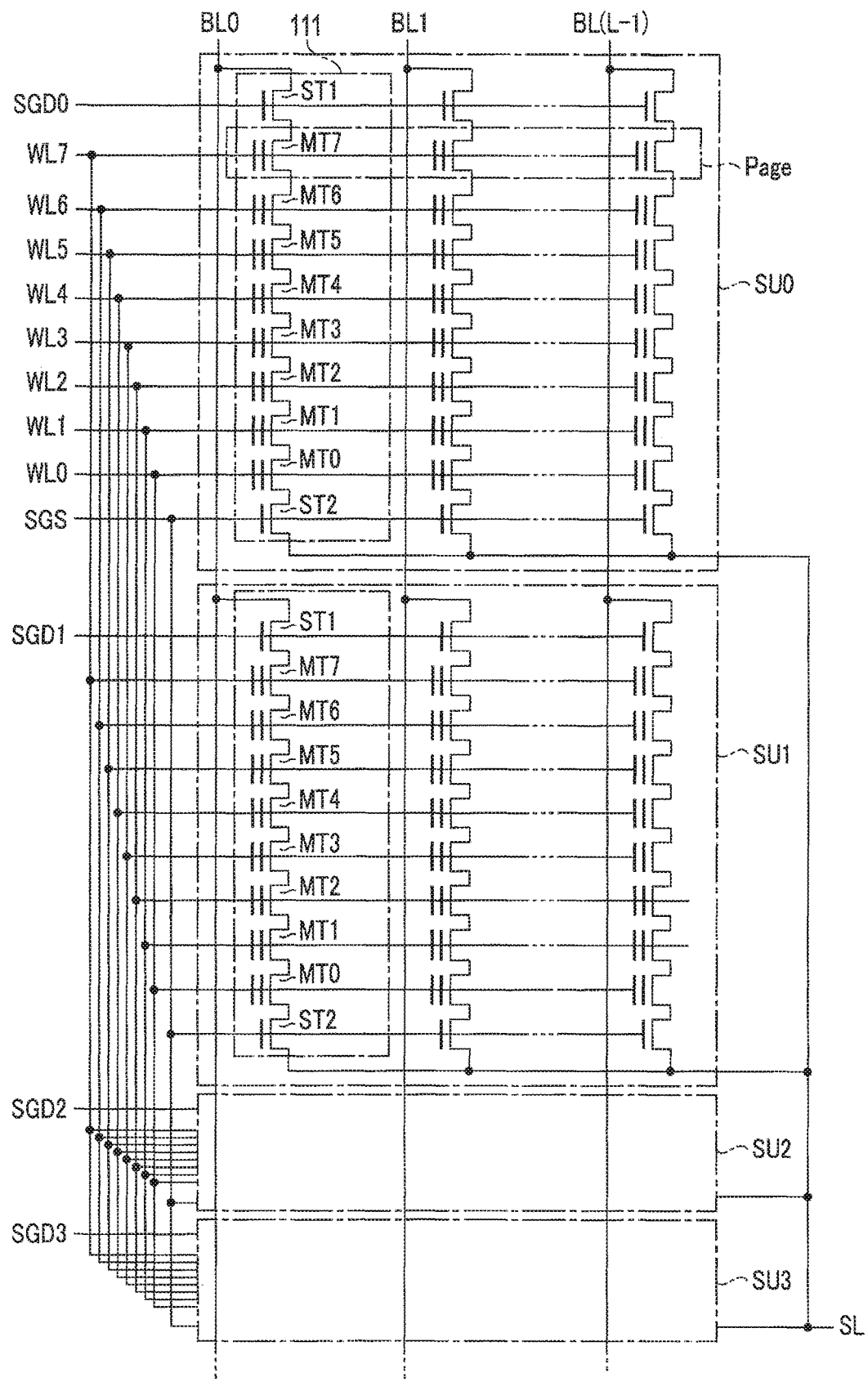
FIG. 2 is a circuit diagram of a memory cell array according to the first embodiment.

In general, according to one embodiment, a semiconductor memory device includes: first to 32nd memory cells; first to 16th bit lines consecutively arranged and connected to the first to 16th memory cells; 17th to 32nd bit lines consecutively arranged and connected to the 17th to 32nd memory cells; a first word line connected to gates of the first to 32nd memory cells; first to 16th sense amplifiers configured to determine data read from the first to 16th memory cells at a first timing; and 17th to 32nd sense amplifiers configured to determine data read from the 17th to 32nd memory cells at a second timing. The first timing is different from the second timing.

The embodiments will now be described with reference to the accompanying drawings. In the description, the same reference numerals denote the same parts throughout the drawings.

1. First Embodiment

A semiconductor memory device according to the first embodiment will be described. A 3D-stacked NAND flash memory in which memory cells are stacked above a semiconductor substrate will be exemplified below as the semiconductor memory device.

1.1 Arrangement 1.1.1 Overall Arrangement of Memory System

A general overall arrangement of a memory system including the semiconductor memory device according to this embodiment will be described first with reference to FIG. 1. FIG. 1 is a block diagram of the memory system according to this embodiment.

As shown in FIG. 1, a memory system 1 includes a NAND flash memory 100 and a controller 200. The NAND flash memory 100 and the controller 200 may form one semiconductor device by, for example, a combination. Examples of such a device are a memory card such as an SD™ card and an SSD (Solid State Drive).

The NAND flash memory 100 includes a plurality of memory cells and stores data in a nonvolatile manner. The controller 200 is connected to the NAND flash memory 100 by a NAND bus and connected to a host apparatus 300 by a host bus. The controller 200 controls the NAND flash memory 100, and accesses the NAND flash memory 100 in response to an instruction received from the host apparatus 300. The host apparatus 300 is, for example, a digital camera, a personal computer, or the like, and the host bus is, for example, a bus complying with an SD™ interface.

The NAND bus transmits/receives signals complying with a NAND interface. Specific examples of the signals are a command latch enable signal CLE, an address latch enable signal ALE, a write enable signal WEn, a read enable signal REn, a ready busy signal RBn, and an input/output signal I/O.

The signals CLE and ALE are signals that notify the NAND flash memory 100 that the input signals I/O to the NAND flash memory 100 are a command and an address, respectively. The signal WEn is a signal asserted at a low level and used to make the NAND flash memory 100 to receive the input signal I/O. Note that "assert" means that a signal (or a logic) is set in a valid (active) state, and "negate" as a term opposed to this means that a signal (or a logic) is set in an invalid (inactive) state. The signal REn is also a signal asserted at a low level and used to read the output signal I/O from the NAND flash memory 100. The ready busy signal RBn is a signal representing whether the NAND flash memory 100 is in a ready state (a state in which an instruction from the controller 200 can be received) or a busy state (a state in which an instruction from the controller 200 cannot be received), and the low level represents the busy state. The input/output signal I/O is, for example, an 8-bit signal. The input/output signal I/O is the entity of data transmitted/received between the NAND flash memory 100 and the controller 200 and includes a command, an address, write data, read data, and the like.

1.1.2 Arrangement of Controller 200

Details of the arrangement of the controller 200 will be described next with reference to FIG. 1. As shown in FIG. 1, the controller 200 includes a host interface circuit 210, an embedded memory (RAM) 220, a processor (CPU) 230, a buffer memory 240, a NAND interface circuit 250, and an ECC circuit 260.

The host interface circuit 210 is connected to the host apparatus 300 via the host bus and transfers instructions and data received from the host apparatus 300 to the processor 230 and the buffer memory 240, respectively. The host interface circuit 210 also transfers data in the buffer memory 240 to the host apparatus 300 in response to an instruction from the processor 230.

The processor 230 controls the operation of the entire controller 200. For example, upon receiving a write instruction from the host apparatus 300, the processor 230 issues a write instruction to the NAND interface circuit 250, in response to the instruction. This also applies to read and erase. The processor 230 also executes various processes for managing the NAND flash memory 100 such as wear leveling.

The NAND interface circuit 250 is connected to the NAND flash memory 100 via the NAND bus and controls communication with the NAND flash memory 100. Based on an instruction received from the processor 230, the NAND interface circuit 250 outputs the signals ALE, CLE, WEn, and REn to the NAND flash memory 100. Furthermore, in writing, the NAND interface circuit 250 transfers a write command issued by the processor 230 and write data in the buffer memory 240 to the NAND flash memory 100 as the input/output signal I/O. Moreover, in reading, the NAND interface circuit 250 transfers a read command issued by the processor 230 to the NAND flash memory 100 and further receives data read from the NAND flash memory 100 as the input/output signal I/O, and transfers it to the buffer memory 240.

The buffer memory 240 temporarily holds write data or read data.

The embedded memory 220 is, for example, a semiconductor memory such as a DRAM, and is used as a work area of the processor 230. The embedded memory 220 holds firmware, various kinds of management tables, and the like that are used to manage the NAND flash memory 100.

The ECC circuit 260 executes error correction (ECC: Error Checking and Correcting) processing of data. That is, in data writing, the ECC circuit 260 generates a parity based on write data. In data reading, the ECC circuit 260 generates a syndrome from a parity, detects an error, and corrects the error. Note that the CPU 230 may have the function of the ECC circuit 260.

1.1.3 Arrangement of NAND Flash Memory 100

1.1.3.1 Overall Arrangement of NAND Flash Memory 100

The arrangement of the NAND flash memory 100 will be described next. As shown in FIG. 1, the NAND flash memory 100 includes a memory cell array 110, row decoders 120 (120-0 to 120-3), a driver circuit 130, a sense amplifier 140, an address register 150, a command register 160, and a sequencer 170.

The memory cell array 110 includes, for example, four blocks BLK (BLK0 to BLK3) each including a plurality of nonvolatile memory cells associated with rows and columns. The memory cell array 110 stores data send from the controller 200.

The row decoders 120-0 to 120-3 are provided in correspondence with the blocks BLK0 to BLK3, respectively, and select the corresponding blocks.

The driver circuit 130 outputs a voltage to a selected one of the blocks BLK0 to BLK3 via a corresponding one of the row decoders 120-0 to 120-3.

In data reading, the sense amplifier 140 senses data read from the memory cell array 110 and outputs data DAT to the controller 200. In data writing, the sense amplifier 140 transfers the write data DAT received from the controller 200 to the memory cell array 110.

The address register 150 holds an address ADD received from the controller 200. The command register 160 holds a command CMD received from the controller 200.

The sequencer 170 controls the operation of the entire NAND flash memory 100 based on the command CMD held by the command register 160.

1.1.3.2 Memory Cell Array 110

Details of the arrangement of the memory cell array 110 will be described next. FIG. 2 is a circuit diagram of one of the blocks BLK, and the remaining blocks BLK also have the same arrangement.

As shown in FIG. 2, the block BLK includes, for example, four string units SU (SU0 to SU3). Each string unit SU includes a plurality of NAND strings 111.

Each of the NAND strings 111 includes, for example, eight memory cell transistors MT (MT0 to MT7), and selection transistors ST (ST1 and ST2).

The memory cell transistor MT includes a stacked gate including a control gate and a charge accumulation layer, and holds data in a nonvolatile manner. The number of memory cell transistors MT is not limited to 8 and may be 16, 32, 64, 128, or the like, and the number is not limited. The memory cell transistors MT are arranged such that the current paths are connected in series between the selection transistors ST1 and ST2. The current path of the memory cell transistor MT7 on one end side of the series connection is connected to one end of the current path of the selection transistor ST1, and the current path of the memory cell transistor MT0 on the other end side is connected to one end of the current path of the selection transistor ST2.

The gates of the selection transistors ST1 in the string units SU0 to SU3 are commonly connected to selection gate lines SGD0 to SGD3, respectively. On the other hand, the gates of the selection transistors ST2 are commonly connected to the same selection gate line SGS between the plurality of string units. In addition, the control gates of the memory cell transistors MT0 to MT7 in the same block are commonly connected to word lines WL0 to WL7, respectively.

That is, the word lines WL0 to WL7 and the selection gate line SGS are commonly connected between the plurality of string units SU0 to SU3 in the same block BLK, whereas the selection gate line SGD is independently provided for each of the string units SU0 to SU3 even in the same block BLK.

In addition, of the NAND strings 111 arranged in a matrix in the memory cell array 110, the other end sides of the current paths of the selection transistors ST1 of the NAND strings 111 on the same column are commonly connected to bit lines BL (BL0 to BL(L−1), (L−1) is a natural number not less than 1). That is, the bit lines BL commonly connect the NAND strings 111 between the plurality of string units SU, and also commonly connect the NAND strings 111 between the plurality of blocks BLK. Furthermore, the other end sides of the current paths of the selection transistors ST2 are commonly connected to a source line SL. The source line SL commonly connects the NAND strings 111 between, for example, the plurality of blocks.

Data of the memory cell transistors MT in the same block may be erased at once. On the other hand, reading and writing of data is performed at once for the plurality of memory cell transistors MT commonly connected to one word line WL in one of the string units SU in one of the blocks.

1.1.3.3 Row Decoders 120

The arrangement of the row decoders 120 will be described next with reference to FIG. 3. FIG. 3 is a block diagram of the row decoders 120.

As shown in FIG. 3, each row decoder 120 includes a block decoder 40, and high-withstand-voltage n-channel MOS transistors 50 (50-0 to 50-12).

The block decoder 40 will be described first. In data writing, reading, and erasing, the block decoder 40 decodes a block address BA received from the address register 150. If the block address BA matches the corresponding block BLK, a signal TG is asserted. The potential of the asserted signal TG is set to a voltage that sets the transistors 50 in an ON state. On the other hand, if the block address BA does not match the block BLK, the signal TG is negated, and the potential of the signal TG is set to a voltage (for example, 0 V) that sets the transistors 50 in an OFF state.

The transistors 50 will be described next. The transistors 50-0 to 50-7 are configured to transfer voltages to the word lines WL0 to WL7 of the selected block BLK. One end sides of the current paths of the transistors 50-0 to 50-7 are connected to the word lines WL0 to WL7 of the corresponding block BLK, respectively, the other end sides are connected to signal lines CG0 to CG7, respectively, and the gates are commonly connected to the signal line TG.

The transistors 50-8 to 50-11 are configured to transfer voltages to the selection gate lines SGD0 to SGD3 of the selected block BLK. One end sides of the current paths of the transistors 50-8 to 50-11 are connected to the selection gate lines SGD0 to SGD3 of the corresponding block BLK, respectively, the other end sides are connected to signal lines SGDD0 to SGDD3, respectively, and the gates are commonly connected to the signal line TG.

The transistor 50-12 is configured to transfer a voltage to the selection gate line SGS of the selected block BLK. One end of the current path of the transistor 50-12 is connected to the selection gate line SGS of the corresponding block BLK, the other end is connected to a signal line SGSD, and the gate is commonly connected to the signal line TG.

Hence, for example, in the row decoder 120 corresponding to the selected block BLK, the transistors 50-0 to 50-12 are turned on. Accordingly, the word lines WL0 to WL7 are connected to the signal lines CG0 to CG7, the selection gate lines SGD0 to SGD3 are connected to the signal lines SGDD0 to SGDD3, and the selection gate line SGS is connected to the signal line SGSD.

On the other hand, in the row decoder 120 corresponding to the non-selected block BLK, the transistors 50-0 to 50-12 are set in the OFF state. Accordingly, the word lines WL and the selection gate lines SGD and SGS are disconnected from the signal lines CG, SGDD, and SGSD.

The signal lines CG, SGDD, and SGSD are commonly used by the row decoders 120-1 to 120-3. Then, the driver circuit 130 applies voltages to the signal lines CG, SGDD, and SGSD in accordance with a page address PA received from the address register 150. That is, voltages output from the driver circuit 130 are transferred to the interconnects WL, SGD, and SGS in the selected block via the transistors 50 in one of the row decoders 120 corresponding to the selected block.

1.1.3.4 Sense Amplifier 140

The arrangement of the sense amplifier 140 will be described next. As the sense amplifier 140 to be explained in this example, a case in which data is determined by sensing a current flowing to a bit line will be exemplified. However, an arrangement for sensing a voltage is also possible.

Figure 4:
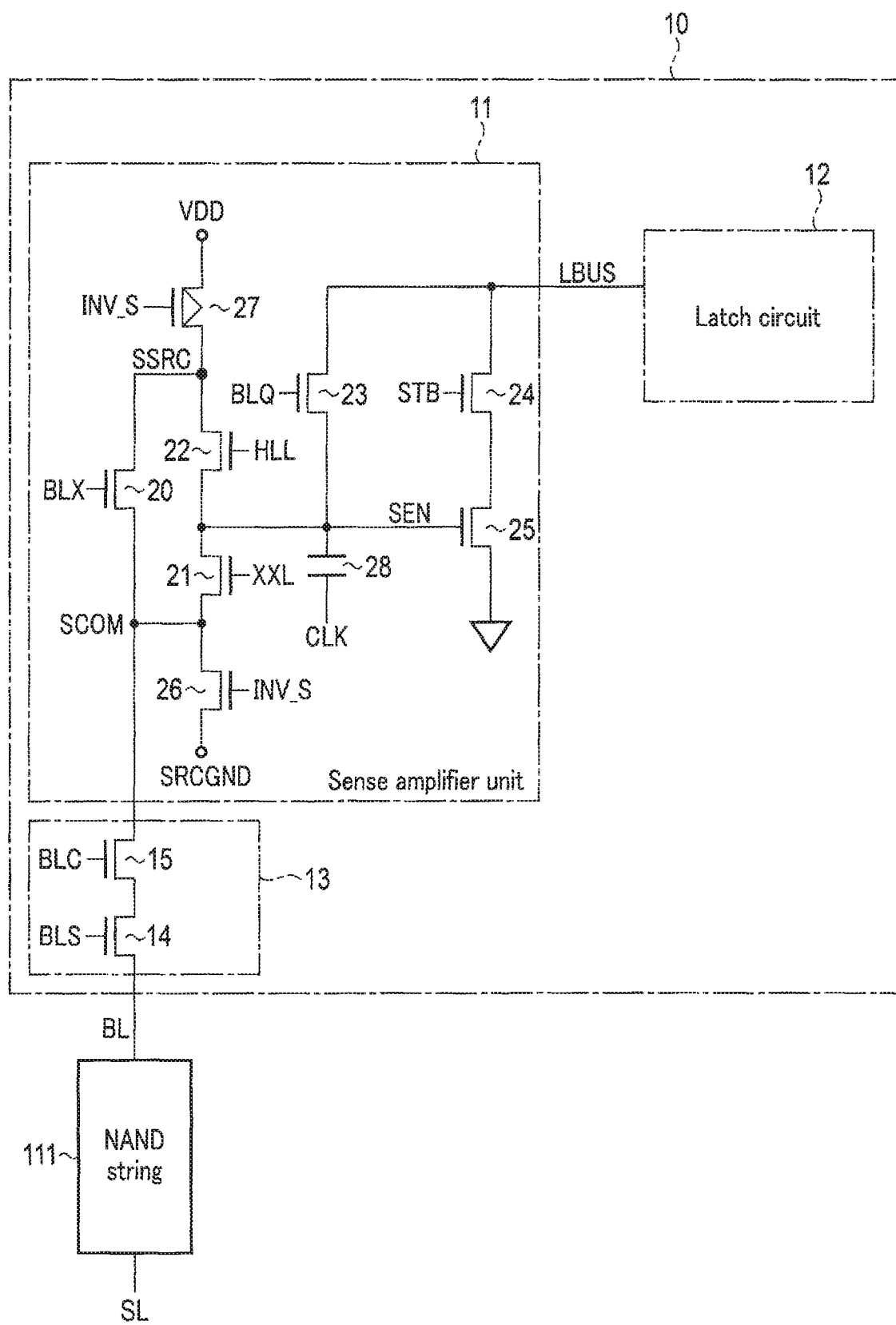
FIG. 4 is a circuit diagram of a sense amplifier according to the first embodiment.

The sense amplifier 140 includes a sense circuit 10 provided for each bit line BL. FIG. 4 is a circuit diagram of the sense circuit 10.

As shown FIG. 4, the sense circuit 10 includes a sense amplifier unit 11, a latch circuit 12, and a connecting portion 13. Note that when each memory cell transistor holds data of two or more bits, two or more latch circuits are provided.

The connecting portion 13 connects the corresponding bit line BL and the sense amplifier unit 11 and controls the potential of the bit line BL. That is, the connecting portion 13 includes n-channel MOS transistors 14 and 15. In the transistor 14, a signal BLS is applied to the gate, and the source is connected to the corresponding bit line BL. In the transistor 15, the source is connected to the drain of the transistor 14, a signal BLC is applied to the gate, and the drain is connected to a node SCOM. The transistor 15 is configured to clamp the corresponding bit line BL to a potential according to the signal BLC.

The sense amplifier unit 11 senses data read to the bit line BL. The sense amplifier unit 11 includes n-channel MOS transistors 20 to 26, a p-channel MOS transistor 27, and a capacitive element 28.

The transistor 27 is configured to charge the bit line BL and the capacitive element 28, and a node INV_S is connected to the gate, the drain is connected to a node SSRC, and a power supply voltage VDD is applied to the source. The transistor 20 is configured to precharge the bit line BL, and a signal BLX is applied to the gate, the drain is connected to the node SSRC, and the source is connected to the node SCOM. The transistor 22 is configured to charge the capacitive element 28, and a signal HLL is applied to the gate, the drain is connected to the node SSRC, and the source is connected to a node SEN. The transistor 21 is configured to discharge the node SEN in data sensing, and a signal XXL is applied to the gate, the drain is connected to the node SEN, and the source is connected to the node SCOM. The transistor 26 is configured to fix the bit line BL to a predetermined potential, and the gate is connected to the node INV_S, the drain is connected to the node SCOM, and the source is connected to a node SRCGND.

The capacitive element 28 is charged in precharging the bit line BL. One electrode is connected to the node SEN, and a signal CLK is applied to the other electrode.

In the transistor 23, a signal BLQ is applied to the gate, the source is connected to the node SEN, and the drain is connected to a node LBUS. The node LBUS is a signal path used to connect the sense amplifier unit 11 and the latch circuit 12. The transistor 24 is configured to decide a data sense timing and also store read data in the latch circuit 12, and a signal STB is applied to the gate, and the drain is connected to the node LBUS.

The transistor 25 is configured to sense whether read data is "0" or "1", and the gate is connected to the node SEN, the drain is connected to the source of the transistor 24, and the source is grounded.

The node INV_S is a node in the latch circuit 12 and may have a level according to data held by the latch circuit 12. For example, in data reading, if a selected memory cell turns on and the potential of the node SEN sufficiently lowers, the node INV_S is set at "H" level. On the other hand, if the selected memory cell is in the OFF state and the node SEN holds a predetermined potential, the node INV_S is set at "L" level.

In the above-described arrangement, at the timing when the signal STB is asserted, the transistor 25 senses read data based on the potential of the node SEN, and the transistor 24 transfers the read data to the latch circuit 12. The various kinds of control signals including the signal STB are issued from, for example, the sequencer 170.

Note that various arrangements are applicable as the sense circuit 10. For example, an arrangement described in U.S. patent application Ser. No. 13/052,148 filed on Mar. 21, 2011 and entitled "THRESHOLD DETECTING METHOD AND VERIFY METHOD OF MEMORY CELL" is applicable. This patent application is entirely incorporated herein by reference.

1.2 Operation

A data reading method in the semiconductor memory device according to this embodiment will be described next. This method is also applied in program-verifying.

1.2.1 Arrangement

First, an arrangement shown in FIG. 5 will be exemplified for the descriptive convenience in the description of the reading method. FIG. 5 is a block diagram of the memory cell array 110, the row decoder 120, and the sense amplifier unit 11 of the sense amplifier 140.

As shown in FIG. 5, the memory cell array 110 according to this example includes 48 bit lines BL0 to BL47. In addition, the sense amplifier units 11 of the sense circuits 10 corresponding to the bit lines BL0 to BL47 will be referred to as sense amplifier units SA0 to SA47, respectively.

For example, eight bit lines BL are put into a group as a unit called "column", and a column address CA is given to each column. In the example shown in FIG. 5, the bit lines BL0 to BL47 are sequentially arranged. The bit lines BL0 to BL7 belong to a column C0, and a column address CA0 is assigned to the column C0. In addition, the bit lines BL8 to BL15 belong to a column C1, and a column address CA1 is assigned to the column C1. The bit lines BL16 to BL23 belong to a column C2, and a column address CA2 is assigned to the column C2. The same applies hereinafter, and finally, the bit lines BL40 to BL47 belong to a column C5, and a column address CA5 is assigned to the column C5.

The distance of the current path between the memory cell transistor MT connected to each bit line BL and the row decoder 120 (and the driver circuit 130) becomes long in the order of bit lines corresponding to the columns C0 to C5. That is, the voltage applied to the word line WL by the row decoder 120 first reaches the gates of the memory cell transistors MT corresponding to the column C0, then reaches the gates of the memory cell transistors MT corresponding to the column C1, and finally reaches the gates of the memory cell transistors MT corresponding to the column C5. In some cases, the word lines WL and the memory cell transistors MT corresponding to the columns C0 and C1 will be referred to as a group GP1, the word lines WL and the memory cell transistors MT corresponding to the columns C2 and C3 will be referred to as a group GP2, and the word lines WL and the memory cell transistors MT corresponding to the columns C4 and C5 will be referred to as a group GP3 hereinafter.

The signal STB is input to each sense amplifier unit SA, as described with reference to FIG. 4. In each sense amplifier unit, data is sensed at the timing when the signal STB is asserted. In this example, different signals STB are applied to the groups GP. More specifically, a signal STB_NEAR is applied to the sense amplifier units SA0 to SA15 corresponding to the group GP1, a signal STB_MID is applied to the sense amplifier units SA16 to SA31 corresponding to the group GP2, and a signal STB_FAR is applied to the sense amplifier units SA32 to SA47 corresponding to the group GP3.

The signals STB_NEAR, STB_MID, and STB_FAR are signals different from each other. At the data strobe, the signal STB_NEAR is asserted first, the signal STB_MID is asserted next, and finally, the signal STB_FAR is asserted.

Figure 6:
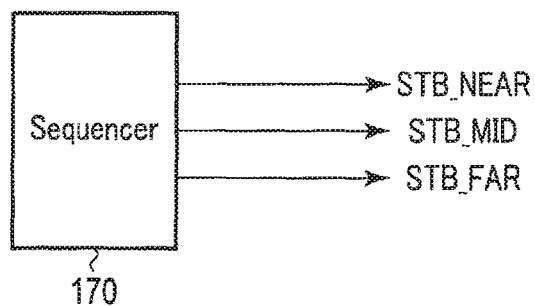
FIG. 6 is a conceptual view of a signal STB according to the first embodiment.
Figure 7:
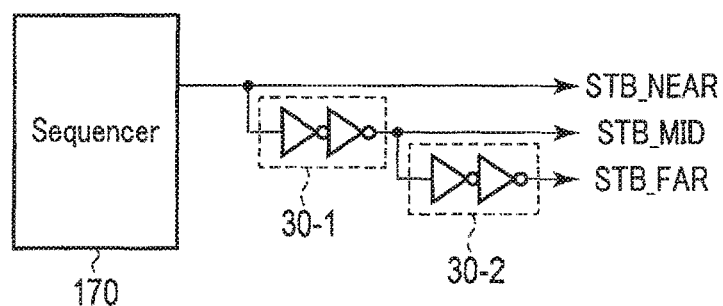
FIG. 7 is a circuit diagram of an STB generation circuit according to the first embodiment.

FIGS. 6 and 7 are conceptual views of a method of generating the signals STB_NEAR, STB_MID, and STB_FAR. As shown in FIG. 6, the sequencer 170 may generate all the signals STB_NEAR, STB_MID, and STB_FAR. Alternatively, as shown in FIG. 7, the sequencer 170 may generate only the signal STB_NEAR. In this case, the signal STB_NEAR is delayed by a delay circuit 30-1, thereby generating the signal STB_MID. In addition, the signal STB_MID is delayed by a delay circuit 30-2, thereby generating the signal STB_FAR.

Figure 8:
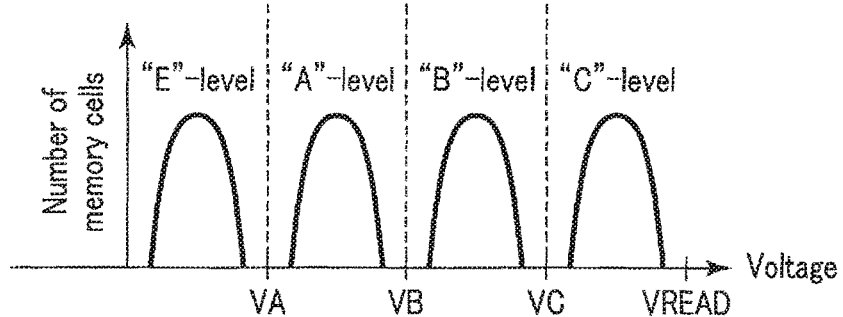
FIG. 8 is a diagram showing possible threshold distributions of a memory cell according to the first embodiment.

FIG. 8 shows data and possible threshold distributions of the memory cell transistor MT according to this example. The number of memory cell transistors plotted along the ordinate of the threshold distribution is represented by a log scale.

As shown in FIG. 8, each memory cell transistor MT may hold, for example, 2-bit data in accordance with the threshold. The 2-bit data are, for example, "11", "01", "00", and "10" in the ascending order of threshold.

The threshold of a memory cell that holds "11" data falls within a predetermined distribution, and the threshold distribution corresponding to the "11" data is called "E"-level. The E-level is a threshold distribution in a state in which charges in the charge accumulation layer are removed, and data is erased, and is a positive or negative value (for example, less than a voltage VA).

"01", "00", and "10" are threshold distributions in a state in which charges are injected into the charge accumulation layer, and data is written. The threshold of a memory cell that holds "01" data falls within the distribution of "A"-level, and higher than the threshold in the E-level (for example, not less than the voltage VA and less than a voltage VB, VA<VB). The threshold of a memory cell that holds "00" data falls within the distribution of "B"-level, and higher than the threshold in the A-level (for example, not less than the voltage VB and less than a voltage VC, VB<VC). The threshold of a memory cell that holds "10" data falls within the distribution of "C"-level, and higher than the threshold in the B-level (for example, not less than the voltage VC).

The relationship between the 2-bit data and the thresholds is not limited to this relationship, as a matter of course. For example, "11" data may correspond to the "C"-level, and the relationship between them may appropriately be selected.

1.2.2 Read Operation

A read operation of data in the arrangement explained in 1.2.1 will be described next with reference to FIG. 9. FIG. 9 is a timing chart of a time-rate change in the voltage of the word line WL and the signal STB.

In reading, a voltage VREAD that turns on the memory cell transistor MT irrespective of held data is applied to each unselected word line WL by the driver circuit 130 and the row decoder 120. In addition, a voltage VSG that turns on the selection transistors ST1 and ST2 is applied to the selection gate lines SGD and SGS. The voltage of the selected word line is continuously raised, as shown in FIG. 9.

In each of the groups GP1 to GP3, data is read when the voltage of the selected word line WL reaches VA. That is, as shown in FIG. 8, it is determined whether the threshold of the memory cell transistor MT is included in the "E"-level or the distribution of "A"-level or higher level (this is called a read operation AR). Then, the determination result is transferred to the latch circuit 12. Determining held data in accordance with the potential of the node SEN at the time when the voltage of the selected word line WL reaches a certain potential and transferring the result to the latch circuit 12 will be referred to as "strobe" hereinafter, and the operation associated with the read operation AR will be referred to as "AR strobe".

Subsequently, when the voltage of the selected word line WL reaches VB, it is determined whether the threshold of the memory cell transistor MT is included in the distribution of "A"-level or lower level or included in the distribution of "B"-level or higher level (this is called a read operation BR). Then, the determination result is transferred to the latch circuit 12 (BR strobe).

Furthermore, when the voltage of the selected word line WL reaches VC, it is determined whether the threshold of the memory cell transistor MT is included in the C-level or included in the distribution of "B"-level or lower level (this is called a read operation CR). Then, the determination result is transferred to the latch circuit 12 (CR strobe).

Note that the voltage of the selected word line when performing strobe normally changes between read and verify. However, a description will be made below assuming that the voltage does not change for the descriptive convenience.

When the selected word line WL is driven from the driver circuit 130 via the row decoder 120, as described above, the manner the potential varies changes depending on the position of the memory cell transistor MT.

That is, as shown in FIG. 9, on the selected word line WL, the potential of a region closest to the row decoder 120 (or the driver circuit 130), that is, a region WL_NEAR corresponding to the group GP1 rises almost without a delay. That is, (dV/dT) is almost constant during the read operation period (where V is the word line voltage, and T is time). On the other hand, the potential of a region WL_MID corresponding to the group GP2 delays at the time of voltage rising relative to the potential of the region WL_NEAR, and the potential of a region WL_FAR farthest from the row decoder 120 further delays.

That is, in the read operation AR, the gate voltage of the memory cell transistor MT corresponding to the group GP1 reaches the voltage VA almost at time t1. However, the gate voltage of the memory cell transistor MT corresponding to the group GP2 reaches the voltage VA almost at time t2 later than time t1. The gate voltage of the memory cell transistor MT corresponding to the group GP3 reaches the voltage VA almost at time t3 that is further later.

As shown in FIG. 9, the signal STB_NEAR is asserted at time t1 ("H" level). Hence, data read from the memory cell transistor MT corresponding to the group GP1 is strobed at time t1. In addition, the signal STB_MID is asserted at time t2. Hence, data read from the memory cell transistor MT corresponding to the group GP2 is strobed at time t2. Next, the signal STB_FAR is asserted at time t3. Hence, data read from the memory cell transistor MT corresponding to the group GP3 is strobed at time t3.

In the above-described way, AR strobe is executed at the timings of times t1, t2, and t3 in accordance with the positions of the memory cell transistors MT. This also applies to the read operations BR and CR.

Nota that in program-verifying, verification voltages VvfyA, VvfyB, and VvfyC that are higher than the voltages VA, VB, and VC, respectively, are used as read voltages in the read operations AR, BR, and CR.

1.3 Effect According to this Embodiment

In the arrangement according to this embodiment, the operation reliability of the semiconductor memory device can be improved. Details of the effect will be described below.

In the NAND flash memory, for example, as the page size becomes large, the length of the word line WL also becomes larger. Then, in data reading or writing, the rising speed of the voltage of the word line changes depending on the position, and the degree also become large as the word line WL becomes long.

For example, as shown in FIG. 9, the voltage of the region WL_NEAR close to the driver circuit 130 linearly rises immediately after the start of voltage supply of the driver circuit 130. On the other hand, the rising speed of the voltage of the region WL_FAR far from the driver circuit 130 is lower than that in the region WL_NEAR immediately after the start of voltage supply, and gradually increases (nonlinearly changes). In the example shown in FIG. 9, after time t1, the voltage rising speeds in the regions WL_NEAR, WL_MID, and WL_FAR almost equal, and the voltages linearly rise.

In this embodiment, the timing of asserting the signal STB is changed in accordance with the rising speed of the voltage of the word line WL. In other words, it can also be said that the timing of asserting the signal STB is changed in accordance with the group GP (more specifically, the group GP is determined based on the column address CA, and the timing is changed in accordance with the group).

Hence, when this method is applied to program verify, data can be written such that the thresholds of the memory cell transistors MT corresponding to all the regions WL_NEAR, WL_MID, and WL_FAR become larger than the verify voltages VvfyA, VvfyB, and VvfyC. In other words, after the voltage of the word line WL reach the verify voltage VvfyA, VvfyB, or VvfyC, data is strobed. That is, for example, it is possible to suppress data strobe at a timing at which the potential of the region WL_MID or WL_FAR does not sufficiently rise. When data is strobed at timings at which the potentials of the regions WL_NEAR, WL_MID, and WL_FAR reach appropriate verify voltages, the thresholds of the memory cell transistors MT that hold the same data can be made almost equal between the region WL_NEAR, WL_MID, and WL_FAR.

This also applies to data reading. When the timing of asserting the signal STB is shifted in accordance with the column address CA, data can be strobed at a timing at which the voltage reaches the read voltage VA, VB, or VC in the region WL_NEAR, WL_MID, or WL_FAR. That is, it is possible to suppress data strobe at a timing at which the potential of the word line WL does not sufficiently rise. As a result, the data reading accuracy can be improved.

2. Second Embodiment

A semiconductor memory device according to the second embodiment will be described next. This embodiment is directed to an arrangement configured to generate signals STB_NEAR, STB_MID, and STB_FAR described in the first embodiment using a delay circuit. Only points different from the first embodiment will be described below.

2.1 First Example

The first example will be described first. The first example corresponds to FIG. 7 described in the first embodiment. That is, a sequencer 170 generates the signal STB_NEAR. A delay circuit 30 delays the signal, thereby generating the signals STB_MID and STB_FAR. In this example, an example of the arrangement of the delay circuit 30 will be described with reference to FIG. 10.

Figure 10:
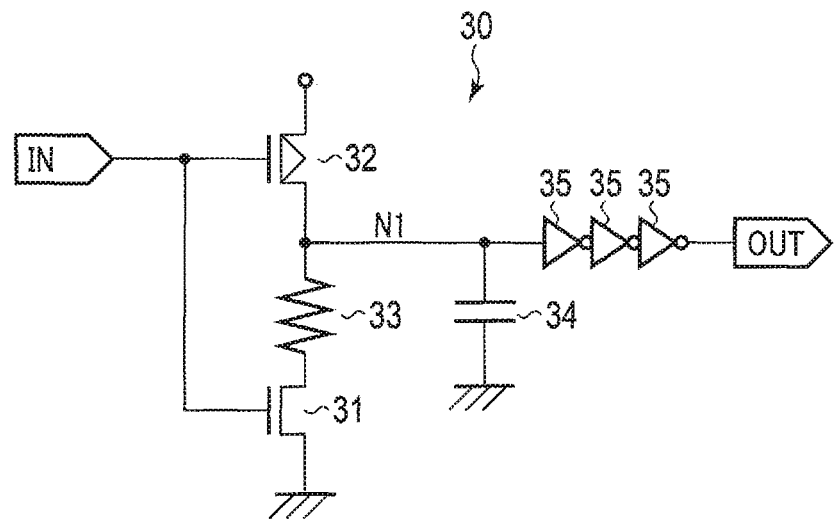
FIG. 10 is a circuit diagram of a delay circuit according to the second embodiment.

As shown in FIG. 10, the delay circuit 30 includes an n-channel MOS transistor 31, a p-channel MOS transistor 32, a resistive element 33, a capacitive element 34, and three-stages of, for example, series-connected inverters 35.

In the transistor 32, the gate is connected to an input node IN of the delay circuit 30, a power supply voltage is applied to the source, and the drain is connected to a node N1. One end of the resistive element 33 is connected to the node N1. In the transistor 31, the gate is connected to the node IN, the source is grounded, and the drain is connected to the other end of the resistive element 33. One electrode of the capacitive element 34 is connected to the node N1, and the other electrode is grounded. The three inverters 35 are connected in series between the node N1 and an output node OUT of the delay circuit 30.

Figure 11:
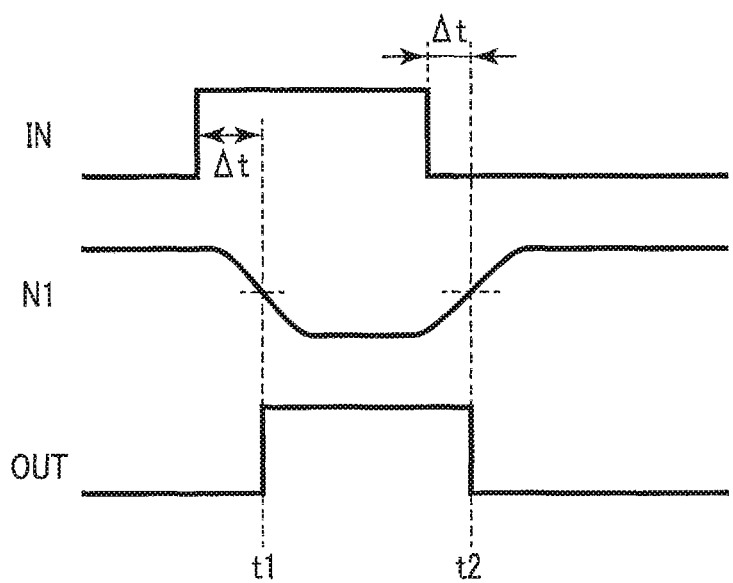
FIG. 11 is a timing chart showing the voltage of each node of the delay circuit according to the second embodiment.

FIG. 11 shows the signal waveforms at the nodes IN, N1, and OUT. Assume that a pulse-shaped signal is input to the node IN, as shown in FIG. 11. Then, the signal is inverted by an inverter formed by the transistors 31 and 32, and the degree of a voltage change at each of the rising edge and the falling edge of the signal is made moderate by an RC circuit formed by the resistive element 33 and the capacitive element 34. After that, a delayed signal is output to the node OUT in accordance with the threshold of the inverters 35. That is, when the falling edge at the node N1 becomes moderate, the rising edge of the signal at the node OUT is delayed from the rising edge of the signal at the node IN by Δt. In a similar manner, the falling edge of the signal at the node OUT is delayed from the falling edge of the signal at the node IN by Δt.

In the above-described way, the signal input to the node IN is delayed by Δt and output to the node OUT. Hence, when the sequencer 170 issues the signal STB_NEAR, the signal STB_NEAR is input to the input node IN of the delay circuit 30 and output from the output node OUT as the signal STB_MID. The signal STB_MID is further input to the input node IN of the delay circuit 30 and output from the output node OUT as the signal STB_FAR.

2.2 Second Example

The second example will be described next. In the second example, a signal is delayed using not an RC circuit but a D-F/F, unlike the first example.

FIG. 12 shows an STB generation circuit 180 provided in a semiconductor memory device 100. As shown in FIG. 12, the STB generation circuit 180 includes D flip-flops (D-F/Fs) 181-1 to 181-6, and exclusive OR (XOR) gates 182-1 to 182-3. The sequencer 170 generates a signal STB_SEED and a clock CLK.

The D-F/F 181-1 receives the signal STB_SEED to the inside by a D-input terminal in synchronism with the clock CLK, and outputs the signal as a signal STB_D1 from a Q-output terminal. The D-F/F 181-2 receives the signal STB_D1 to the inside by a D-input terminal in synchronism with the clock CLK, and outputs the signal as a signal STB_D2 from a Q-output terminal. The D-F/F 181-3 receives the signal STB_D2 to the inside by a D-input terminal in synchronism with the clock CLK, and outputs the signal as a signal STB_D3 from a Q-output terminal. The D-F/F 181-4 receives the signal STB_D3 to the inside by a D-input terminal in synchronism with the clock CLK, and outputs the signal as a signal STB_D4 from a Q-output terminal. The D-F/F 181-5 receives the signal STB_D4 to the inside by a D-input terminal in synchronism with the clock CLK, and outputs the signal as a signal STB_D5 from a Q-output terminal. The D-F/F 181-6 receives the signal STB_D5 to the inside by a D-input terminal in synchronism with the clock CLK, and outputs the signal as a signal STB_D6 from a Q-output terminal.

The XOR gate 182-1 performs an XOR operation of the signals STB_D1 and STB_D2 and outputs the operation result as the signal STB_NEAR. The XOR gate 182-2 performs an XOR operation of the signals STB_D3 and STB_D4 and outputs the operation result as the signal STB_MID. The XOR gate 182-3 performs an XOR operation of the signals STB_D5 and STB_D6 and outputs the operation result as the signal STB_FAR.

Figure 13:
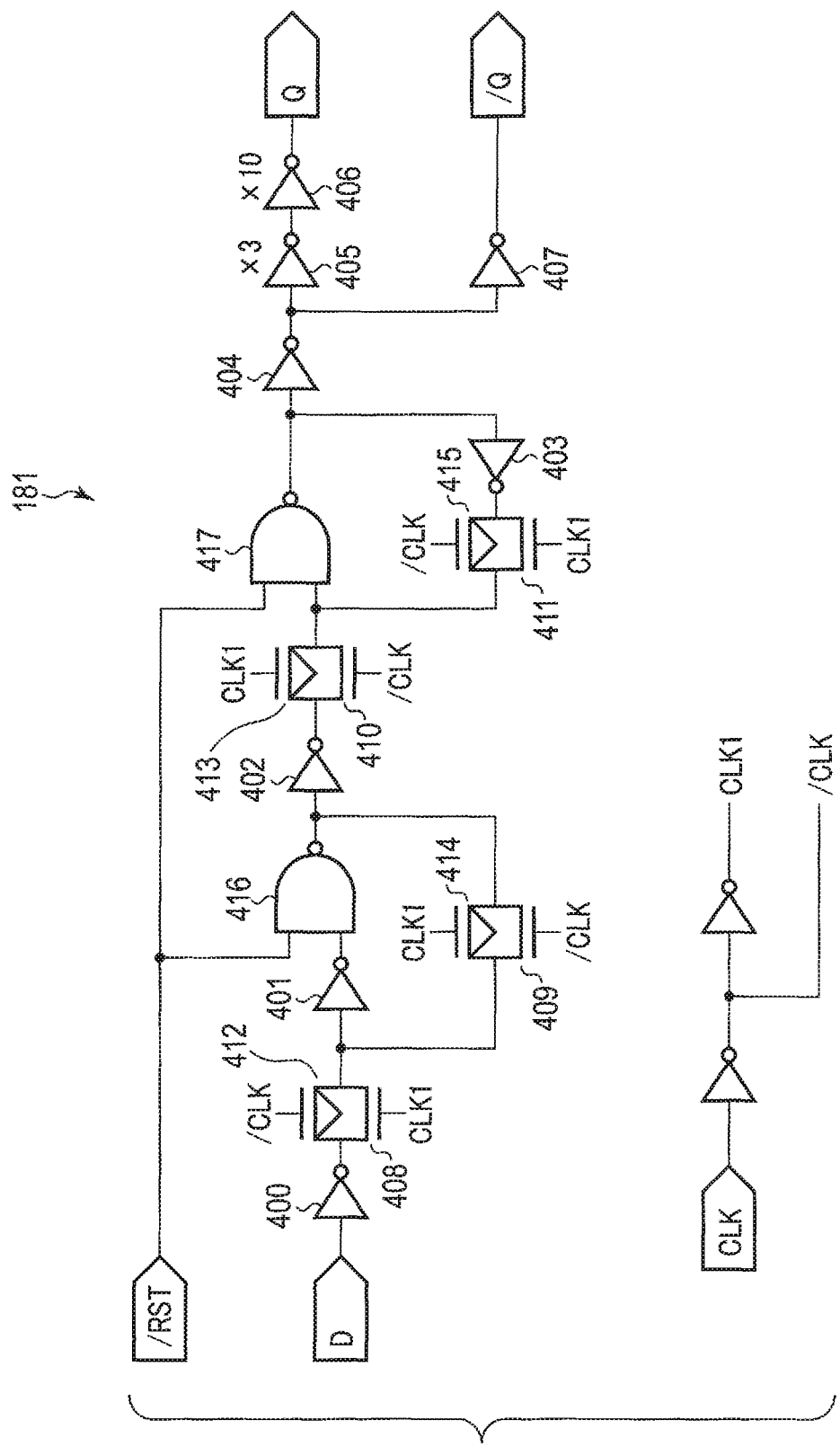
FIG. 13 is a circuit diagram of a D-F/F according to the second embodiment.

FIG. 13 is a circuit diagram of the D-F/F 181. As shown in FIG. 13, each D-F/F 181 includes inverters 400 to 407, n-channel MOS transistors 408 to 411, p-channel MOS transistors 412 to 415, and NAND gates 416 and 417.

The input node of the inverter 400 is connected to the D-input terminal. The transistors 408 and 412 function as a transfer gate. That is, in the transistors 408 and 412, the sources are commonly connected, and the drains are commonly connected. The drains are connected to the output node of the inverter 400. In addition, a clock CLK1 is input to the gate of the transistor 408, and a clock /CLK is input to the gate of the transistor 412. The clock /CLK is a signal obtained by inverting the clock CLK output from the sequencer 170 by an inverter, and the clock CLK1 is a signal obtained by inverting the clock /CLK.

The inverter 401 is connected to the sources of the transistors 408 and 412. The transistors 409 and 414 function as a transfer gate. That is, in the transistors 409 and 414, the sources are commonly connected, and the drains are commonly connected. The drains are connected to the sources of the transistors 408 and 412. In addition, the clock /CLK is input to the gate of the transistor 409, and the clock CLK1 is input to the gate of the transistor 414.

The NAND gate 416 performs an inverted logical AND (NAND) operation between the signal at the output node of the inverter 401 and a reset signal /RST input to the reset input terminal of the D-F/F 181. The reset signal /RST is a signal that is asserted (/RST="L") when resetting data held by the D-F/F 181.

The input node of the inverter 402 is connected to the output node of the NAND gate 416 and the sources of the transistors 409 and 414. The transistors 410 and 413 function as a transfer gate. That is, in the transistors 410 and 413, the sources are commonly connected, and the drains are commonly connected. The drains are connected to the output node of the inverter 402. In addition, the clock /CLK is input to the gate of the transistor 410, and the clock CLK1 is input to the gate of the transistor 413.

The NAND gate 417 performs a NAND operation between the signals at the sources of the transistors 410 and 413 and the reset signal /RST.

The input node of the inverter 403 is connected to the output node of the NAND gate 417. The transistors 411 and 415 function as a transfer gate. That is, in the transistors 411 and 415, the sources are commonly connected and further connected to the input node of the NAND gate 417, and the drains are commonly connected and further connected to the output node of the inverter 403. In addition, the clock CLK1 is input to the gate of the transistor 411, and the clock /CLK is input to the gate of the transistor 415.

The inverter 404 inverts the output signal of the NAND gate 417. The inverter 405 inverts the output signal of the inverter 404, and the inverter 406 inverts the output signal of the inverter 405 and outputs the result from the Q-output terminal. In addition, the inverter 407 inverts the output signal of the inverter 404 and outputs the result from the /Q-output terminal. Note that as for the n-channel MOS transistors and p-channel MOS transistors that form the inverter 405, for example, three n-channel MOS transistors and three p-channel MOS transistors may be connected in parallel. In addition, as for the n-channel MOS transistors and p-channel MOS transistors that form the inverter 406, for example, 10 n-channel MOS transistors and 10 p-channel MOS transistors may be connected in parallel.

Figure 14:
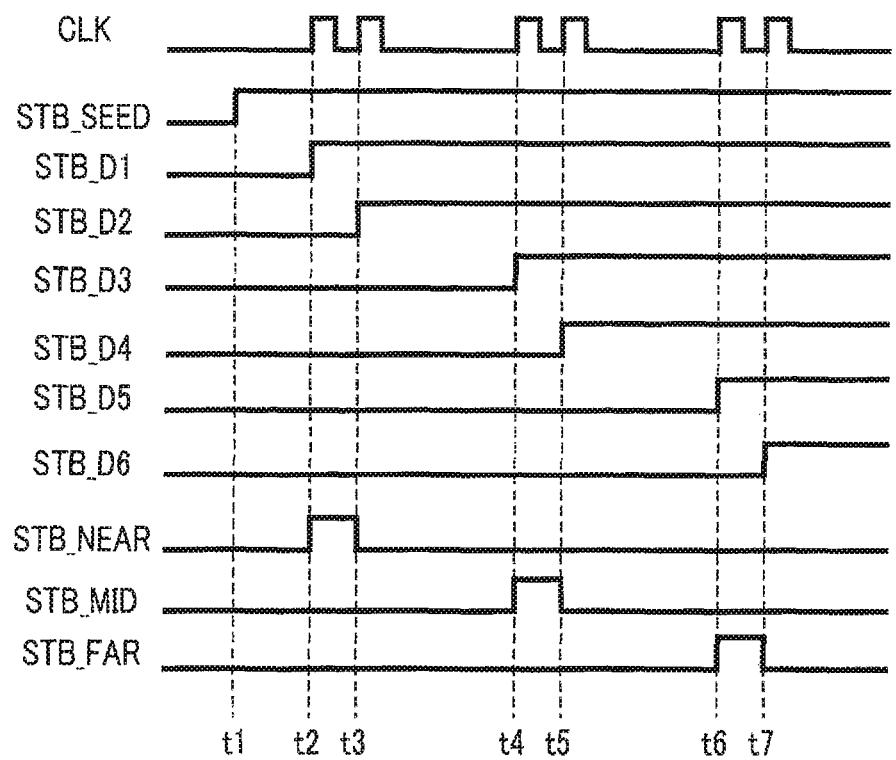
FIG. 14 is a timing chart showing the voltage of each node of the STB generation circuit according to the second embodiment.

FIG. 14 is a timing chart of signals of the STB generation circuit 180 according to this example. As shown in FIG. 14, first, the sequencer 170 asserts (for example, "H" level) the signal STB_SEED at time t1 and generates the clock CLK at time t2. Then, the signal STB_D1 is asserted ("H" level) at time t2 in synchronism with the clock CLK. As a result, the operation result of the XOR gate 182-1 becomes "H" level, and the signal STB_NEAR is asserted ("H" level) at time t2. Subsequently, when the sequencer 170 generates the clock CLK at time t3, the signal STB_D2 is asserted. As a result, the signal STB_NEAR is negated ("L" level) at time t3.

In addition, when the sequencer 170 generates the clock CLK at time t4, the signal STB_D3 is asserted at time t4 in synchronism with the clock CLK. As a result, the operation result of the XOR gate 182-2 becomes "H" level, and the signal STB_MID is asserted at time t4. Subsequently, when the sequencer 170 generates the clock CLK at time t5, the signal STB_D4 is asserted. As a result, the signal STB_MID is negated at time t5.

In the same way, when the clock CLK is generated at times t6 and t7, the signal STB_FAR is asserted. The signals STB_NEAR, STB_MID, and STB_FAR whose timings are shifted are thus generated.

2.3 Third Example

The third example will be described next. In the third example, two read modes are prepared, and a read mode is selected by a mode signal in the second example. In this example, the outputs of the XOR gates 182-1 to 182-3 will be referred to as signals STB_NEAR pre, STB_MID pre, and STB_FAR pre. In addition, the sequencer 170 generates a mode selection signal Sim_mode in addition to the signal STB_SEED and the clock CLK. When the signal Sim_mode is asserted (in this example, "H" level), the STB generation circuit 180 asserts the signals STB_NEAR, STB_MID, and STB_FAR at the same timing.

Figure 15:
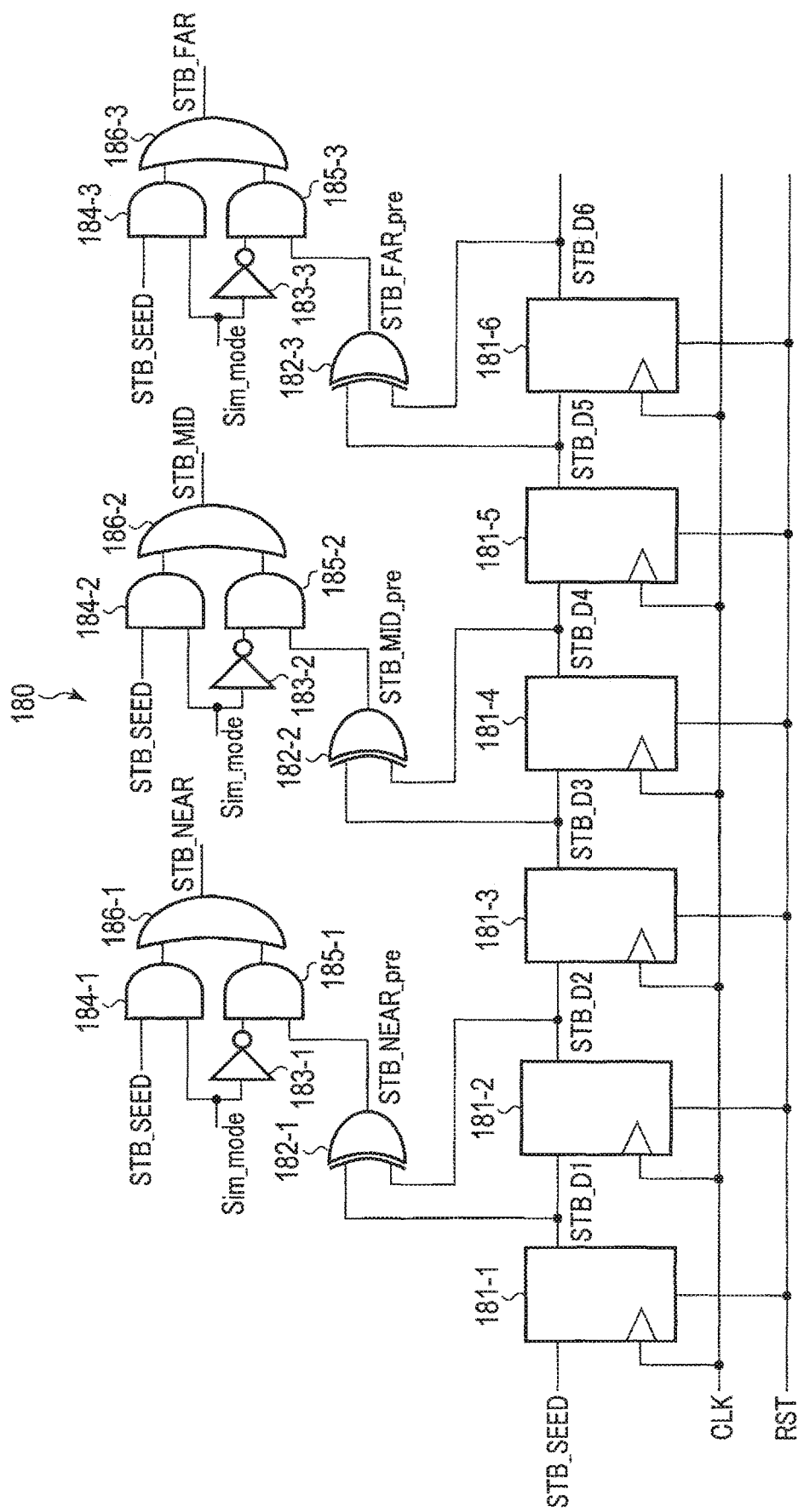
FIG. 15 is a circuit diagram of the STB generation circuit according to the second embodiment.

FIG. 15 is a circuit diagram of the STB generation circuit 180 according to the third example. As shown in FIG. 15, the generation circuit 180 according to this example includes an arrangement formed by further adding inverters 183-1 to 183-3, AND gates 184-1 to 184-3 and 185-1 to 185-3, and OR gates 186-1 to 186-3 to the arrangement shown in FIG. 13 described in the second example.

As shown, each of the inverters 183-1 to 183-3 inverts the signal Sim_mode. Each of the AND gates 184-1 to 184-3 performs an AND operation of the signal STB_SEED and the signal Sim_mode. The AND gates 185-1 to 185-3 perform the AND operations between the signal Sim_mode and the signals STB_NEAR pre, STB_MID pre, and STB_FAR pre, respectively. The OR gates 186-1 to 186-3 perform the OR operations between the operation results of the AND gates 184-1 to 184-3 and the operation results of the AND gates 185-1 to 185-3, and output the results as the signals STB_NEAR, STB_MID, and STB_FAR, respectively.

Figure 16:
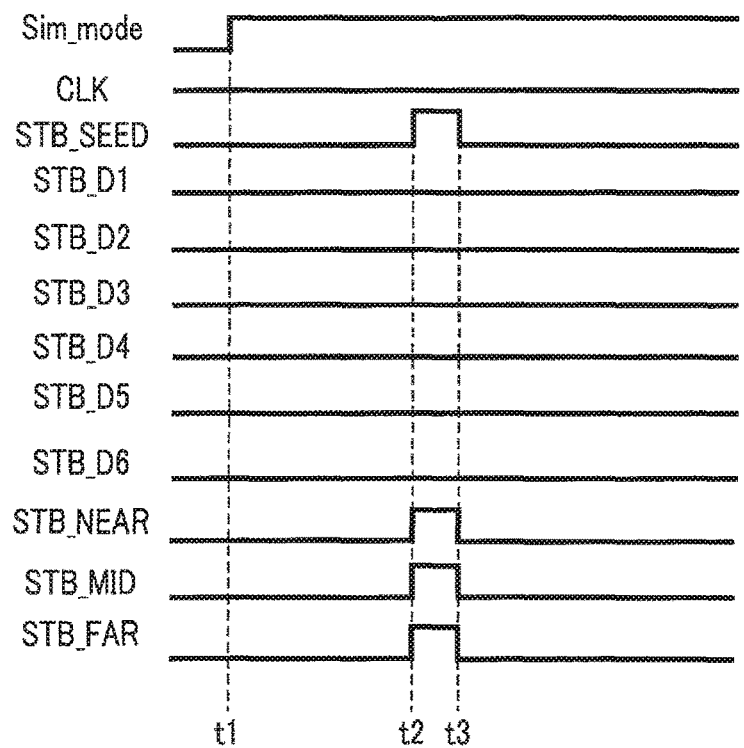
FIG. 16 is a timing chart showing the voltage of each node of the STB generation circuit according to the second embodiment.

FIG. 16 is a timing chart of the signals when the signal Sim_mode is asserted. When the signal Sim_mode is asserted, the output of the AND gate 185 always becomes "L" level. Hence, the output of the OR gate 186 is decided by the output of the AND gate 184, that is, the signal STB_SEED. For this reason, as shown in FIG. 16, when the signal STB_SEED is asserted and negated, the signals STB_NEAR, STB_MID, and STB_FAR are also asserted and negated at the same timings.

Note that when the signal Sim_mode is negated, conversely, the output of the AND gate 184-1 always becomes "L" level. Hence, the signals STB_NEAR, STB_MID, and STB_FAR have the waveforms as described with reference to FIG. 14.

The two read modes according to this example will be described next. One read mode is the method described with reference to FIG. 9 in the first embodiment (step S10). That is, this is a method of continuously raising the voltage of a selected word line WL and performing data strobe at a different timing in accordance with a column address. The method of continuously raising the voltage of the selected word line WL and sensing data will be referred to as "ramped sensing" hereinafter.

Figure 17:
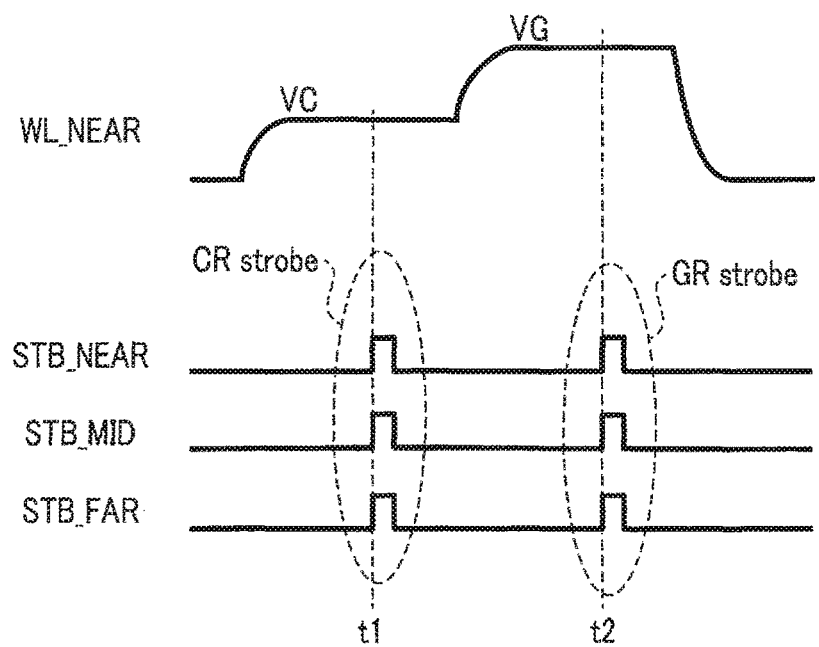
FIG. 17 is a timing chart of a word line and a signal STB in a read operation according to the second embodiment.

In the other read mode, the voltage of the selected word line WL is not continuously raised but stepwise up to a desired read level, and data is strobed at a timing when the voltage of the selected word line WL stabilizes. Additionally, in this method, by asserting the signal Sim_mode, data is strobed at the same timing without depending on the column address. This state is shown in FIG. 17. FIG. 17 is a timing chart of the region WL_NEAR of the word line WL and the signals STB_NEAR, STB_MID, and STB_FAR. Note that FIG. 17 shows an example in which in a case in which a memory cell transistor MT holds 3-bit data and has a threshold distribution of "E"-, "A"-, "B"-, "C"-, "D"-, "E"-, "F"-, and "G"-levels in ascending order of voltage, a read operation CR of determining whether the threshold is included in the distribution of "B"-level or less or included in the distribution of "C"-level or more and a read operation GR of determining whether the threshold is included in the distribution of "F"-level or less or included in the distribution of "G"-level or more are performed.

As shown in FIG. 17, first, a voltage VC (a voltage between the "B"-level and the "C"-level) used to perform the read operation CR is applied to the selected word line WL, and the signals STB_NEAR, STB_MID, and STB_FAR are asserted at time t1 when the potential of the selected word line WL becomes constant at VC. Next, the potential of the selected word line WL is raised from the voltage VC to a voltage VG (a voltage between the "F"-level and the "G"-level). Then, the signals STB_NEAR, STB_MID, and STB_FAR are asserted at time t2 when the potential of the selected word line WL becomes constant at VG. The method of thus raising the voltage of the selected word line WL stepwise and sensing data will be referred to as "fast read" hereinafter.

Note that the "continuous change" of the selected word line voltage when performing ramped sensing can be defined as, for example, a case in which the voltage value rises even during the period when the signals STB_NEAR, STB_MID, and STB_FAR are asserted. Hence, even if the selected word line voltage rises stepwise from the microscopic viewpoint during the period when the signals STB_NEAR, STB_MID, and STB_FAR are asserted, this is defined as a "continuous change" in this specification.

On the other hand, the "stepwise rise" of the voltage when performing fast read can be defined as, for example, a case in which the voltage value is almost constant at least during the period when the signals STB_NEAR, STB_MID, and STB_FAR are asserted.

Figure 18:
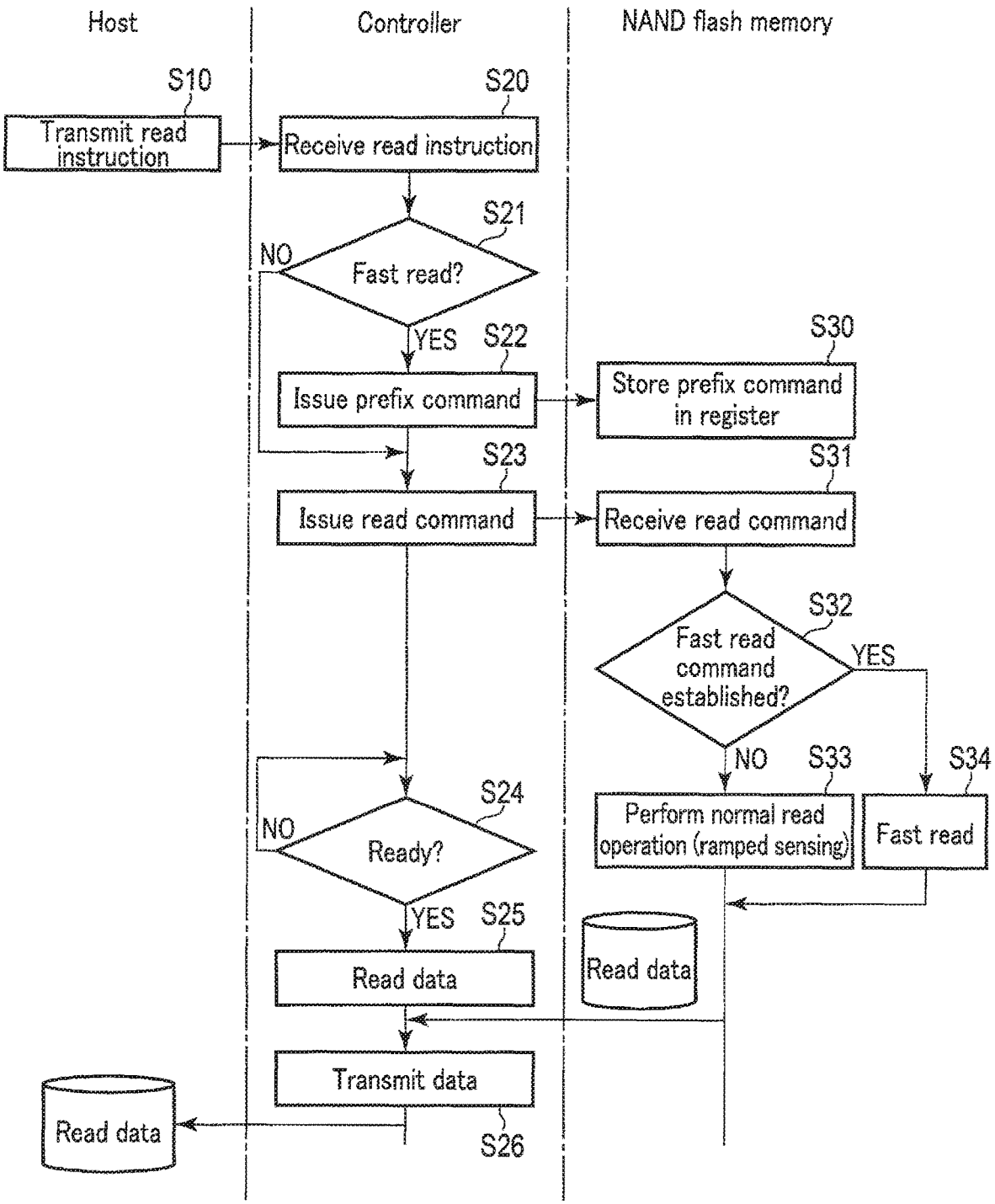
FIG. 18 is a flowchart of the read operation according to the second embodiment.

FIG. 18 is a flowchart showing the general procedure of a data writing method and reading method according to this example. Note that data to be read in this example is data written using ramped sensing in program-verifying.

As shown in FIG. 18, a host apparatus 300 issues a read instruction and transmits it to a controller 200 (step S10). A processor 230 of the controller 200 that receives the read instruction (step S29) determines whether to perform fast read (step S21).

Upon determining to perform fast read (YES in step S21), the processor 230 issues a prefix command and transmits it to the NAND flash memory 100 (step S22). The prefix command is stored in, for example, a command register 160 of the NAND flash memory 100 (step S30). A fast read command is thus established in the NAND flash memory 100.

Next, the processor 230 issues a read command and transmits it to the NAND flash memory 100 (step S23). The read command is stored in, for example, the command register 160 of the NAND flash memory 100. The read command is thus established in the NAND flash memory 100.

Upon determining in step S21 not to perform fast read (NO in step S21), that is, upon determining to perform ramped sensing, the processor 230 skips step S22 and performs the process to step S23.

In the NAND flash memory 100 that receives the read command from the controller 200, for example, the sequencer 170 determines whether the fast read command is established in an command register 160 (step S32).

If the fast read command is not established (NO in step S32), that is, the prefix command is not received from the controller 200, the sequencer 170 performs a normal read operation (ramped sensing) (step S33). That is, data is strobed at a different timing in accordance with the column address using ramped sensing, as in program-verifying.

On the other hand, if the fast read command is established in the command register 160 (YES in step S32), that is, the prefix command is received from the controller 200, the sequencer 170 performs fast read (step S34). Hence, the sequencer 170 asserts the signal Sim_mode, thereby asserting the signals STB_NEAR, STB_MID, and STB_FAR at the same timing.

Figure 19:
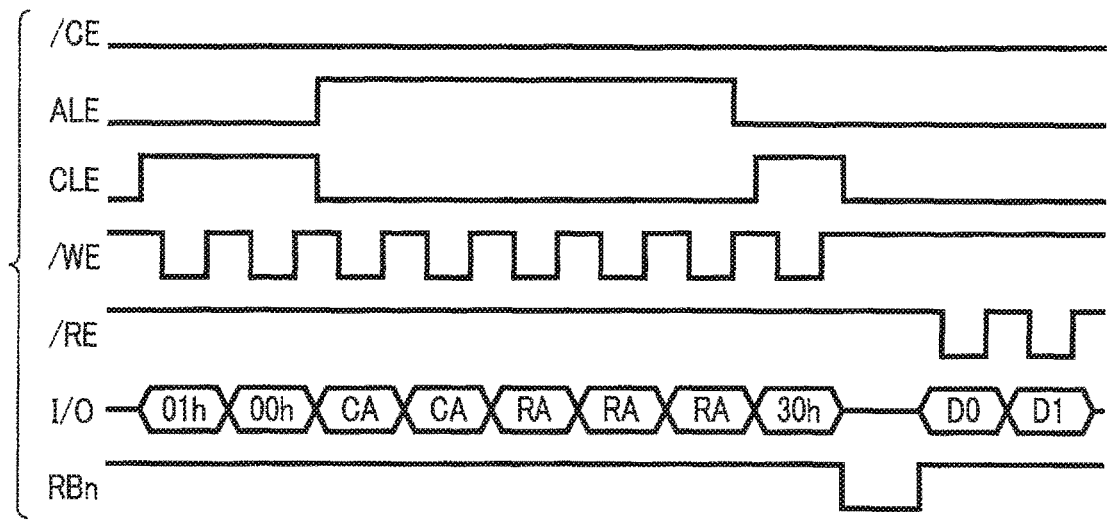
FIG. 19 and FIG. 20 are timing charts showing a command sequence in the read operation according to the second embodiment.
Figure 20:
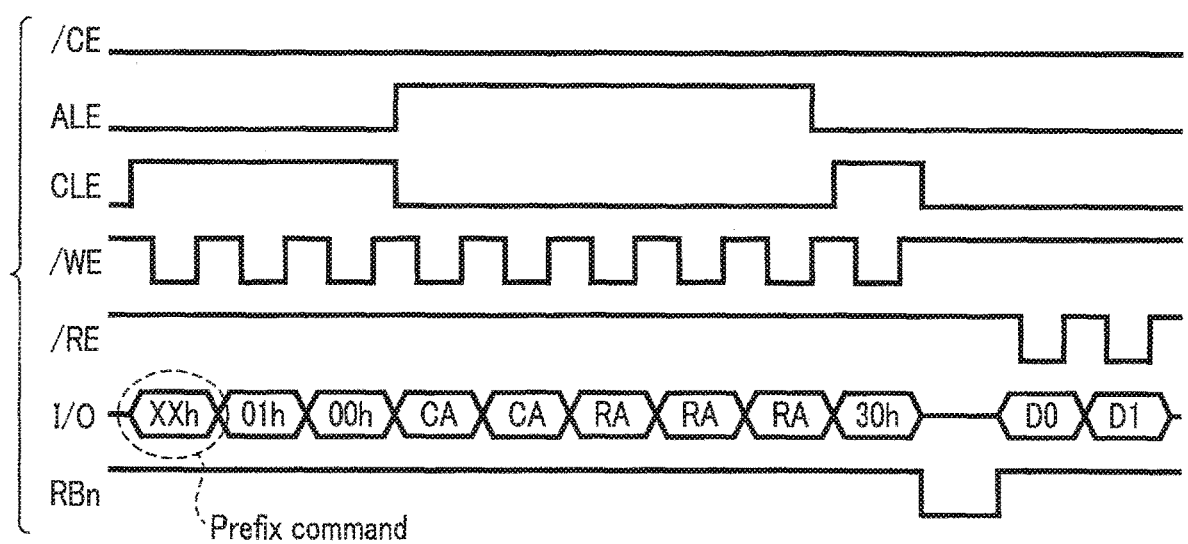

FIGS. 19 and 20 show the command sequence between the NAND flash memory 100 and the controller 200, and respectively show a case of ramped sensing and a case of fast read.

As shown in FIGS. 19 and 20, the difference between the two modes is the presence/absence of a prefix command "XXh". When "XXh" is transmitted from the controller 200 and held in the command register 160, the sequencer 170 asserts the signal Sim_mode, and fast read is executed. On the other hand, if "XXh" is not received, the sequencer 170 negates the signal Sim_mode, and ramped sensing is executed.

After that, read commands "01h" and "00h" are issued. In addition, column addresses CA and row addresses RA are issued. Finally, a read command "30h" is issued. The NAND flash memory 100 that receives the command "30h" changes to a busy state and reads data from a memory cell array 110. After that, when the NAND flash memory 100 changes to a ready state (YES in step S24), the controller 200 toggles a signal /RE to read data from the NAND flash memory 100 (step S25) and transmits the read data to the host apparatus 300 (step S26).

Figure 21:
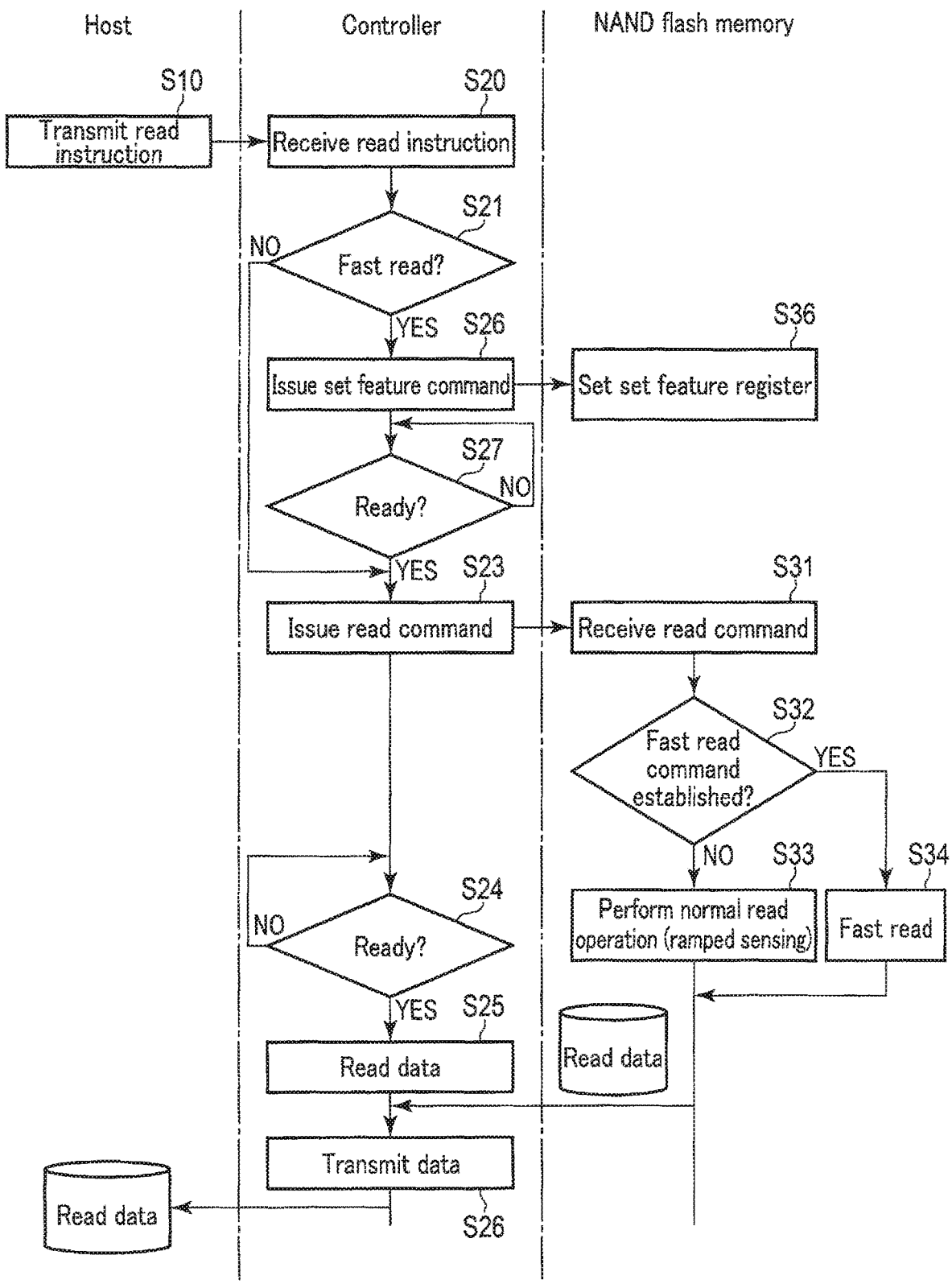
FIG. 21 is a flowchart of the read operation according to the second embodiment.

FIG. 21 is a flowchart showing a read operation by a method different from that of FIG. 18. This example shows a method of causing the NAND flash memory 100 to perform fast read using a set feature command. Only points different from the example of FIG. 17 will be described below.

As shown in FIG. 21, the processor 230 of the controller 200 that determines to perform fast read (YES in step S21) issues the set feature command and transmits it to the NAND flash memory 100 (step S26). In the NAND flash memory 100 that receives the set feature command, the fast read mode is set in a set feature register in accordance with the received command.

The set feature command is a command to set various kinds of configurations in the set feature register prepared in the NAND flash memory 100. The set feature register includes, for example, a plurality of entries, and a bit position in each entry corresponds to the configuration information of the NAND flash memory. The set feature command can set various kinds of operation modes or the like of the NAND flash memory 100 by, for example, designating the bit position and setting a flag. As one of the operation modes, in this example, a flag concerning fast read is provided in the set feature register. That is, when this flag is set by the set feature command, the NAND flash memory 100 performs fast read. If the flag is not set, ramped sensing is performed.

When the NAND flash memory 100 changes to the ready state (YES in step S27), the controller 200 issues a read command (step S23). In the NAND flash memory 100 that receives the read command, a ramped sensing command or the fast read command is established in accordance with the information in the set feature register.

The subsequent operation is the same as in FIG. 18.

Figure 22:
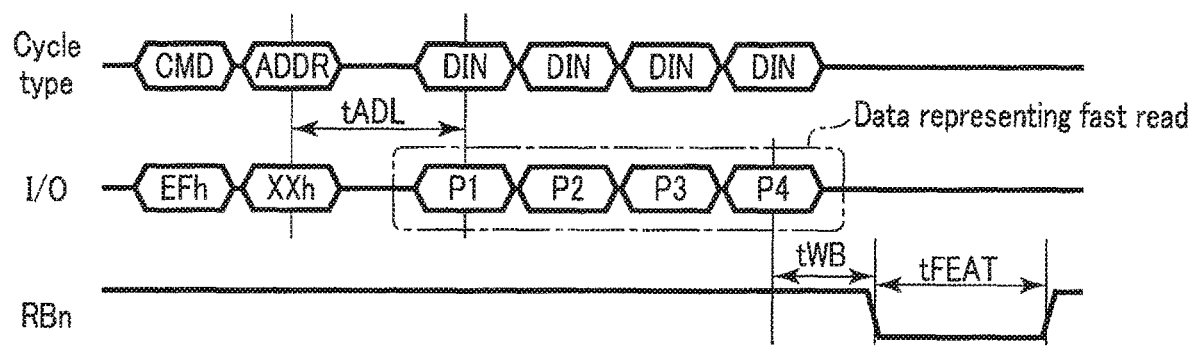
FIG. 22 is a timing chart showing a command sequence in the read operation according to the second embodiment.

FIG. 22 shows the command sequence of the set feature command. As shown in FIG. 22, a command "EFh" is issued first, and an address ADDR (for example, "XXh") is issued next. The address ADDR designates an entry in the set feature register. Next, data is input in, for example, four cycles. This data is to perform fast read. When the data is set in the set feature register, the fast read command is established in the NAND flash memory 100.

When data input is completed, the NAND flash memory 100 changes to the busy state, and after a predetermined time tFEAT, changes to the ready state.

2.4 Effect According to this Embodiment

As described above, the signals STB_NEAR, STB_MID, and STB_FAR described in the first embodiment can be generated using the first to third examples described in this embodiment. Additionally, according to the arrangement described in the third example, the voltage of the selected word line WL can be set stepwise to a desired voltage without continuously raising the voltage from 0 V. It is therefore possible to speed up the read operation. Such reading is possible because an appropriate threshold distribution can be formed by applying the reading method described in the first embodiment to program-verifying.

Figure 23:
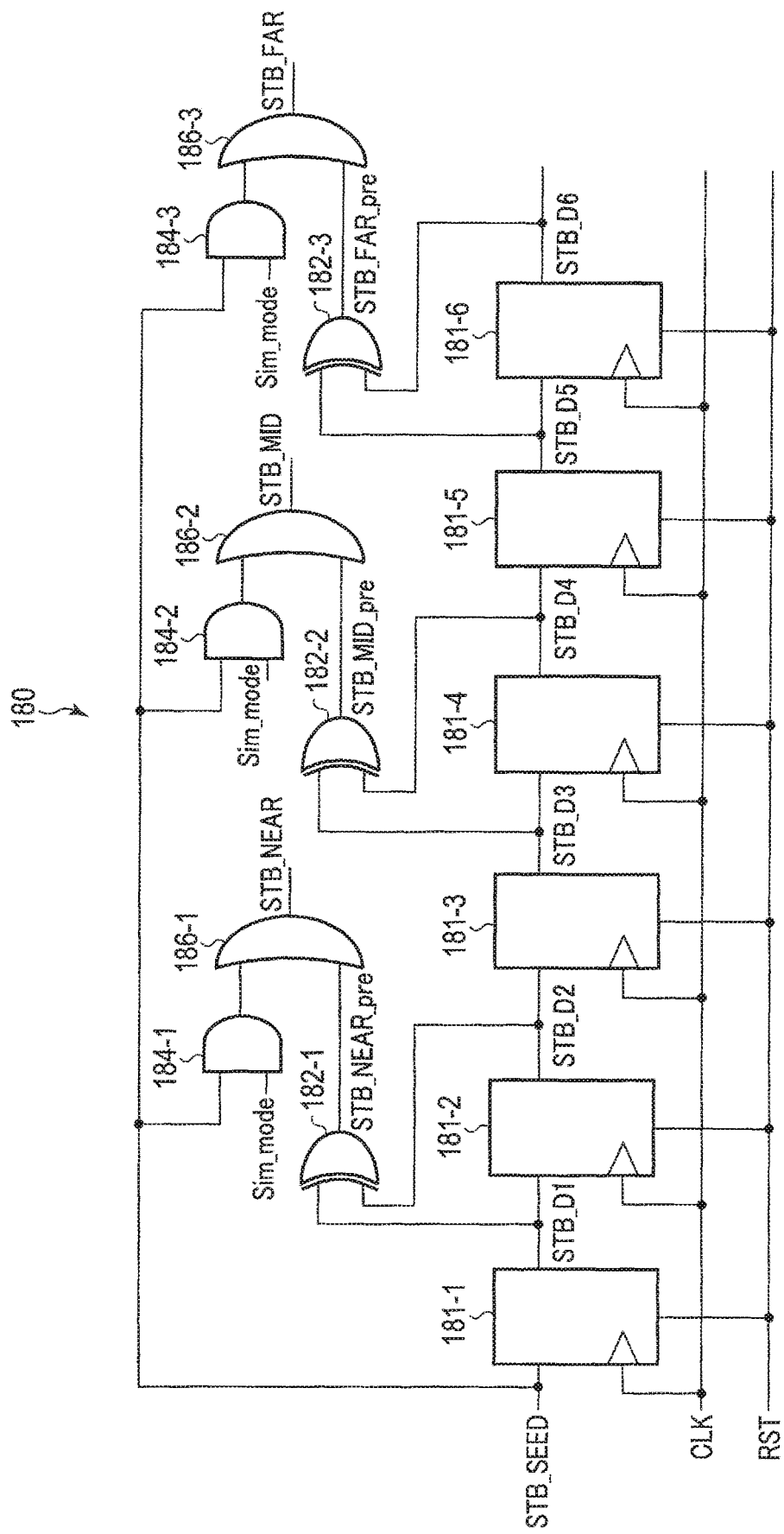
FIG. 23 is a circuit diagram of the STB generation circuit according to a modification of the second embodiment.

Note that the arrangement of the STB generation circuit 180 is not limited to those described above. For example, the arrangement described with reference to FIG. 15 may be change to an arrangement shown in FIG. 23. That is, as shown in FIG. 23, the inverters 183-1 to 183-3 and the AND gates 185-1 to 185-3 shown in FIG. 15 are eliminated. In addition, the OR gates 186-1 to 186-3 may perform the OR operations between the output signals of the XOR gates 182-1 to 182-3 and the output signals of the AND gates 184-1 to 184-3, respectively.

3. Third Embodiment

A semiconductor memory device according to the third embodiment will be described next. This embodiment is a modification concerning the relationship between a column address CA and a group GP in the first embodiment. Only points different from the first embodiment will be described below.

In the first embodiment, a case in which the group GP is assigned in the order of column address, as shown in FIG. 5, that is, a case in which the signal STB is asserted in the order of column address has been described as an example.

FIG. 24 is associated with this embodiment and corresponds to FIG. 5. As shown in FIG. 24, in a memory cell array 110, a word line WL0 is physically separated in a region between bit lines BL23 and BL24. The word line WL0 connected to memory cell transistors MT corresponding to columns C0 to C2 is connected to a signal line CG0 via a transistor 50 provided in close vicinity to the column C0. On the other hand, the transistor 50 is also provided in the region between the bit lines BL23 and BL24. The word line WL0 connected to the memory cell transistors MT corresponding to columns C3 to C5 is connected to the signal line CG0 via the transistor 50 in this region.

In the above arrangement, assume that a word line WL is formed using, for example, a polysilicon layer or the like as a material, and a signal line CG is formed using a material such as a metal whose resistance is lower than that of the word line WL. Then, the physical length of the current path from a driver circuit 130 to the gate of each memory cell transistor MT corresponding to the column C3 is larger than the physical length of the current path from the driver circuit 130 to the gate of each memory cell transistor MT corresponding to the column C2. However, to reach the gate of each memory cell transistor MT corresponding to the column C2, the signal needs to propagate through the word line WL corresponding to the columns C0 and C1, which has a high resistance. On the other hand, the signal propagates to the column C3 through the signal line CG with a low resistance. Hence, when the driver circuit 130 drives the word line, the voltage may probably rise more quickly in the region corresponding to the column C3 than in the region corresponding to the column C2. This also applies to the relationship between the columns C1 and C4. In this case, the columns C0 and C3 may be put into a group GP1, the columns C1 and C4 may be put into a group GP2, and the columns C2 and C5 may be put into a group GP3. That is, sense amplifier units SA0 to SA7 and SA24 to SA31 strobe data based on a signal STB_NEAR, sense amplifier units SA8 to SA15 and SA32 to SA39 strobe data based on a signal STB_MID, and sense amplifier units SA16 to SA23 and SA40 to SA47 strobe data based on a signal STB_FAR.

As described above, the strobe timing in a sense amplifier unit SA is preferably decided in accordance with not the physical distance between the driver circuit 130 and the gate of each memory cell transistor MT but the actual signal propagation speed. This embodiment can be applied to the second embodiment, as a matter of course.

4. Fourth Embodiment

A semiconductor memory device according to the fourth embodiment will be described next. In this embodiment, the data reading method described in the first to third embodiments is applied to distribution read. Only points different from the first to third embodiments will be described below.

4.1 Distribution Read

In the first embodiment, the threshold distribution of the memory cell transistor MT has been described with reference to FIG. 8. In FIG. 8, since the threshold distributions of data are independent of each other, data can correctly be determined by using the voltages VA, VB, and VC.

However, the threshold of the memory cell transistor MT varies due to the influence of various disturbances or the like. Consequently, in the threshold distribution of each data shown in FIG. 8, the distribution width may increase or the distribution may move, and adjacent distributions may overlap each other. Even in this case, the data can correctly be read by correcting the error by ECC. As another method, there exists a method of performing reading again using an appropriate read voltage. This is called retry read. According to retry read, the error occurrence probability in read data can be reduced.

FIG. 25 shows this state. FIG. 25 is a graph showing changes in the threshold distribution of "A"-level and "B"-level. The number of memory cell transistors plotted along the ordinate of the threshold distribution is represented by a log scale. Referring to FIG. 25, assume that the threshold distributions of "A"-level and "B"-level immediately after writing are those shown in the upper view. However, assume that the threshold distributions expand as shown in the lower view due to a disturbance or the like. Then, when reading is performed using a voltage VB, an error occurs in memory cell transistors MT corresponding to the region of the hatched portion in the lower view. If the number of generated error bits exceeds the number of error-correctable bits of an ECC circuit 260, data cannot correctly be corrected. Hence, in such a case, the position (voltage) of the intersection where the two threshold distributions overlap is searched for, and a voltage in the neighborhood is defined as an appropriate read voltage VB".

How the distribution width of each threshold expands needs to be confirmed (in other words, it can also be said that a position (voltage) which is the intersection of two distribution and at which the number of read fail bits is minimum is specified; this is also called Vth tracking), and an appropriate read voltage needs to be found in this way. Distribution read is used when searching for the read voltage.

Vth tracking includes 1-level tracking and full level tracking. The 1-level tracking will be described first. For example, in the threshold distribution of 2-bit data as described with reference to FIG. 8, there exist three voltages at the intersections between the distributions. In the 1-level tracking, the voltage of one intersection (for example, the intersection between "A"-level and "B"-level) is searched for, and an appropriate read voltage (for example, the voltage VB") is detected. The remaining read voltages (voltages VA" and VC") are known by analogy from the voltage VB". This is 1-level tracking.

The concept of how to obtain the appropriate read voltage VB" will be described with reference to FIG. 26. FIG. 26 is a graph showing the threshold distribution of "A"-level, the threshold distribution of "B"-level, and a change in the number of on-cells with respect to a voltage VCGRV applied to a selected word line. In FIG. 26, the number of memory cell transistors shown on the upper view is represented by a log scale, and the number of on-cells shown on the lower view is represented by a linear scale.

As shown in FIG. 26, in each threshold distribution, the increase rate of the number of on-cells rises as the voltage approaches the median (the voltage of the highest distribution probability). When the voltage exceeds the median, the increase rate becomes almost constant. That is, let N be the number of on-cells, and V be the selected word line voltage. In each threshold distribution, $dN/dV$ is maximized at a voltage almost immediately before the median. That is, in the "A"-level, the increase rate of the number of on-cells is maximized in the voltage VCGRV immediately before a median VA1. In the "B"-level, the increase rate of the number of on-cells is maximized in the voltage VCGRV immediately before a median VB1. When the threshold distribution of "A"-level and the threshold distribution of "B"-level cross, as shown in FIG. 26, the increase rate does not become zero but becomes minimum (and almost constant) in the voltage VCGRV at the intersection. That is, the voltage VCGRV whose increase rate is minimum is the voltage VB" that should be found.

Figure 27:
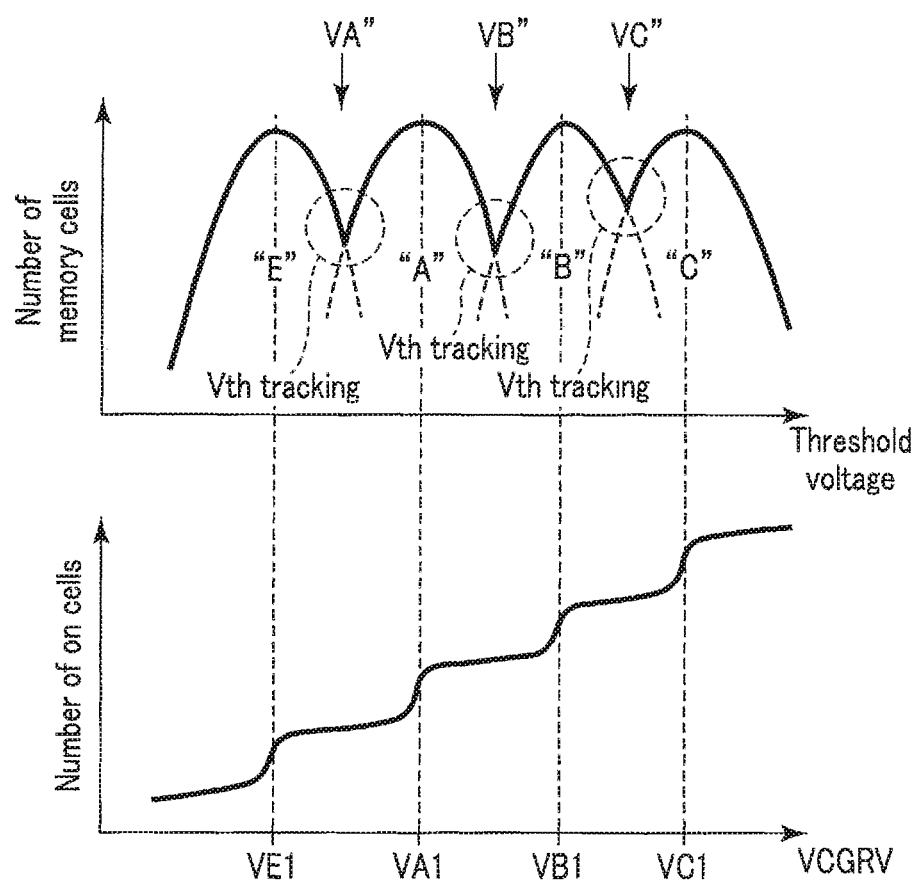

In the full level tracking, the 1-level tracking is more precisely performed for a plurality of intersections of threshold distributions. FIG. 27 shows this state. In FIG. 27 as well, the number of memory cell transistors shown on the upper view is represented by a log scale, and the number of on-cells shown on the lower view is represented by a linear scale, as in FIG. 26.

As shown in FIG. 27, the threshold distributions of "E"-level, "A"-level, "B"-level, and "C"-level overlap each other. In the 1-level tracking, one of the three intersections of the threshold distributions is searched for. In the full level tracking, Vth tracking is performed for a plurality of intersections, that is, all the three intersections in this example, and appropriate read voltages VA", VB", and VC" are searched for. Note that, for example, if the voltage (for example, VB") of one of the intersections is appropriately obtained by 1-level tracking, the remaining voltages (voltages VA" and VB") are obtained by full level tracking.

4.2 Data Strobe Timing in Distribution Read

Figure 28:
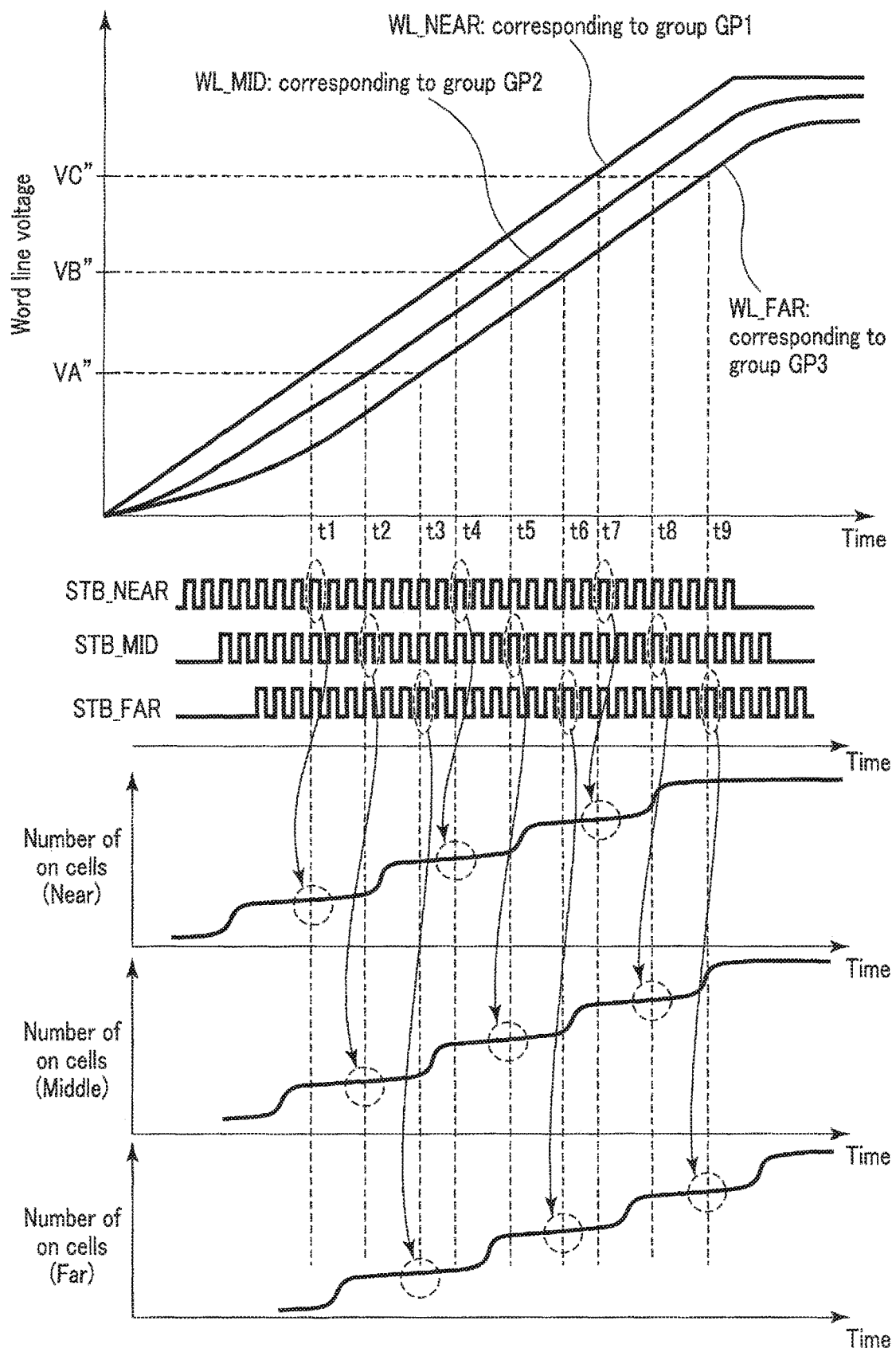
FIG. 28 is a timing chart of a word line voltage variation and a signal STB in a read operation according to the fourth embodiment.

FIG. 28 is a graph showing a change in the voltage of the selected word line, signals STB_NEAR, STB_MID, and STB_FAR, and the numbers of on-cells (expressed as "number of on-cells (Near)", "number of on-cells (Middle)", and "number of on-cells (Far)") belonging to groups GP1 to GP3 in the full level tracking described with reference to FIG. 27.

As shown in FIG. 28, the voltage applied to the selected word line WL continuously rises from 0 V. Accordingly, the signals STB_NEAR, STB_MID, and STB_FAR are repetitively asserted, and a sense amplifier 140 counts the number of on-cells every time.

The variation amounts of the threshold distributions of the memory cell transistors MT belonging to the groups GP1 to GP3 are assumed to be equal. Then, as for the voltage VA, dN/dV should be minimized at a strobe timing when the voltage of the selected word line WL becomes VA". That is, dN/dV is minimized at time t1 in a region belonging to the group GP1, at time t2 in a region belonging to the group GP2, and at time t3 in a region belonging to the group GP3. That dN/dV is minimized means, in other words, that the difference from the number of on-cells at the immediately preceding strobe timing and the difference from the number of on-cells at the immediately succeeding strobe timing are minimized.

The above-described operation is performed for the voltages VB and VC as well. In this way, an optimum strobe timing (that is, an optimum selected word line voltage) can be detected for each read voltage.

4.3 Effect According to this Embodiment

As described above, the reading method described in the first embodiment may be applied to distribution read.

Note that in FIG. 28, a case of full level tracking has been described as an example. This can also be applied to 1-level tracking. In this case, the signals STB_NEAR, STB_MID, and STB_FAR are asserted only during a period when the voltage of the selected word line WL falls within a predetermined range in FIG. 28. For example, if Vth tracking is performed only for the voltage VB, the signals STB_NEAR, STB_MID, and STB_FAR are asserted only during the period of, for example, times t3 to t7.

In addition, in the example of FIG. 28, a case in which the variation amounts of the threshold distributions of the memory cell transistors MT belonging to the groups GP1 to GP3 are equal is assumed. However, the variation amount sometimes changes between the groups GP1 to GP3. For example, assume that the voltage VA" is the appropriate voltage in the group GP1, whereas a voltage lower than the voltage VA" is the appropriate voltage in the group GP3. In this case, the timing of asserting the signal STB_FAR concerning the group GP3 is a time before time t3, as can be seen.

5. Fifth Embodiment

A semiconductor memory device according to the fifth embodiment will be described next. In the first embodiment, a sense amplifier that senses a current and determines data has been described as an example. This embodiment is directed to an example in which a voltage is sensed. Only points different from the first embodiment will be described below.

5.1 Arrangement of Sense Circuit 10

In a voltage sensing type sense amplifier, a sense operation is performed while shielding an adjacent bit line. That is, in the voltage sensing type, the voltage variation of the bit line is sensed. Here, if one bit line is discharged, an adjacent bit line is affected by the potential variation of the discharged bit line because of coupling. As a result, a data read error may occur. Hence, in the voltage sensing type, data is read from even-numbered bit lines or odd-numbered bit lines. When reading data from the even-numbered bit lines, the odd-numbered bit lines are fixed to a predetermined potential (shielded). When reading data from the odd-numbered bit lines, the even-numbered bit lines are fixed to a predetermined potential.

In the method (to be referred to as a "bit line shield method" hereinafter) of shielding the adjacent bit line, one sense circuit 10 is shared by two bit lines. That is, an arrangement is employed in which adjacent bit lines are classified into "EVEN" and "ODD", and even- and odd-numbered bit lines which are adjacent to each other share one sense circuit 10.

In the read operation of the bit line shield method, when reading data of an even-numbered bit line, the even-numbered bit line is connected to the sense amplifier, and the odd-numbered bit line is fixed to a predetermined potential. When a sense amplifier unit 11 precharges the even-numbered bit line in this state, the even-numbered bit line is appropriately precharged without being affected by the odd-numbered bit line because the potential of the odd-numbered bit line is kept held at the predetermined potential. The precharge potential is determined by the gate voltage of a signal BLC and is, for example, 0.7 V.

This also applies to a case in which data of the odd-numbered bit line is read. As described above, in the bit line shield method, an adjacent unselected bit line is set in a grounded state at the time of the read operation, thereby performing a correct read operation without the influence of the signal of the adjacent bit line.

Figure 29B:
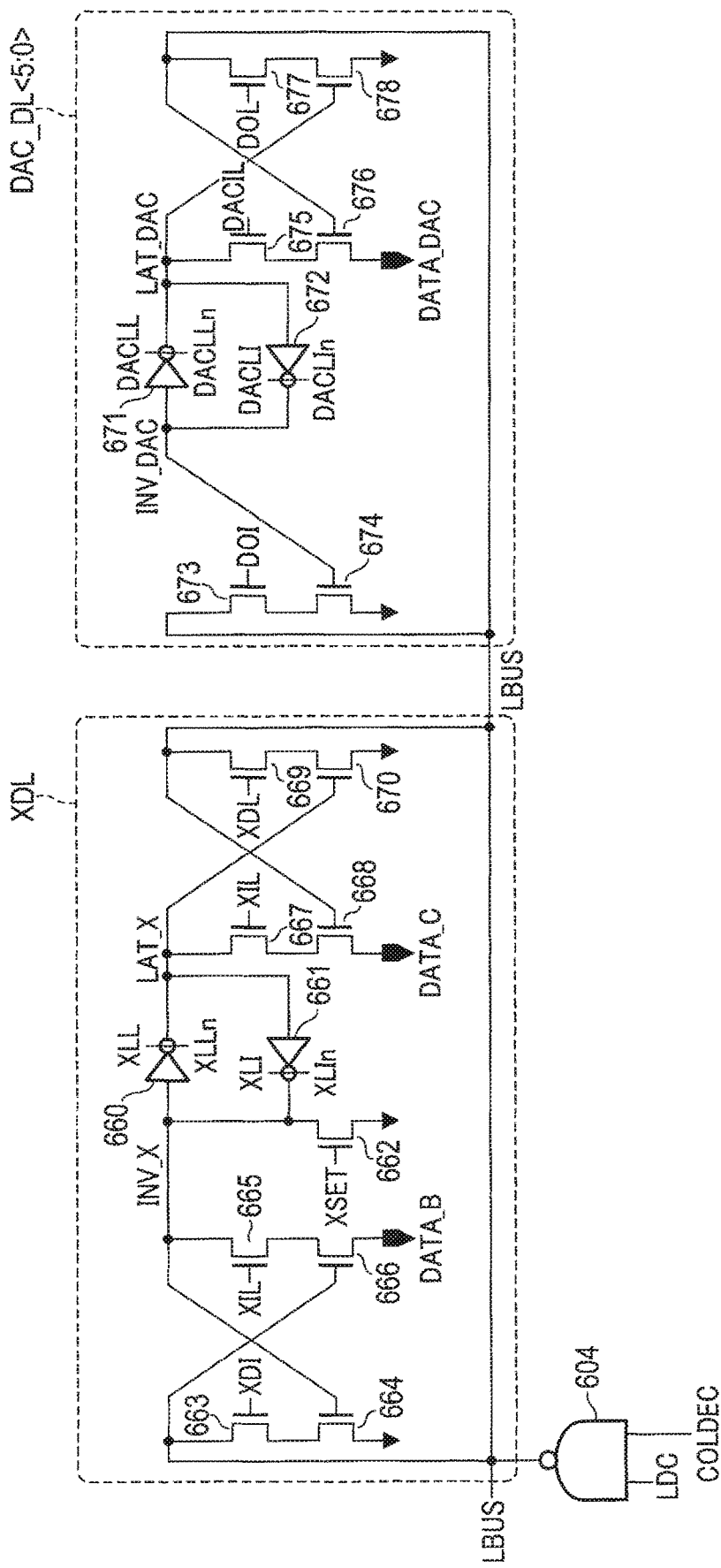

FIGS. 29A and 29B are circuit diagrams of the sense circuit 10 corresponding to a set of bit lines BLe and BLo (for example, bit lines BL0 and BL1). Because of space limitations, an arrangement beyond a node LBUS shown in FIG. 29A is shown in FIG. 29B.

As shown in FIGS. 29A and 29B, the sense circuit 10 generally includes connecting portions 600 and 601, a sense amplifier unit 602, a charging unit 603, latch circuits SDL, DDL, TDL, XDL, and DAC_DL<5:0>, and a NAND gate 604.

The connecting portion 600 connects the sense amplifier unit 602 to bit lines BL. That is, the connecting portion 600 includes high-withstand-voltage n-channel MOS transistors HN1e, HN2e, HN1o, and HN2o. In the transistor HN1e, a signal BIASe is applied to the gate, a signal BLCRL is applied to one end of the current path, and the other end is connected to the bit line BLe. In the transistor HN2e, a signal BLSe is applied to the gate, one end of the current path is connected to the bit line BLe, and the other end is connected to a node SABL. In the transistor HN1o, a signal BIASo is applied to the gate, the signal BLCRL is applied to one end of the current path, and the other end is connected to the bit line BLo. In the transistor HN2o, a signal BLSo is applied to the gate, one end of the current path is connected to the bit line BLo, and the other end is connected to the node SABL. When selecting the bit line BLe, the transistors HN2e and HN1o are set in an ON state. When selecting the bit line BLo, the transistors HN2o and HN1e are set in an ON state.

The sense amplifier unit 602 senses data read to the node SABL and amplifies the signal. That is, the sense amplifier unit 602 includes n-channel MOS transistors 610 to 613, p-channel MOS transistors 614 to 618, and a capacitor element C1.

In the transistor 610, the signal BLC is applied to the gate, one end of the current path is connected to the node SABL, and the other end is connected to a node SEN. In the transistor 611, a signal BLQ is applied to the gate, one end of the current path is connected to the node SEN, and the other end is connected to a node SBUS. In the transistor 612, a signal STI is applied to the gate, one end of the current path is connected to a node INV_S, and the other end is connected to the node SBUS. In the transistor 613, a signal SDC is applied to the gate, one end of the current path is connected to the node SBUS, and the other end is grounded. In the transistor 614, a signal REG is applied to the gate, and a power supply voltage VDD is applied to one end of the current path. In the transistor 615, a signal BLPREn is applied to the gate, and one end of the current path is connected to the other end of the current path of the transistor 614. In the transistor 616, the gate is connected to the node INV_S, one end of the current path is connected to the other end of the current path of the transistor 615, and the other end is connected to the node SEN. In the transistor 617, a signal STBn is applied to the gate, and the power supply voltage VDD is applied to one end of the current path. In the transistor 618, the gate is connected to the node SEN, one end of the current path is connected to the other end of the current path of the transistor 617, and the other end is connected to the node INV_S. In the capacitor element C1, one electrode is connected to the node SEN, and the other electrode is grounded.

The latch circuit SDL holds the sense result of the sense amplifier unit 602. That is, the latch circuit SDL includes an inverter 620, a clocked inverter 621, and a transfer gate 622.

In the inverter 620, the input node is connected to the node INV_S, and the output node is connected to a node LAT_S. In the inverter 621, the input node is connected to the node LAT_S, and the output node is connected to the node INV_S. A signal SLIn is applied to the gate of the inverter 621 on the p-channel MOS transistor side, and a signal SLI (an inverted signal of SLIn) is applied to the gate on the n-channel MOS transistor side. The transfer gate 622 is connected between the node LAT_S and the node SBUS. A signal STLn is applied to the gate of the transfer gate 622 on the p-channel MOS transistor side, and a signal STL (an inverted signal of STLn) is applied to the gate on the n-channel MOS transistor side.

The charging circuit 603 charges the node SBUS. That is, the charging circuit 603 includes p-channel MOS transistors 630 to 632.

In the transistor 630, the gate is connected to the node LAT_S, and the power supply voltage VDD is applied to one end of the current path. In the transistor 631, the gate is connected to a node LAT_D, and one end of the current path is connected to the other end of the current path of the transistor 630. In the transistor 632, a signal SPCn is applied to the gate, one end of the current path is connected to the other end of the current path of the transistor 631, and the other end is connected to the node SBUS.

The latch circuit DDL holds information representing that the memory cell transistor MT is turned on in the above-described ramped sensing. That is, the latch circuit DDL includes clocked inverters 640 and 641, and n-channel MOS transistors 642 to 644.

In the inverter 640, the input node is connected to the node LAT_D, and the output node is connected to a node INV_D. A signal DLI is applied to the gate of the inverter 640 on the p-channel MOS transistor side, and a signal DLIn (an inverted signal of DLI) is applied to the gate on the n-channel MOS transistor side. In the inverter 641, the input node is connected to the node INV_D, and the output node is connected to the node LAT_D. A signal DLL is applied to the gate of the inverter 641 on the p-channel MOS transistor side, and a signal DLLn (an inverted signal of DLL) is applied to the gate on the n-channel MOS transistor side. In the transistor 642, a signal DTL is applied to the gate, one end of the current path is connected to the node LAT_D, and the other end is connected to the node SBUS. In the transistor 643, the gate is connected to the node SBUS, and one end of the current path is connected to the node INV_S. In the transistor 644, a signal DII is applied to the gate, one end of the current path is connected to the other end of the current path of the transistor 643, and the other end is grounded.

In this arrangement, when the memory cell transistor MT is turned on, the logic level of the node INV_D transitions from "L" level to "H" level.

The latch circuit TDL is not used in ramped sensing but is used to hold lower page data or the like when performing, for example, page-by-page reading as described with reference to FIG. 18 or data for performing quick pass writing. That is, the latch circuit TDL includes clocked inverters 645 and 646 and n-channel MOS transistors 647 to 649.

In the inverter 645, the input node is connected to a node LAT_T, and the output node is connected to anode INV_T. A signal TLI is applied to the gate of the inverter 645 on the p-channel MOS transistor side, and a signal TLIn (an inverted signal of TLI) is applied to the gate on the n-channel MOS transistor side. In the inverter 646, the input node is connected to the node INV_T, and the output node is connected to the node LAT_T. A signal TLL is applied to the gate of the inverter 646 on the p-channel MOS transistor side, and a signal TLLn (an inverted signal of TLL) is applied to the gate on the n-channel MOS transistor side. In the transistor 647, a signal TTL is applied to the gate, one end of the current path is connected to the node LAT_T, and the other end is connected to the node SBUS. In the transistor 648, the gate is connected to the node SBUS, and one end of the current path is connected to the node INV_T. In the transistor 649, a signal TII is applied to the gate, one end of the current path is connected to the other end of the current path of the transistor 648, and data DATA_C is input/output to/from the other end.

The connecting portion 601 connects the node SBUS to a node YBUS and also connects the node SBUS to the node LBUS. That is, the connecting portion 601 includes n-channel MOS transistors 650 to 654. In the transistor 650, the gate is connected to the node INV_D, and one end of the current path is connected to the node YBUS. In the transistor 651, a signal SCANENB is applied to the gate, one end of the current path is connected to the other end of the current path of the transistor 650, and the other end is grounded. In the transistor 652, the gate is connected to the node LBUS, and one end of the current path is connected to the node YBUS. In the transistor 653, a signal L2S is applied to the gate, one end of the current path is connected to the other end of the current path of the transistor 652, and the other end is connected to the node SBUS. In the transistor 654, a signal LSSW is applied to the gate, one end of the current path is connected to the node SBUS, and the other end is connected to the node LBUS.

The latch circuit XDL is a latch circuit used to transmit/receive data between the sense circuit 10 and an external device (controller). As shown in FIG. 29B, the latch circuit XDL includes clocked inverters 660 and 661 and n-channel MOS transistors 662 to 670.

In the inverter 660, the input node is connected to a node INV_X, and the output node is connected to a node LAT_X. A signal XLL is applied to the gate of the inverter 660 on the p-channel MOS transistor side, and a signal XLLn (an inverted signal of XLL) is applied to the gate on the n-channel MOS transistor side. In the inverter 661, the input node is connected to the node LAT_X, and the output node is connected to the node INV_X. A signal XLI is applied to the gate of the inverter 661 on the p-channel MOS transistor side, and a signal XLIn (an inverted signal of XLI) is applied to the gate on the n-channel MOS transistor side. In the transistor 662, a signal XSET is applied to the gate, one end of the current path is connected to the node INV_X, and the other end is grounded.

In the transistor 663, a signal XDI is applied to the gate, and one end of the current path is connected to the node LBUS. In the transistor 664, the gate is connected to the node INV_X, one end of the current path is connected to the other end of the current path of the transistor 663, and the other end is grounded. In the transistor 665, a signal XLI is applied to the gate, and one end of the current path is connected to the node INV_X. In the transistor 666, the gate is connected to the node LBUS, one end of the current path is connected to the other end of the current path of the transistor 665, and data DATA_B is input/output to/from the other end.

In the transistor 669, a signal XDL is applied to the gate, and one end of the current path is connected to the node LBUS. In the transistor 670, the gate is connected to the node LAT_X, one end of the current path is connected to the other end of the current path of the transistor 669, and the other end is grounded. In the transistor 667, a signal XIL is applied to the gate, and one end of the current path is connected to the node LAT_X. In the transistor 668, the gate is connected to the node LBUS, one end of the current path is connected to the other end of the current path of the transistor 667, and data DATA_C is input/output to/from the other end.

The latch circuit DAC_DL is used to hold a voltage by a DAC (D/A Converter) value when the memory cell transistor turned on in ramped sensing. In this example, for example, six latch circuits DAC_DL are provided. That is, according to the sense circuit of this example, 6-bit information can be held. As shown in FIG. 29B, the latch circuit DAC_DL includes clocked inverters 671 and 672 and n-channel MOS transistors 673 to 678.

In the inverter 671, the input node is connected to a node INV_DAC, and the output node is connected to a node LAT_DAC. A signal DACLL is applied to the gate of the inverter 671 on the p-channel MOS transistor side, and a signal DACLLn (an inverted signal of DACLL) is applied to the gate on the n-channel MOS transistor side. In the inverter 672, the input node is connected to the node LAT_DAC, and the output node is connected to the INV_DAC. A signal DACLI is applied to the gate of the inverter 672 on the p-channel MOS transistor side, and a signal DACLIn (an inverted signal of DACLI) is applied to the gate on the n-channel MOS transistor side.

In the transistor 677, a signal DOL is applied to the gate, and one end of the current path is connected to the node LBUS. In the transistor 678, the gate is connected to the node LAT_DAC, one end of the current path is connected to the other end of the current path of the transistor 677, and the other end is grounded. In the transistor 675, a signal DACIL is applied to the gate, and one end of the current path is connected to the node LAT_DAC. In the transistor 676, the gate is connected to the node LBUS, one end of the current path is connected to the other end of the current path of the transistor 675, and data DATA_DAC is input/output to/from the other end.

In the transistor 673, a signal DOI is applied to the gate, and one end of the current path is connected to the node LBUS. In the transistor 674, the gate is connected to the node INV_DAC, one end of the current path is connected to the other end of the current path of the transistor 673, and the other end is grounded.

The NAND gate 604 performs a NAND operation between signals LDC and COLDEC and outputs the operation result to the node LBUS.

5.2 Read Operation

Figure 30A:
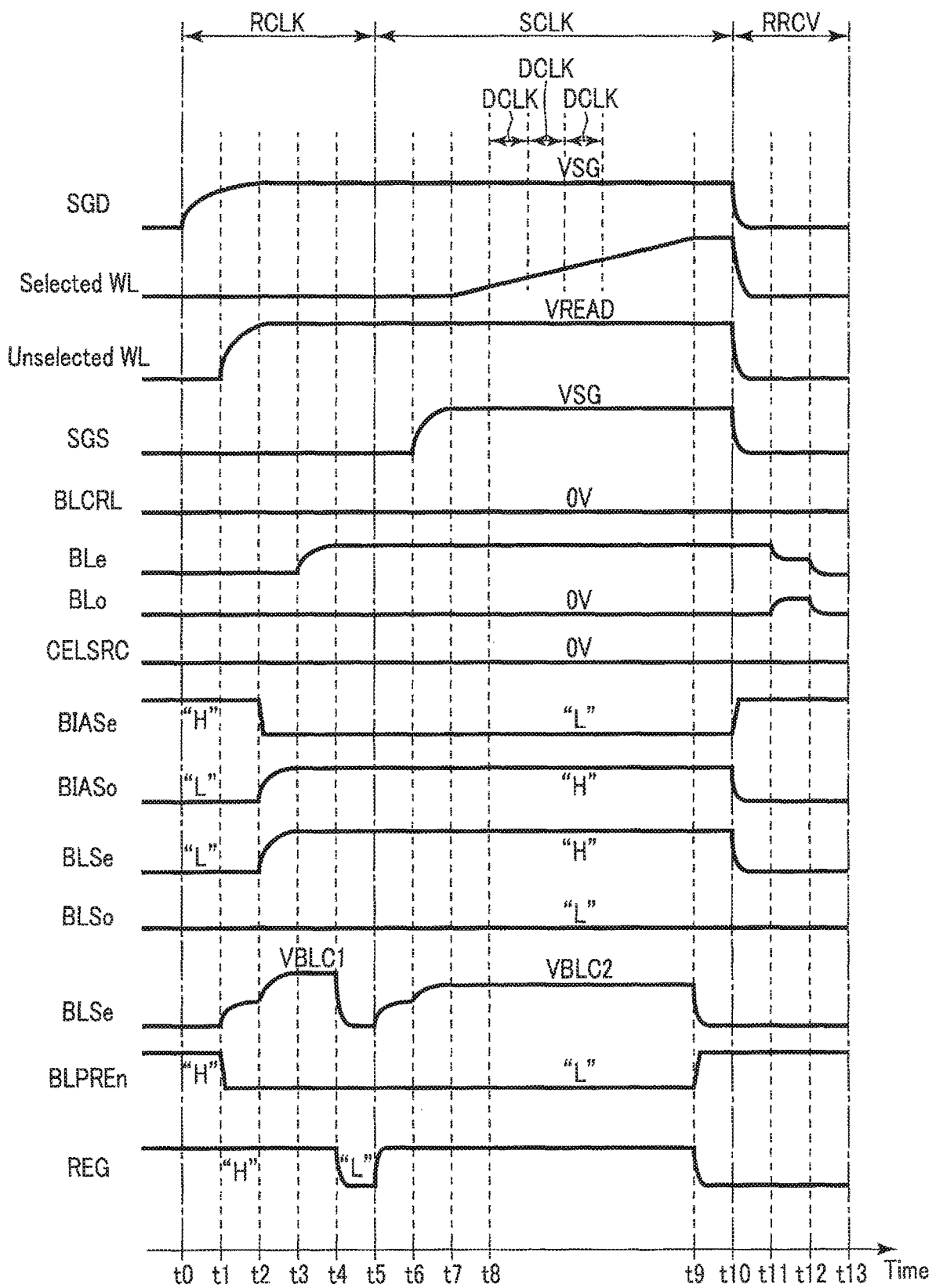

FIG. 30A is a timing chart of various kinds of signals in the sense circuit 10 according to this embodiment. Each signal is given by, for example, a sequencer 170.

As shown in FIG. 30A, at time to, first, a voltage VSG is applied to a selection gate line (SGD) of a selected string unit of a selected block. A selection transistor ST1 is thus set in the ON state. A voltage of 0 V or a non-selection voltage VBB (for example, a negative voltage) is applied to the unselected selection gate lines SGD.

Next, at time t1, setup of the word line WL is performed in the core unit. That is, a row decoder 120 applies a voltage VREAD to unselected word lines.

In addition, the sense amplifier precharges a read target bit line (in the example shown in FIG. 30A, the even-numbered bit line BLe) in advance. More specifically, the signal BLPREn is changed to logic "low" level to turn on the transistor 615, thereby precharging the node SEN with the power supply voltage VDD.

Next, from time t2 to time t3, the bit line selection signals BLSe and BLSo and the bias selection signals BIASe and BIASo are set. In the example of FIG. 30A, since the even-numbered bit line BLe is selected, the potential of the even-numbered bit line selection signal BLSe is set to VBLC1, and the signal BIASo is set to "High" to fix the odd-numbered bit line BLo to BLCRL (=Vss).

In addition, a clamp voltage Vclamp for bit line precharge is applied to the signal BLC, thereby precharging the even-numbered bit line BLe to, for example, 0.7 V.

With the above-described operation, in the core unit, the even-numbered bit line BLe is charged to 0.7 V, and the odd-numbered bit line BLo is fixed to Vss.

Next, at time t4, the signal BLSe is set to 0 V, and the bit line BLe is set in an electrically floating state.

Next, during the period from time t5 to time t7, the potential of the signal BLSe is set to VBLC2 to change the transistor HN2e in the ON state. Furthermore, at time t5, the voltage VSG is applied to a sources-side selection gate line SGS of the selected string unit. A voltage of 0 V or the non-selection voltage VBB (for example, a negative voltage) is applied to the remaining selection gate lines SGS.

In addition, the row decoder 120 continuously raises the voltage of the selected word line WL. Data reading starts from time t8. During a period DCLK shown in FIG. 30A, data is strobed in ascending order of threshold. If the threshold of the memory cell transistor MT is higher than the voltage of the selected word line WL, discharge of the bit line BLe is not performed. If the threshold of the memory cell transistor MT is lower, a read current flows, and the bit line BLe is discharged.

When the data reading is completed at time t9, the voltages of the nodes and signals are reset at time t10.

FIG. 30B is a timing chart showing details of the period DCLK shown in FIG. 30A. FIG. 30B shows the sequences of three periods DCLK1, DCLK2, and DCLK3, and shows, as an example, a case in which the memory cell transistor MT is in the OFF state during the period DCLK1 and in the ON state during the periods DCLK2 and DCLK3.

In FIG. 29A, before the sequence of the period DCLK starts, the latch circuit SDL first sets the nodes LAT_S and INV_S to "H" level and "L" level, respectively. This is performed by setting the signals STI and SOC to "H" level to discharge the node INV_S. The latch circuit SDL is a data latch that changes the node LAT_S to "H" level when the memory cell transistor MT is in the OFF state and changes the node LAT_S to "L" level when the memory cell transistor MT is in the ON state, The node LAT_S has the same polarity as the potential of the node SEN.

In addition, the latch circuit DDL sets the node LAT_D to "L" level. This is performed by setting the signals DTL and SOC to "H" level to discharge the node LAT_D. In the latch circuit DDL, the node LAT_D holds "L" level during the OFF state of the memory cell transistor MT. Once the memory cell transistor MT is turned on, the node LAT_D holds "H" level.

As the result of the above-described operation, the node SBUS is also set to "L" level. The signal BLQ is always set at "L" level during the period DCLK. The signal LSSW is always at "H" level, and the transistor 654 transfers the potential of the node SBUS to the node LBUS.

As shown in FIG. 30B, during the period DCLK, the signals DACLI and DACLIn are always at "L" level and "H" level, respectively. The signals DOI and DOL are also always at "L" level. The nodes LAT_DAC and INV_DAC of the latch circuit DAC_DL are set to "L" level and "H" level, respectively. This setting is performed by setting the node LBUS to "H" level, the signal DACIL to "H" level, and the data DATA_DAC to "L" level before the sequence of the period DCLK starts. The six latch circuits DAC_DL<5:0> hold information representing in which strobe operation the memory cell transistor MT is turned on.

As described above, a state in which the memory cell transistor MT is OFF is shown in the period DCLK1. Referring to FIG. 29A, when the memory cell transistor MT is in the OFF state, the node SEN maintains a high potential. Hence, even when the signal STBn changes to "L" level at time t8, the transistor 618 is not turned on, the node INV_S holds "L" level, and the node LAT_S holds "H" level. Hence, even when the signal SPCn changes to "L" level at time t8-02, the transistor 630 does not become conductive, the node SBUS holds "L" level. In addition, even when the signal DTI changes to "H" level at time t8-04, since the node SBUS is at "L" level, the transistor 643 does not change to the ON state, and the nodes INV_D and LAT_D hold "H" level and "L" level, respectively. Even when the signal SDC changes to "H" level at time t8-06, since the node SBUS is at "L" level, the potential of the node LBUS does not change.

Additionally, in FIG. 30B, at time t8-02, the signals DACLL and DACLLn are set to "H" level and "L" level, respectively, and the output of the clocked inverter 671 is set in a high impedance state. Next, at time t8-04, the signal DACIL is set to "H" level. However, since the nodes LBUS and SBUS are at "L" level, the transistor 676 does not change to the ON state, and all the nodes LAT_DAC of the latch circuits DAC_DL<5:0> hold "L" level.

Next, a state in which the memory cell transistor MT is turned on for the first time is shown in the period DCLK2. Referring to FIG. 29A, when the memory cell transistor MT is set in the ON state, the node SEN has a low potential. Hence, when the signal STBn is set to "L" level at time t8-1, the transistor 618 turned on. As a result, the node INV_S changes from "L" level to "H" level, and the node LAT_S changes from "H" level to "L" level. Hence, when the signal SPCn is set to "L" level at time t8-12, the transistors 630, 631, and 632 turn on, and the node SBUS changes from "L" level to "H" level. Subsequently, when the signal DTI is set to "H" level at time t8-14, since the node SBUS is at "H" level, the transistors 643 and 644 turn on, and the nodes INV_D and LAT_D change from "H" level to "L" level and from "L" level to "H" level, respectively. When the signal SDC changes to "H" level at time t8-16, the node SBUS changes from "H" level to "L" level and returns to the potential at the start of the period DCLK1.

In the above-described way, the potential of the node SBUS is returned to the initial potential while changing the data in the latch circuits SDL and DDL.

In FIG. 30B, at time t8-12, the signals DACLL and DACLLn are set to "H" level and "L" level, respectively, and the output of the clocked inverter 671 is set in a high impedance state. Next, when the signal DACIL is set to "H" level at time t8-14, since the nodes LBUS and SBUS are at "H" level, the transistor 676 turns on, and the nodes LAT_DAC of the latch circuits DAC_DL<5:0> change the data DATA_DAC<5:0> and hold them.

Next, a state in which the memory cell transistor MT has already been turned on at the preceding strobe timing is shown in the period DCLK3.

Referring to FIG. 29A, when the memory cell transistor MT is in the ON state, the node SEN has a low potential. Hence, when the signal STBn changes to "L" level at time t8-2, the transistor 618 turns on. Hence, the node INV_S changes from "L" level to "H" level, and the node LAT_S changes from "H" level to "L" level. However, even when the signal SPCn changes to "L" level at time t8-22, since the node LAT_D is at "H" level, the transistor 631 does not turn on, and the node SBUS maintains "L" level. Subsequently, even when the signal DTI is set to "H" level at time t8-24, since the node SBUS is at "L" level, and the node INV_D is also at "L" level, the nodes INV_D and LAT_D hold "L" level and "H" level, respectively, even if the transistors 643 and 644 turn on. Next, when the signal SDC is set to "H" level at time t8-26, the node SBUS holds "L" level and returns to the potential at the start of the period DCLK1. Note that from time t8-21 to time t8-26, the nodes SBUS and LBUS are in the floating state and hold "L" level.

In the above-described way, the potential of the node SBUS is returned to the initial potential while changing the data in the latch circuit DDL. In addition, even if the latch circuit SDL erroneously senses that the memory cell transistor is in the OFF state, the latch circuit DDL holds the data of the previous time (in this example, in the period DCLK2).

In FIG. 30B, at time t8-22, the signals DACLL and DACLLn are set to "H" level and "L" level, respectively, and the output of the clocked inverter 671 is set in a high impedance state. Next, when the signal DACIL is set to "H" level at time t8-24, since the nodes LBUS and SBUS are at "L" level, the transistor 676 does not turn on, and the nodes LAT_DAC of the latch circuits DAC_DL<5:0> hold the data of the previous time (here, in the period DCLK2).

With the above-described operation, from the period DCLK3, the latch circuits DAC_DL<5:0> continuously hold the data DATA_DAC<5:0> (Data(i+1)) in the period DCLK2 (when the memory cell transistor MT is turned on for the first time).

Figures 30C, 30D:
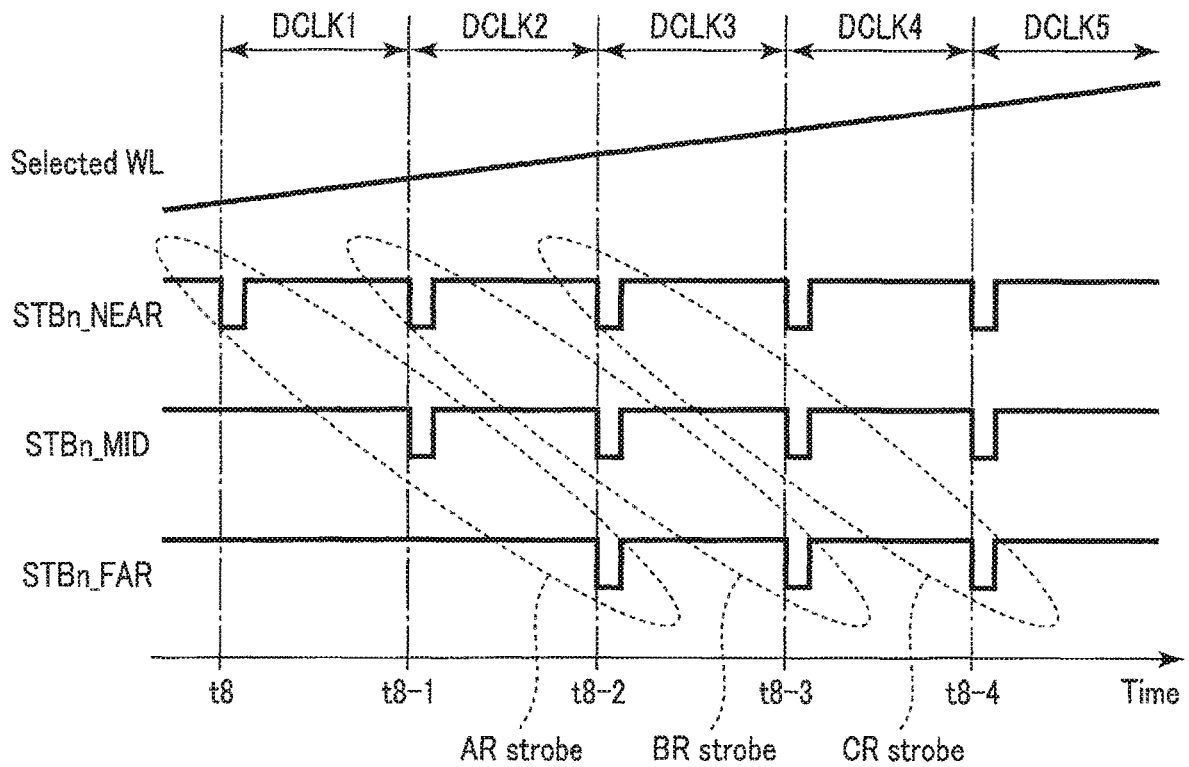

In the above-described way, every time the voltage of the selected word line WL reaches a predetermined potential, the signal STBn is asserted, and data is strobed, thereby reading 6-bit data. FIG. 30C shows this state. As shown in FIG. 30C, data from "000000" to "111111" can be read by 64 strobe processes.

Note that in this embodiment as well, the strobe timing can be shifted in accordance with the column address (group GP), as in the first embodiment. FIG. 30D shows this state. As shown in FIG. 30D, signals for groups GP1, GP2, and GP3 are prepared as the signals STBn. A signal STBn_MID for the group GP2 is generated by, for example, delaying a signal STBn_NEAR for the group GP1. In addition, a signal STBn_FAR for the group GP3 is generated by, for example, the signal STBn_MID for the group GP2. As the signal generation method, various methods described in the above embodiments can be applied. For example, the generation circuit can be arranged at the same position as an STB generation circuit 180.

Note that in the example shown in FIG. 30D, the delay time is a period corresponding to one cycle of the period DCLK. For example, the delay time need only be an integer multiple of the period DCLK. FIG. 30E shows an example in which the signals are delayed by a period corresponding to two cycles of the period DCLK.

Additionally, although FIGS. 30D and 30E show only the signals STBn, the signals DTI, SDC, DACIL, and DACLL are also generated for each column address (group GP). That is, signals DTI_MID, SDC_MID, DACIL_MID, and DACLL_MID for the group GP2 are generated by delaying signals DTI_NEAR, SDC_NEAR, DACIL_NEAR, and DACLL_NEAR for the group GP1. In addition, signals DTI_FAR, SDC_FAR, DACIL_FAR, and DACLL_FAR for the group GP3 are generated by delaying the signals DTI_MID, SDC_MID, DACIL_MID, and DACLL_MID for the group GP2. The delay amount of these signals is the same as the signals STBn.

5.3 Effect According to this Embodiment

As described above, as the sense amplifier 140 according to the first to fourth embodiments, a voltage sensing type as described in this embodiment can be used.

6. Sixth Embodiment

A semiconductor memory device according to the sixth embodiment will be described next. This embodiment shows detailed examples of the planar layout and the sectional arrangement according to the first to fifth embodiments. Only points different from the first to fifth embodiments will be described below.

6.1 Arrangement of NAND Flash Memory 100

FIG. 31 shows the planar layout of a memory cell array 110 and a driver circuit 130. As shown in FIG. 31, the memory cell array 110 includes, for example, four logical planes LP (LP0 to LP3) arranged in the X direction. The logical plane LP is a logical access unit to the memory cell array 110. It is also possible to simultaneously access a plurality of logical planes LP.

Each logical plane LP includes, for example, four mats MAT arranged along the Y direction orthogonal to the X direction. Hence, in the example shown in FIG. 31, the memory cell array 110 includes (4×4) mats MAT on the X-Y plane. The mat MAT is the minimum pattern of the layout of memory cell transistors, contact plugs, and interconnects in the memory cell array 110 in the Y direction. That is, in the memory cell array 110, the pattern in the mat MAT is repetitively arranged in the X and Y directions.

Each mat MAT includes, for example, four cell regions, two lanes C, and three lanes R. The four cell regions are arranged along the X direction. The lanes C are provided along the X direction between the first cell region and the second cell region and between the third cell region and the fourth cell region. The first cell region, the second and third cell regions, and the fourth cell region are regions where memory cell transistors MT are actually formed. The three regions will sometimes be referred to as physical planes. The lanes C are connecting portions associated with interconnects related to the column such as bit lines BL. The lanes R are provided to be adjacent to the three physical planes in the Y direction. The lanes R are connecting portions associated with interconnects related to the row such as word lines and signal lines CG.

Figure 32:
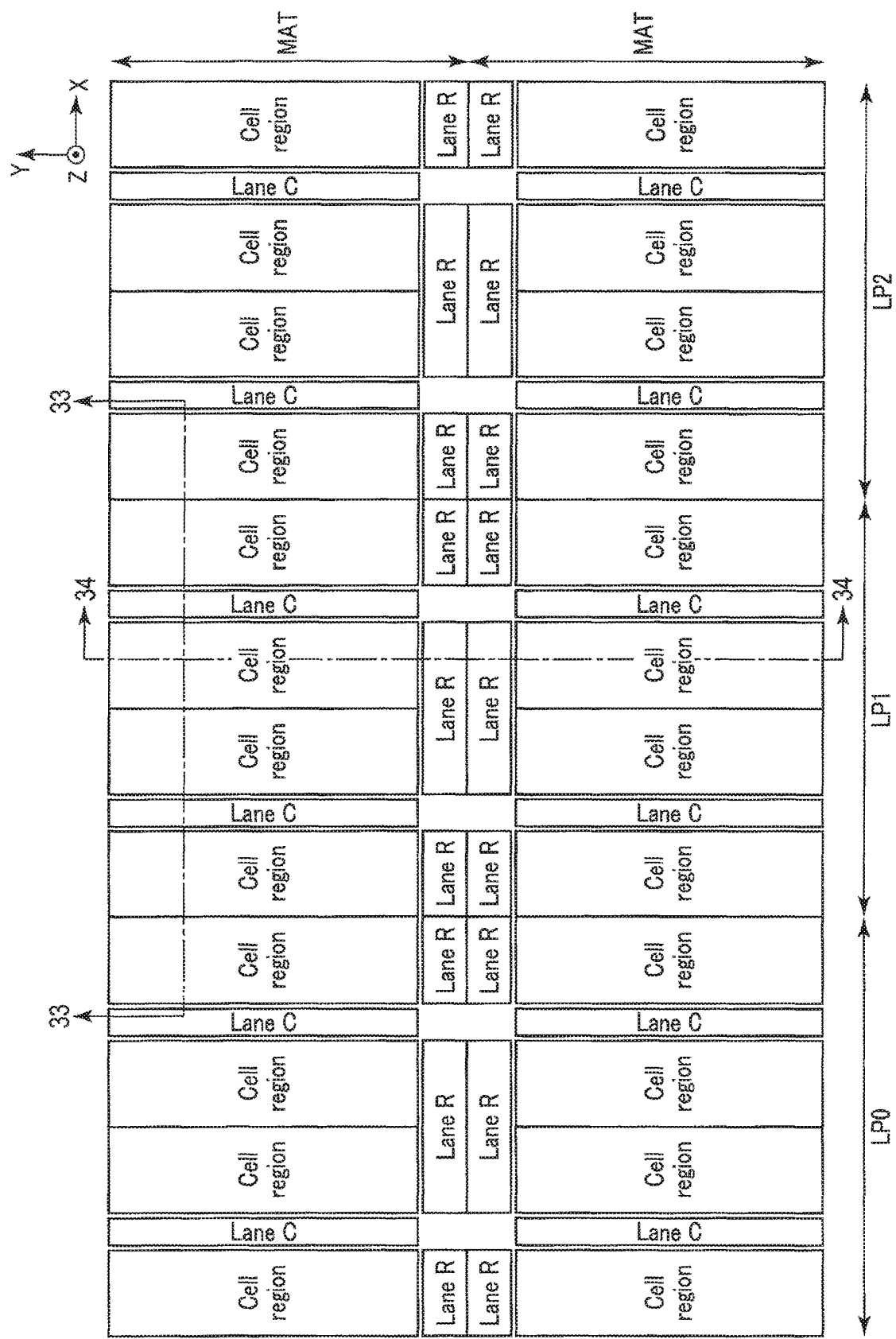
FIG. 32 is an upper surface layout diagram of the memory cell array according to the sixth embodiment.

Note that a symbol "P" added to each mat MAT in FIG. 31 represents the direction of the pattern of the mat MAT. Hence, on the sheet surface of FIG. 31, the four mats MAT arranged in the X direction on the uppermost stage and the four mats MAT on the second stage which are adjacent to those on the uppermost stage in the Y direction have almost linearly symmetric patterns with respect to the X-axis. The patterns of the mats MAT on the second stage and the mats MAT on the third stage are also almost linearly symmetric with respect to the X-axis. This also applies to the patterns of the mats MAT on the third stage and the mats MAT on the fourth stage. FIG. 32 shows this state. FIG. 32 shows a region R1 in FIG. 31 in detail. As shown in FIG. 32, in the region R1, the lanes R of two mats MAT arranged in the Y direction are adjacent to each other. In addition, the cell regions of two mats MAT arranged in the X direction are adjacent to each other.

Figure 34:
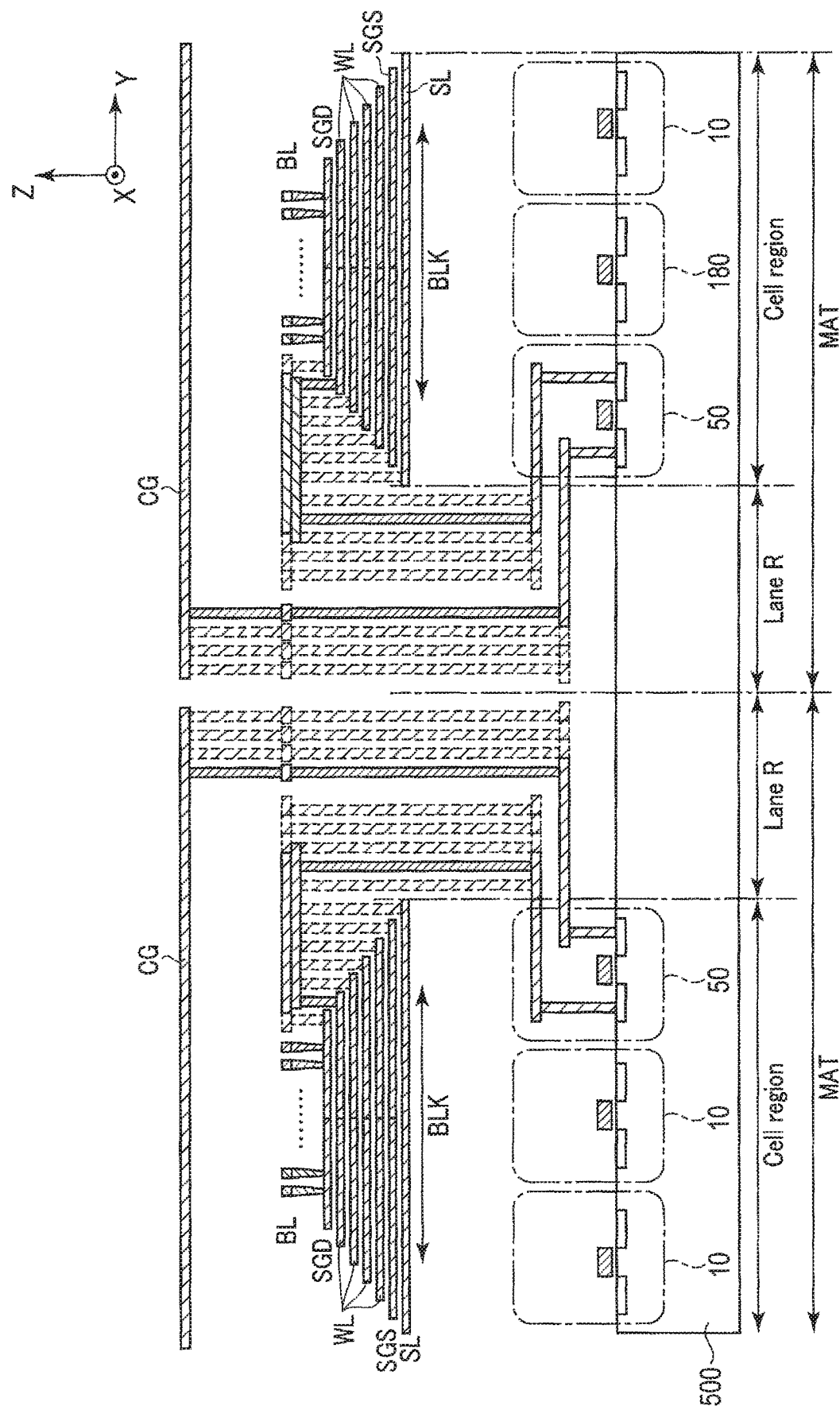

FIGS. 33 and 34 are sectional views taken along a line 33-33 and a line 34-34 in FIG. 32, respectively, and schematically show the arrangements of the cell regions, lanes C, and lanes R and the arrangements of regions immediately under them. More detailed arrangements will be described later.

As shown in FIGS. 33 and 34, in each cell region for example, a polysilicon layer functioning as a selection gate line SGD is stacked. A plurality of, for example, polysilicon layers functioning as word lines WL are stacked under the selection gate line SGD. For example, a polysilicon layer functioning as a selection gate line SGS is stacked under the word lines WL. A laminated structure including, for example, a polysilicon layer on the upper side and a tungsten silicide layer on the lower side, which functions as a source line SL, is formed under the selection gate line SGS. The source line SL is a common node in the physical planes and has a plate shape in each physical plane. Insulating films (not shown) are provided between the layers. The word lines WL are separated into a plurality of regions by slits along the Y direction, and each region becomes a block BLK (see FIG. 33). In each block BLK, a charge accumulation layer (not shown), a silicon pillar in which a channel is formed, and the like are provided. These form the memory cell transistor MT.

Above the cell regions and the lanes C, a plurality of metal interconnect layers along the X direction are provided in parallel across the plurality of mats MAT. These metal interconnection layers function as the bit lines BL. In addition, above the bit lines BL, a plurality of metal interconnect layers along the Y direction are provided in parallel. These metal interconnect layers function as the signal lines CG.

Under each cell region, a sense circuit 10, an STB generation circuit 180, and a transistor 50 are formed on a semiconductor substrate 500. The bit line BL above the cell region is connected to the sense circuit 10 on the semiconductor substrate 500 via a contact plug formed in the lane C (see FIG. 33). In addition, a contact plug connected to each signal line CG and a contact plug connected to each word line WL are formed in the lane R, and these are connected to the transistor 50 on the semiconductor substrate 500. Similarly, the selection gate lines SGD and SGS and control signal lines SGDD and SGSD of these lines are also connected to transistors (not shown) on the semiconductor substrate 500. In addition, a contact plug that connects the source lines SL between the adjacent mats MAT and a metal interconnect layer (not shown) along the Y direction are formed.

As described above, the lane C functions as a hook-up region configured to connect the bit line BL to the circuit provided in the region immediately under the cell region. The lane R functions as a hook-up region configured to connect the word line WL and the signal line CG to the circuit provided in the region immediately under the cell region, connect the selection gate lines SGD and SGS and the control signal lines SGDD and SGSD to the circuit provided in the region immediately under the cell region, and connect the source lines SL between the adjacent mats MAT. Note that although, for example, a one-layer structure is shown as the selection gate lines SGD and SGS, a plurality of layers may be included.

Figure 35:
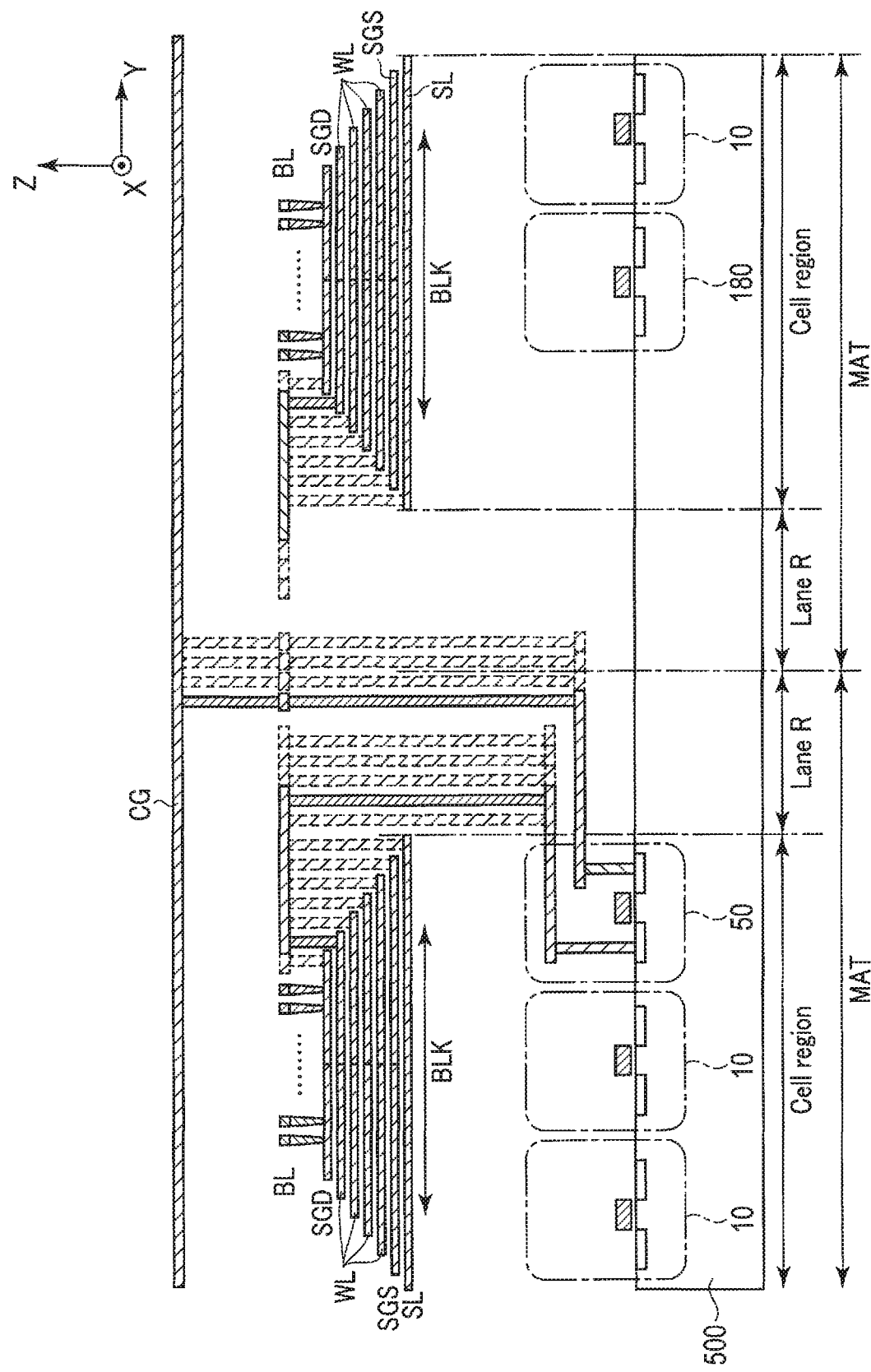

Note that the arrangement of the lane R may be not the arrangement described with reference to FIG. 34 but the arrangement shown in FIG. 35. That is, in the example of FIG. 34, the contact plugs connected to the signal lines CG are formed in each of the lanes R of the two mats MAT adjacent to each other in the Y direction. On the other hand, in the arrangement shown in FIG. 35, the transistors 50 of the adjacent mats MAT share the source region and also share the contact plugs that connect the source region and the signal lines CG. Additionally, in this example, between the adjacent mats MAT, the word lines WL located in the same layer are electrically connected each other by, for example, a metal interconnect layer on the further upper layer. That is, in the example shown in FIG. 35, the word line WL of the lowermost layer in the mat MAT on the left side is electrically connected to the word line WL of lowermost layer in the mat MAT on the right side. This also applies to the word lines WL of the second and subsequent layers. This also applies to the source lines SL, and between the adjacent mats MAT, the source lines SL are electrically connected by, for example, a metal interconnect layer on the further upper layer. A case shown in FIG. 35 will be described below as an example.

Figure 36A:
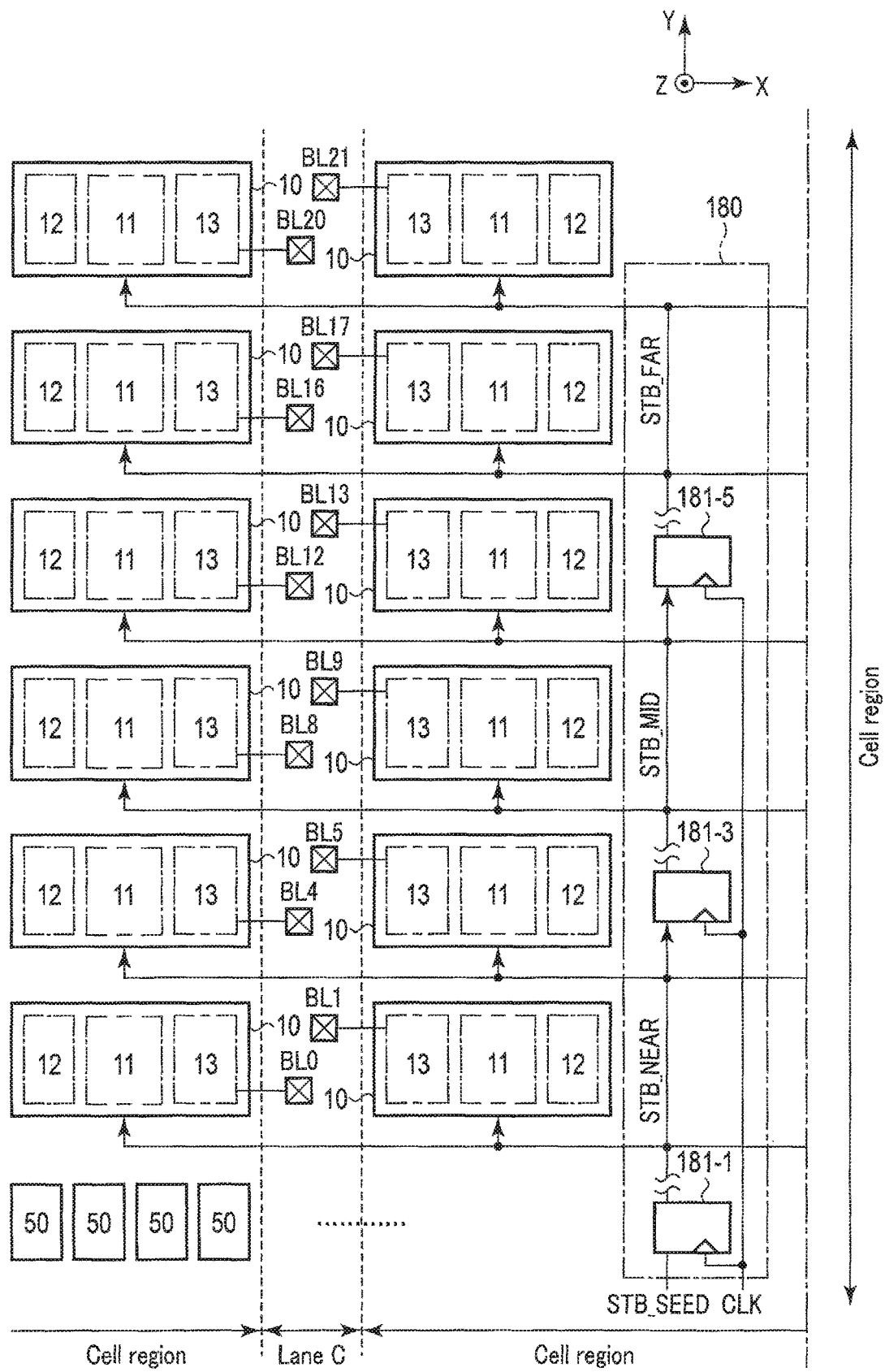
FIG. 36A and FIG. 36B are layout diagrams of the region under the memory cell array according to the sixth embodiment.
Figure 36B:
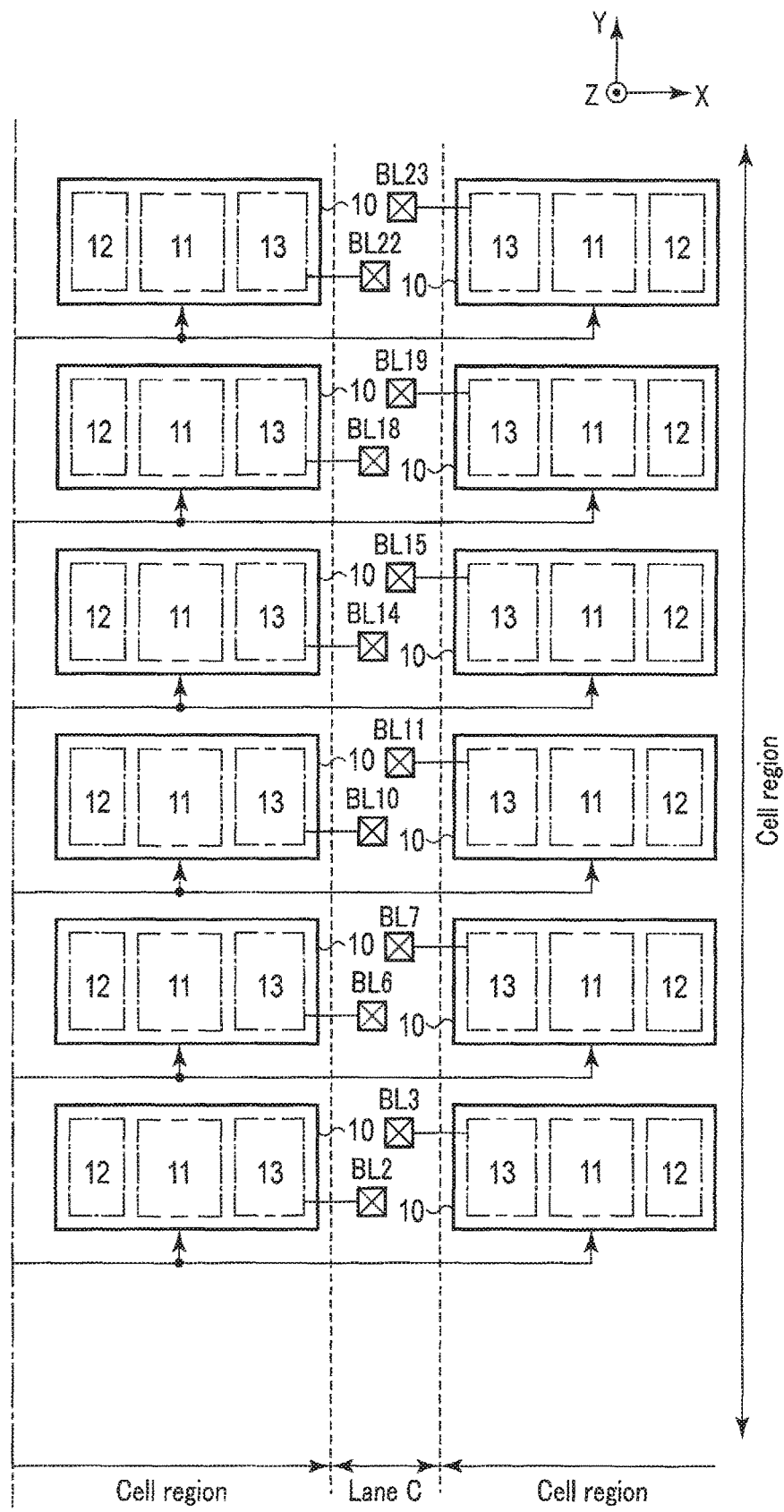

FIGS. 36A and 36B show the layout of the sense circuits 10, the STB generation circuit 180, and the transistors 50 formed on the semiconductor substrate 500 immediately under the cell regions and the lanes C in one mat MAT. The dot dashed line on the right side of the sheet surface of FIG. 36A and the dot dashed line on the left side of the sheet surface of FIG. 36B represent the same position. Additionally, for the descriptive convenience, FIG. 36A and FIG. 36B shows a case in which 24 bit lines BL (BL0 to BL23) exist, the bit lines BL0 to BL7 belong to a group GP1, the bit lines BL8 to BL15 belong to a group GP2, and the bit lines BL16 to BL23 belong to a group GP3.

In the example shown in FIGS. 36A and 36B, the 24 bit lines BL0 to BL23 (not shown) along the X direction are provided above the cell regions. In correspondence with the bit lines BL0 to BL23, 24 sense circuits 10 are formed in a matrix on the semiconductor substrate 500. The sense circuits 10 are connected to the corresponding bit lines BL via contact plugs provided in the lanes C.

In this example, four sense circuits 10 are arranged along the X direction. Of the sense circuits 10, two sense circuits 10 are connected to the bit lines BL via the contact plugs in one lane C of the two lanes C included in the mat MAT, and the remaining two sense circuits 10 are connected to the bit lines BL via the contact plugs in the other lane C.

In addition, the STB generation circuit 180 is arranged in the region between the two columns of sense circuits 10 provided immediately under the cell regions between the two lanes C. A signal STB_NEAR is supplied to the sense circuits 10 corresponding to the bit lines BL0 to BL7, a signal STB_MID is supplied to the sense circuits 10 corresponding to the bit lines BL8 to BL15, and a signal STB_FAR is supplied to the sense circuits 10 corresponding to the bit lines BL16 to BL23.

Furthermore, the plurality of transistors 50 are arranged side by side in the X direction so as to be adjacent to the 24 sense circuits 10 in the Y direction.

Figure 37:
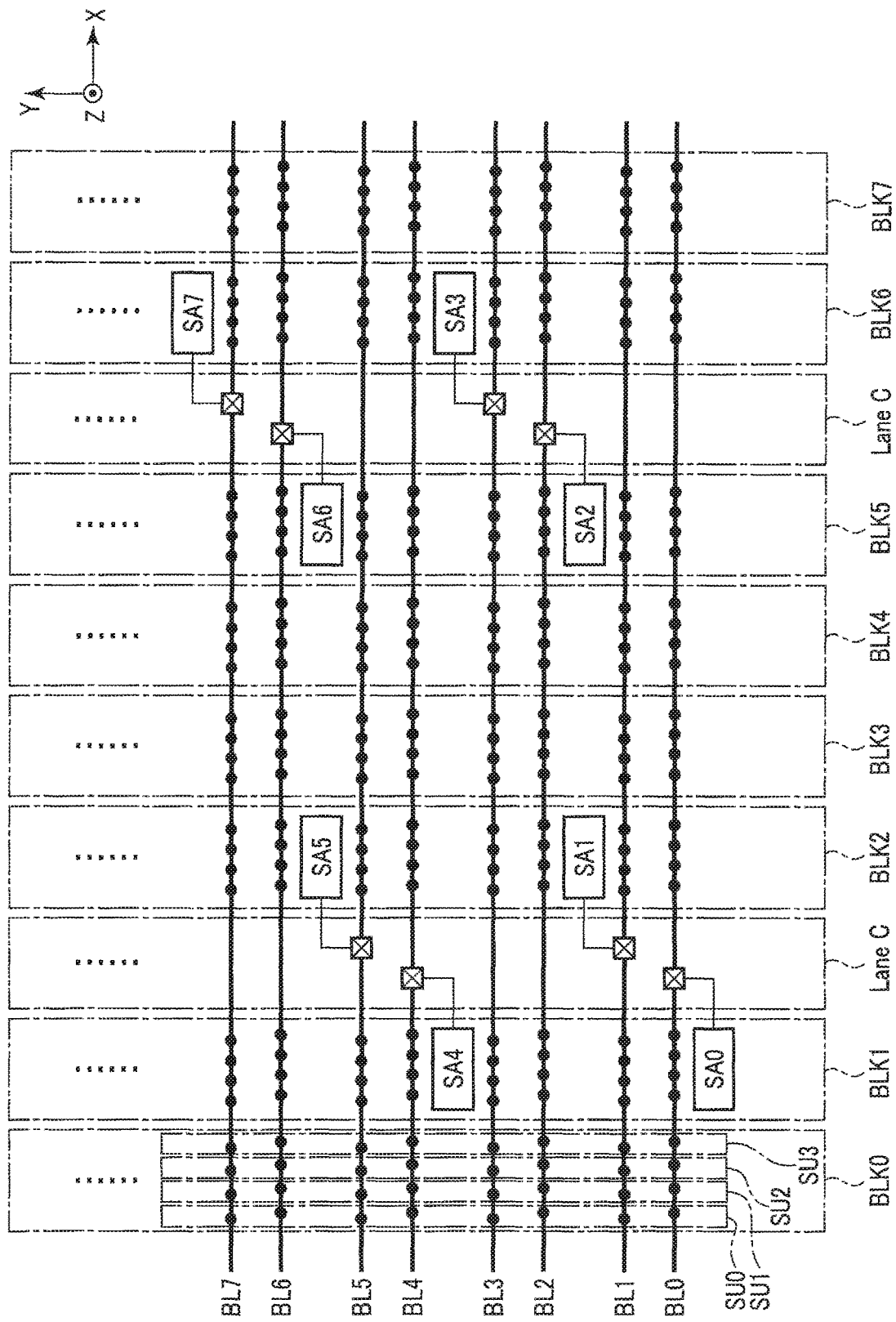
FIG. 37 is a layout diagram showing the connection relationship between bit lines and sense amplifiers according to the sixth embodiment.

FIG. 37 shows the same region as in FIGS. 36A and 36B, and particularly shows the relationships between the bit lines BL, sense amplifier units SA and between the lanes C and the blocks BLK. FIG. 37 shows an example in which one mat MAT includes eight blocks BLK0 to BLK7.

As shown in FIG. 37, of the four continuous bit lines BL (for example, BL0 to BL3), the bit lines BL (for example, BL0 and BL1) of one set are connected to the sense amplifier units SA (SA0 and SA1) in one lane C. The two sense amplifier units SA are arranged to be linearly symmetrical across the lane C (see FIGS. 36A and 36B). More specifically, for example, the sense amplifier unit SA0 is provided on the left side of the lane C in the example shown in FIG. 37, and the sense amplifier unit SA1 is provided on the right side of the lane C. Additionally, the bit lines BL (for example, BL2 and BL3) of the other set are connected to the sense amplifier units SA (SA2 and SA3) in the other lane C. The two sense amplifier units SA are also arranged to be linearly symmetrical across the lane C. More specifically, for example, the sense amplifier unit SA2 is provided on the left side of the lane C, and the sense amplifier unit SA3 is provided on the right side of the lane C. The four sense circuits 10 (SA0 to SA3) are arranged in a row in the X direction, as described with reference to FIGS. 36A and 36B.

With this arrangement, one sense amplifier unit SA can be provided for every four bit lines in the Y direction (since the four sense amplifier units SA are provided in the X direction). Hence, the pitch (minimum design dimension) of interconnects related to the sense amplifier unit SAs immediately under the cell regions can be relaxed to four times of the pitch required for the bit lines BL.

The arrangement in the mat MAT will be described next in detail. FIG. 38 is a sectional view of the mat MAT and shows the typical arrangements of the cell region, the lane R or C, and the region immediately under the cell region.

As shown in FIG. 38, semiconductor elements included in the sense circuit 10 and the STB generation circuit 180 and the transistor 50 are formed on the semiconductor substrate 500. In addition, an interlayer dielectric film 501 is formed on the semiconductor substrate 500 so as to cover these elements, and the memory cell array 110 is formed on the interlayer dielectric film 501. Two metal interconnect layers (interconnects M0 and M1 under the cell) are formed in the interlayer dielectric film 501 immediately under the memory cell array 110. The interconnect M1 is formed above the interconnects M0. The interconnects M0 and M1 electrically connect the circuits formed in the region immediately under the memory cell array, and also electrically connect the memory cell array 110. Each interconnect M0 and the semiconductor substrate 500 or a gate are connected by a contact plug CS. In addition, the interconnects M0 and M1 are connected each other by a contact plug V1.

The memory cell array 110 is formed on the interlayer dielectric film 501. In the cell region, a conductive layer (a polysilicon layer or a metal layer) functioning as the source line SL is formed on the interlayer dielectric film 501, and a silicon pillar MH that becomes the current path of a NAND cell (a region where the channels of the memory cell transistor MT and selection transistors ST1 and ST2 are formed) is formed on the source line SL. A plurality of conductive layers (polysilicon layers) functioning as the selection gate line SGS, the word lines WL, and the selection gate line SGD are further formed on an insulating film on the source line SL. In addition, a charge accumulation layer is formed between the silicon pillar MH and each of the selection gate line SGS and the word lines WL so as to surround the silicon pillar MH. The charge accumulation layer is a floating gate electrode FG formed by, for example, a conductive layer (polysilicon layer or the like). A gate insulating film is provided between the silicon pillar MH and the floating gate electrodes FG. In addition, a block insulating film is provided between the floating gate electrode FG and a selection gate SGS and the word lines WL.

An end of each of the selection gate line SGS, the word lines WL, and the selection gate line SGD has a step shape. That is, the ends of the selection gate line SGS and the word lines WL are processes so as not to overlap the word lines WL or the selection gate line SGD in the upper layer. In this region, contact plugs CC are formed on the selection gate lines SGS and SGD and the word line WLs.

In the lane R or C, a contact plug C0 connected to the interconnect M1 is formed in an interlayer dielectric film 502.

Contact plugs C1 are formed on the silicon pillar MH and the contact plugs CC, and the interlayer dielectric film 502 is further formed to cover the above-described components.

An interlayer dielectric film 503 is formed on the interlayer dielectric film 502. Two metal interconnect layers (interconnects D1 and D2 on the cell) are formed in the interlayer dielectric film 503. The interconnect D2 is formed above the interconnects D1. The interconnects D2 and D1 electrically connect the memory cell array 110 to a row decoder 120 and a sense amplifier 140.

In the cell region, the interconnects D1 connected to the contact plugs C1 are formed on the interlayer dielectric film 502, and these functions as the selection gate lines SGD and SGS, the word lines WL, the bit line BL, and the source line SL. In addition, the interconnect D2 is connected to the interconnect D1 by a contact plug C2.

Figure 39A:
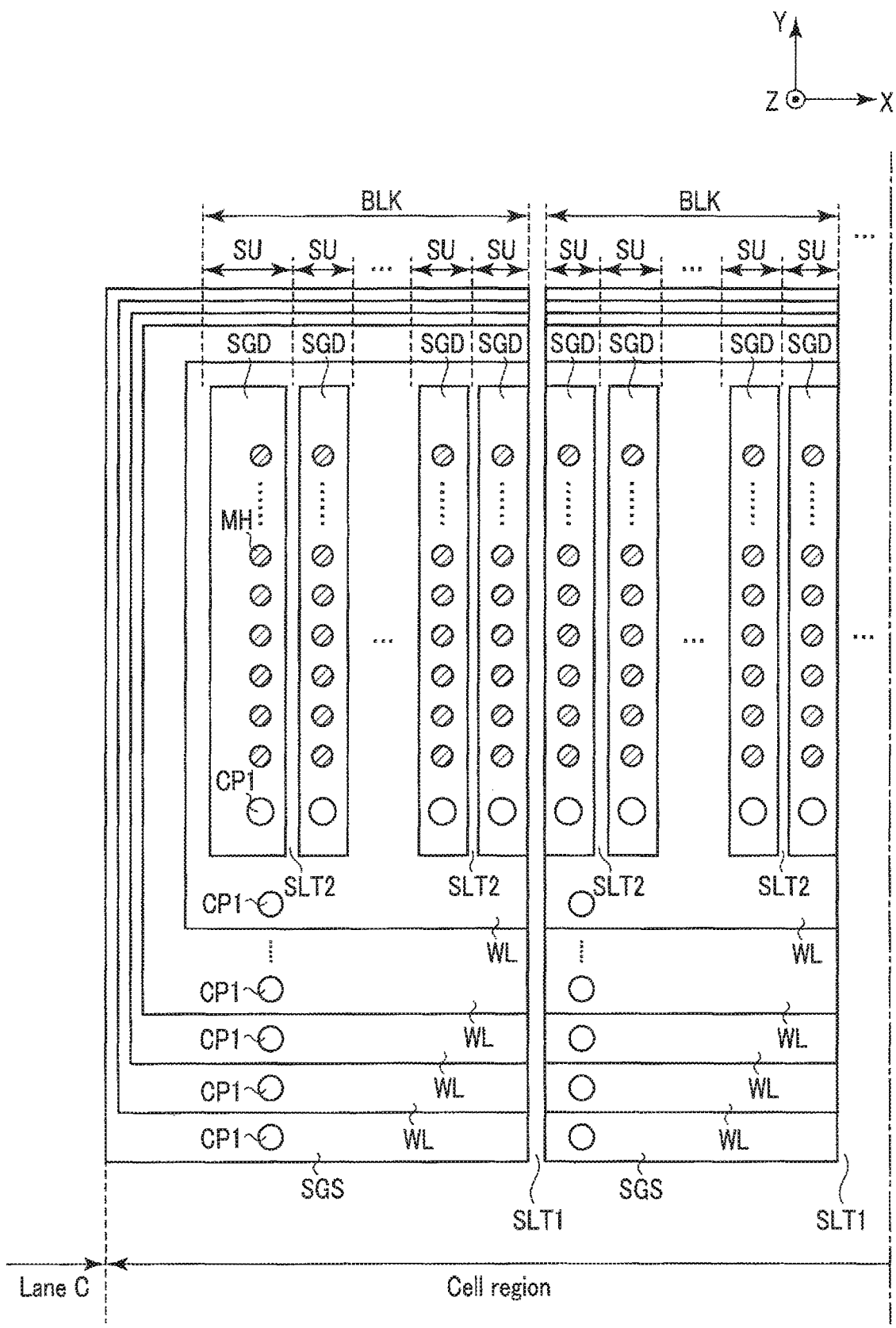
FIG. 39A and FIG. 39B are plan views of the memory cell array according to the sixth embodiment.
Figure 39B:
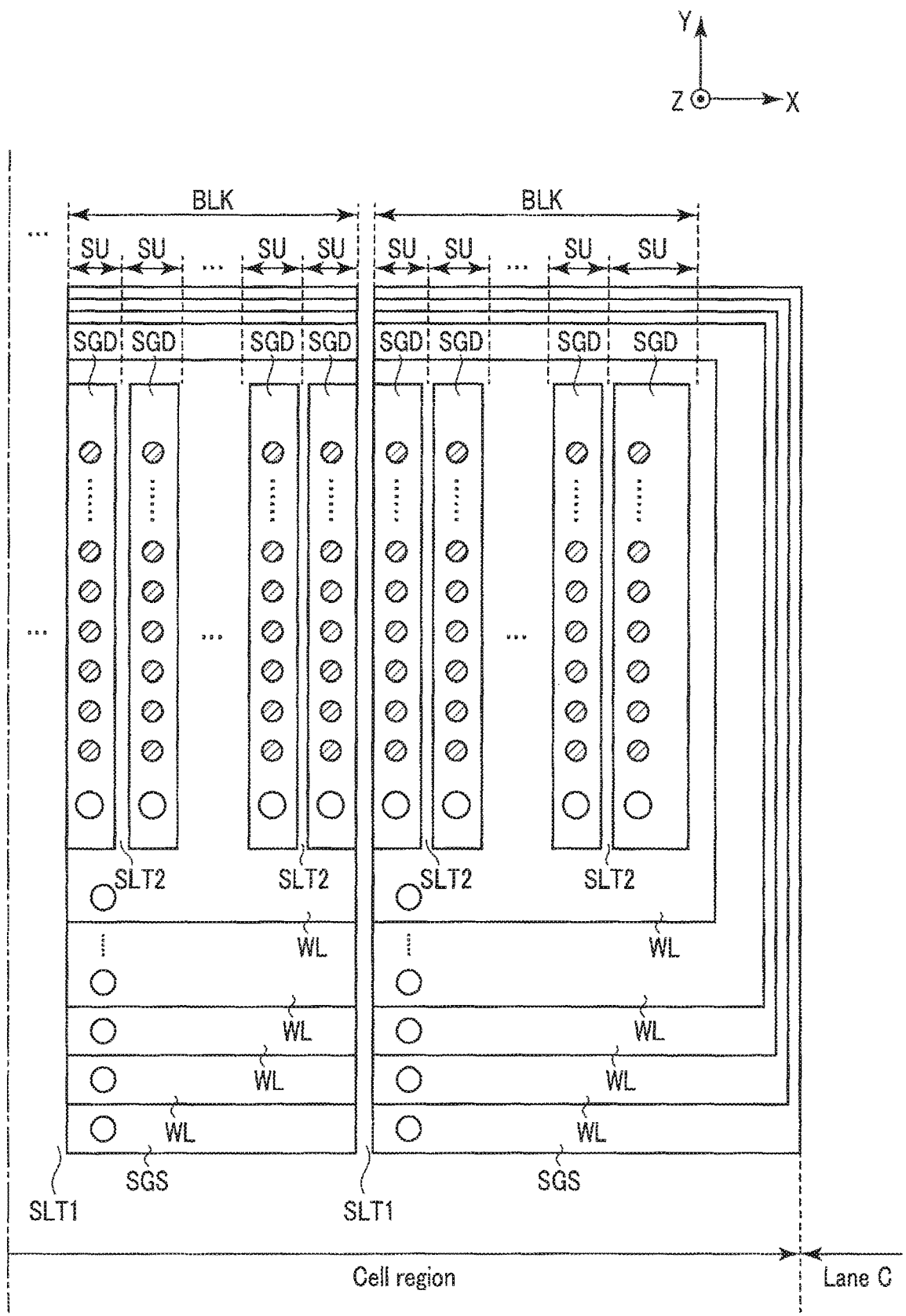

Detailed layouts in the cell region, the lane R, the lane C, and the region immediately under the cell region will be described next with reference to FIGS. 39A, 39B, 40A, 40B, 41, 42A, 42B, 43, 44, 45A, 45B, 46A, 46B, 47A, 47B, 48A, 48B, and 49. FIGS. 39A and 39B are layout diagrams of the cell region between the two lanes C in one mat MAT. In particular, FIGS. 39A and 39B show the planar pattern of the word lines and the selection gate lines SGS and SGD (the arrangement on the X-Y plane). The dot dashed line on the right side of the sheet surface of FIG. 39A and the dot dashed line on the left side of the sheet surface of FIG. 39B represent the same position.

As shown in FIGS. 39A and 39B, interconnect layers functioning as the selection gates SGS and SGD and the word lines WL each have a plate shape spreading on the X-Y plane. As described above, these interconnect layers overlap each other, and the area of an upper layer is larger. Hence, the interconnect layers adjacent to each other along the Z-axis have regions that do not overlap. Contact plugs CP1 are formed at ends of the interconnect layers along the Y-axis on the regions that do not overlap. The contact plugs CP1 correspond to the contact plugs CC and C1 described with reference to FIG. 38.

Additionally, slits SLT1 along the Y-axis direction are provided in the cell region. The slits SLT1 separate the set of interconnect layers in the X direction, and each region between the slits SLT1 is one block BLK. In the block BLK as well, slits SLT2 along the Y-axis direction are provided. The slits SLT2 separate the interconnect layers functioning as the selection gate lines SGD in the X direction, and each region between the slits SLT2 is one string unit SU. In the example shown in FIGS. 39A and 39B, the plurality of silicon pillars MH are arranged in a row along the Y-axis direction in each string unit SU.

Figure 40A:
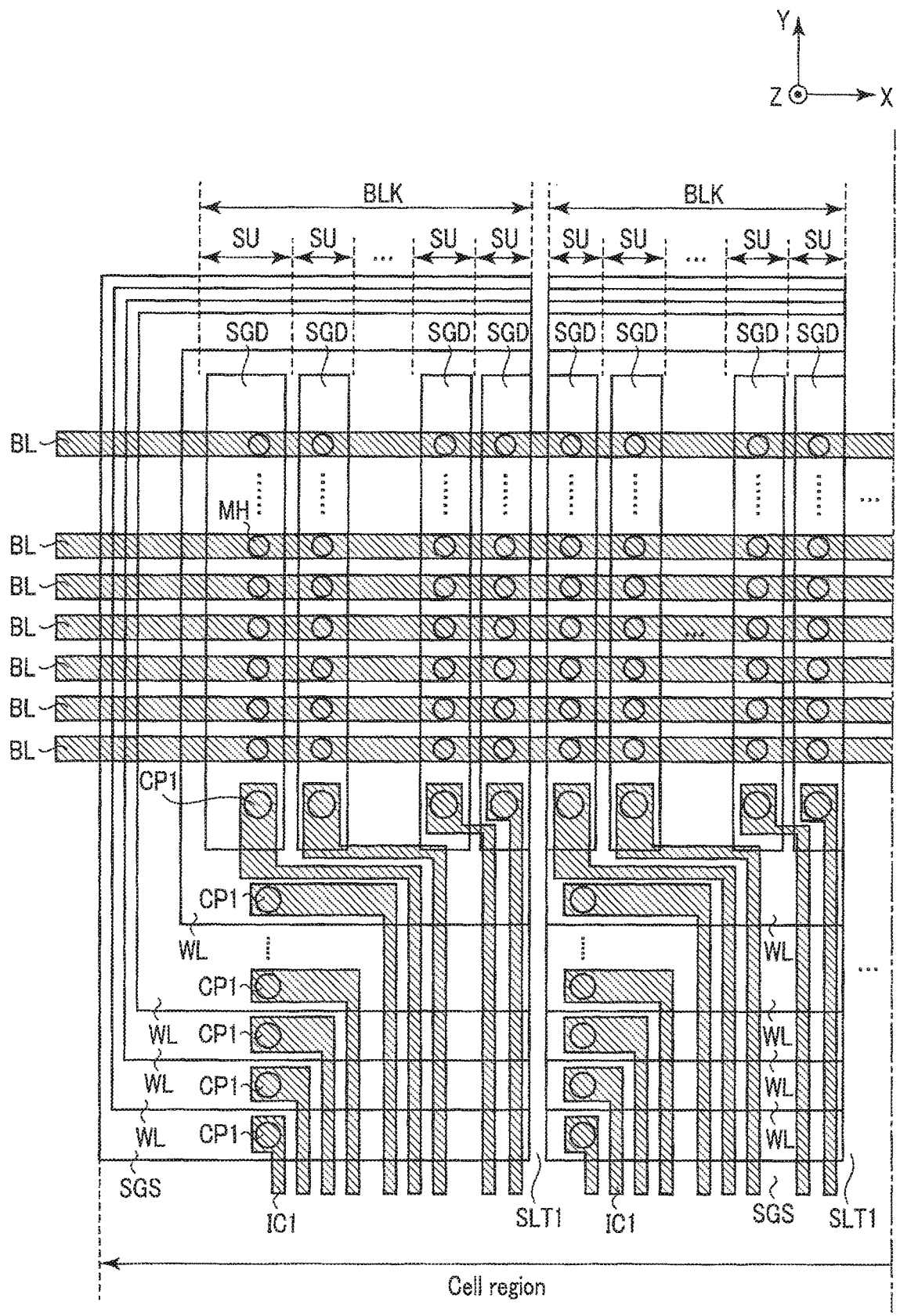
FIG. 40A and FIG. 40B are layout diagrams of the interconnect D1 above the memory cell array according to the sixth embodiment.
Figure 40B:
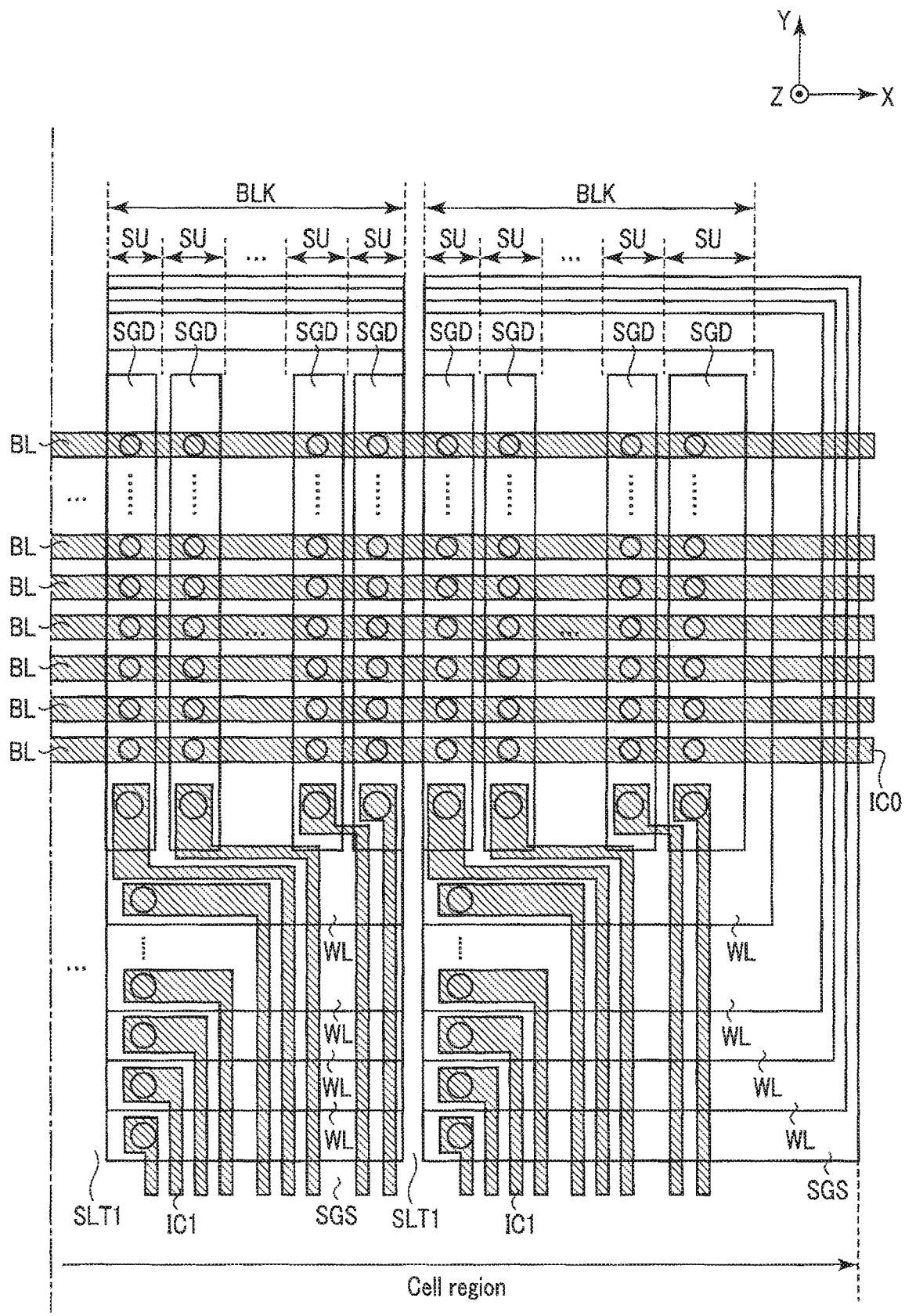

FIGS. 40A and 40B show the pattern of the interconnects D1 in the same region as in FIGS. 39A and 39B. Referring to FIGS. 40A and 40B, the particularly hatched regions are the interconnects D1, and the dot dashed line on the right side of the sheet surface of FIG. 40A and the dot dashed line on the left side of the sheet surface of FIG. 40B represent the same position.

As shown in FIGS. 40A and 40B, interconnect layers IC0 functioning as the bit lines BL are provided along the X-axis direction across a plurality of blocks. The interconnect layers IC0 are commonly connected to the plurality of string units SU (more specifically, the silicon pillars MH provided on the same row). In addition, the bit lines BL commonly connect the string units SU between the plurality of mats MAT. However, the bit lines BL are separated between the logical planes LP, and the bit lines BL are provided on a logical plane basis.

Furthermore, interconnect layers IC1 connected to the contact plugs CP1 on the selection gate lines SGS and SGD and the word lines WL are provided along the Y-axis direction. The interconnect layers IC1 are interconnects configured to extract the selection gate lines SGS and SGD and the word lines WL to the lane R.

Figure 41:
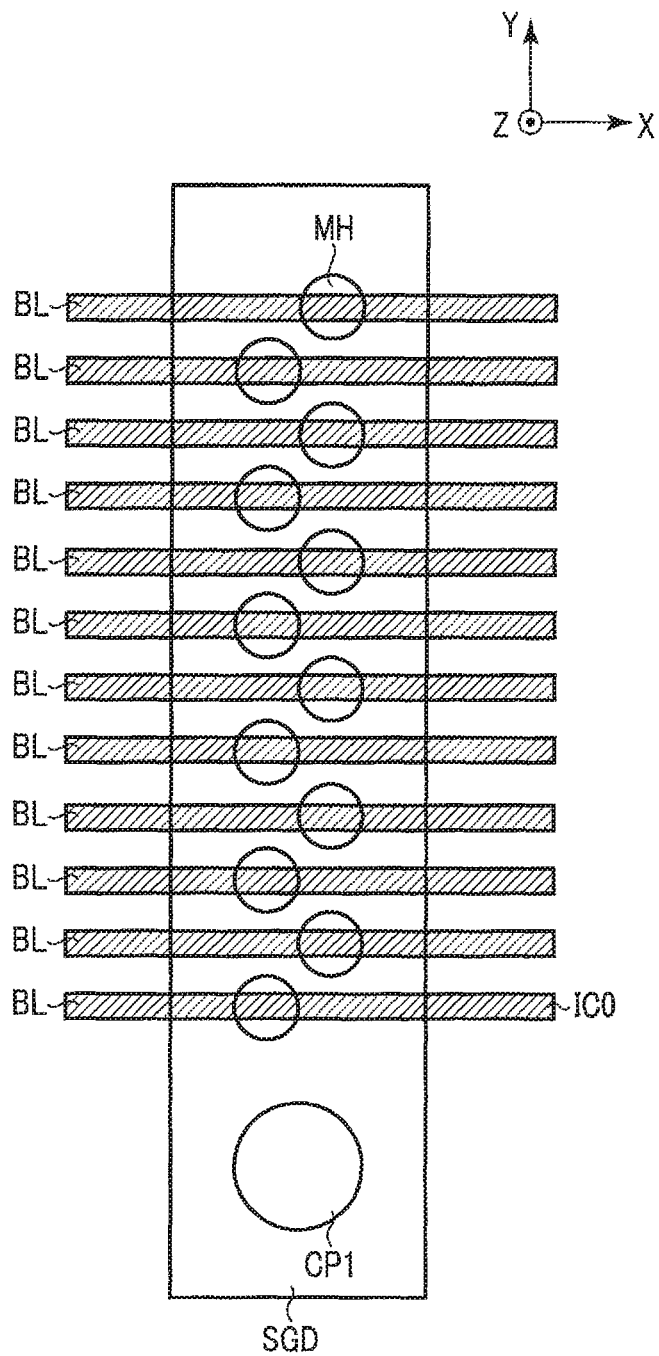
FIG. 41 is a layout diagram of bit lines according to the sixth embodiment.

Note that in the examples shown in FIGS. 39A and 39B and FIGS. 40A and 40B, a case in which the silicon pillars MH are arranged in a row along the Y-axis direction in each string unit SU has been described as an example. However, for example, as shown in FIG. 41, the silicon pillars MH may be arranged in a staggered pattern. In this case, the area of the silicon pillar MH can be made larger without changing the pitch of the bit lines BL, and the process accuracy of the silicon pillars can be improved.

Figure 42A:
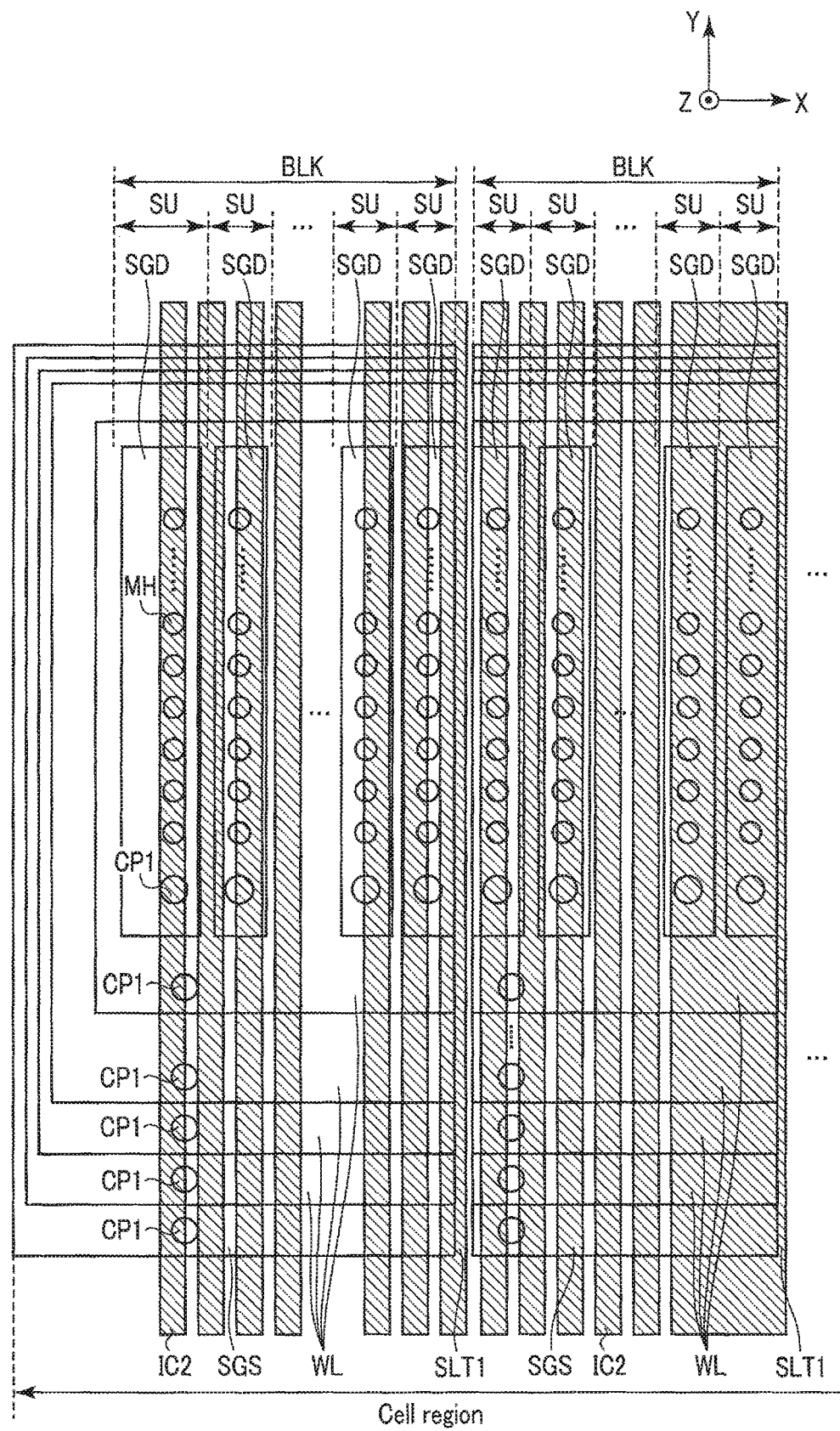
FIG. 42A and FIG. 42B are layout diagrams of the interconnect D2 above the memory cell array according to the sixth embodiment.
Figure 42B:
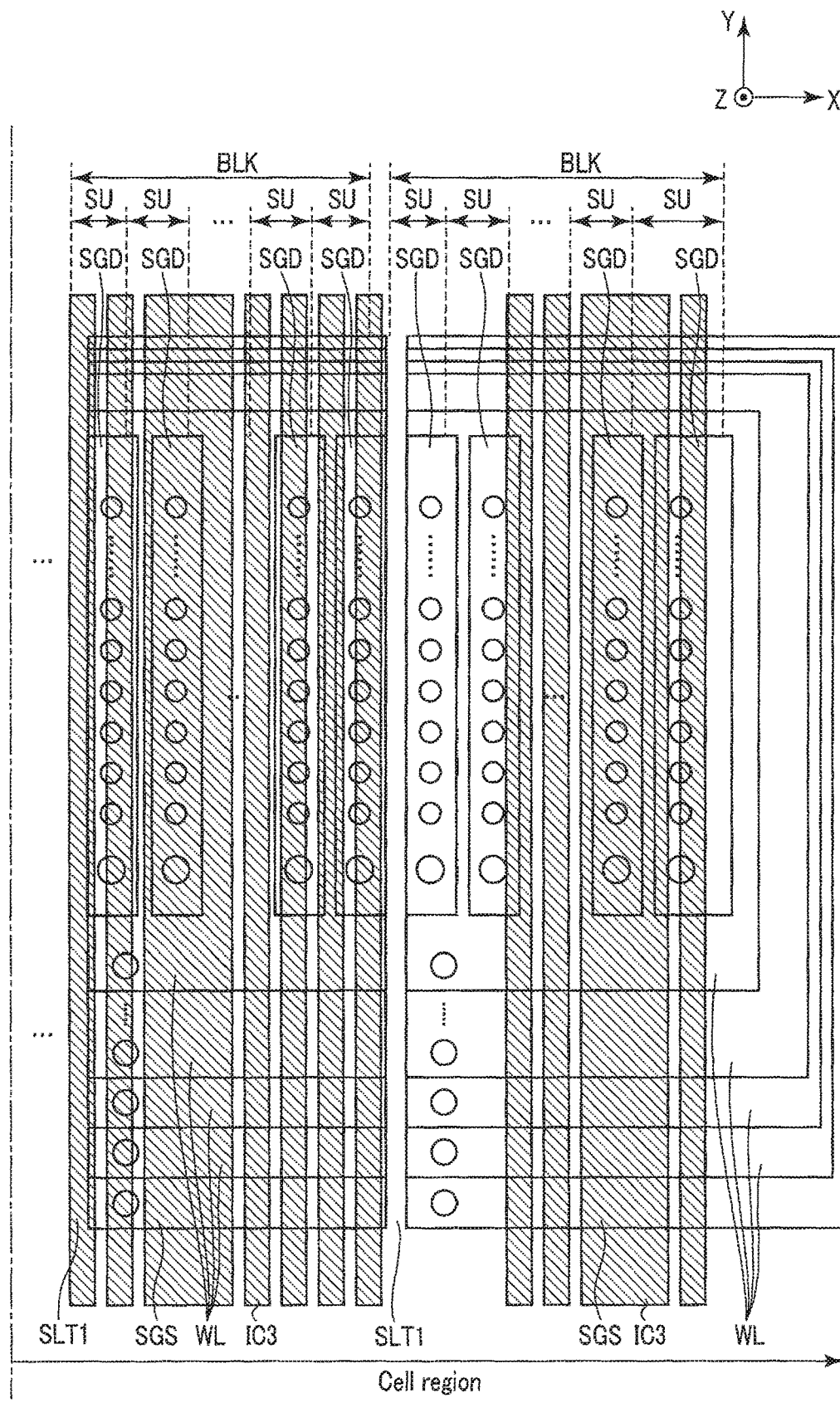

The pattern of the interconnects D2 will be described next with reference to FIGS. 42A and 42B. FIGS. 42A and 42B show the pattern of the interconnects D2 in the same region as in FIGS. 39A and 39B and FIGS. 40A and 40B. Referring to FIGS. 42A and 42B, the particularly hatched regions are the interconnects D2, and the dot dashed line on the right side of the sheet surface of FIG. 42A and the dot dashed line on the left side of the sheet surface of FIG. 42B represent the same position.

As shown in FIGS. 42A and 42B, a plurality of interconnection layers IC2 and IC3 along the Y-axis direction are provided in parallel using the interconnect layers D2. The interconnect layers IC2 functions as the signal lines CG, are electrically connected to the driver circuit 130, and connected to the transistors 50 in the lane R. The interconnect layers IC3 are interconnects related to the column and are used as, for example, power supply lines to the sense circuits 10 or interconnects used to transmit various kinds of signals.

Figure 43:
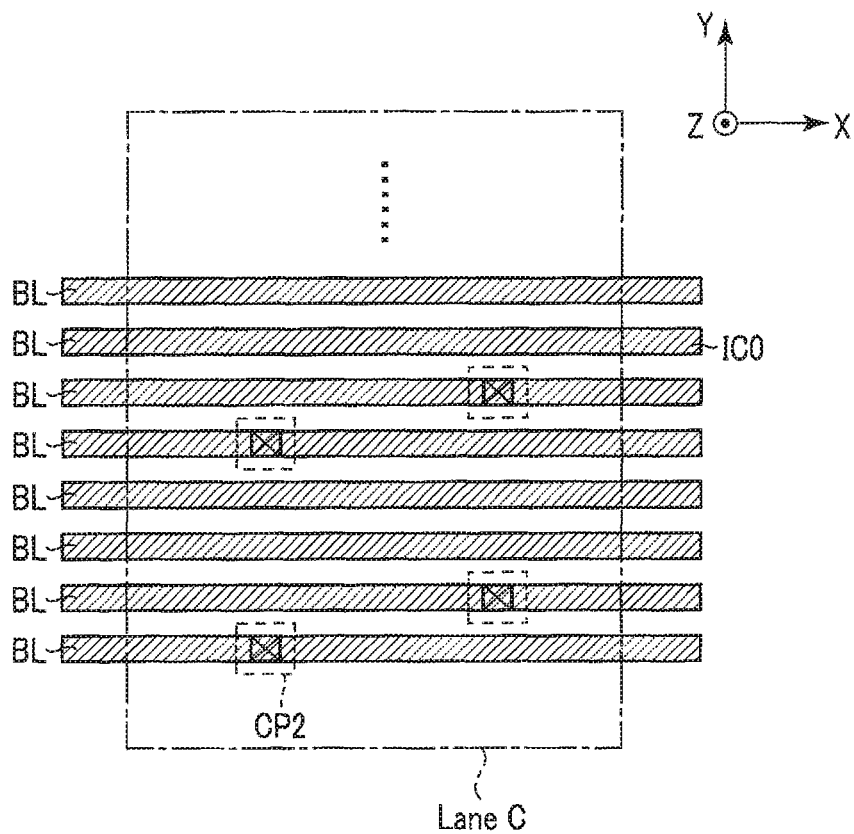
FIG. 43 is a layout diagram of the interconnect D1 in a lane C according to the sixth embodiment.

The interconnect pattern in the lane C will be described next. FIG. 43 shows the layout of the interconnects D2 in one of the lanes C. Referring to FIG. 43, the hatched regions are the interconnects D2.

As shown in FIGS. 42A and 42B, the interconnect layers IC0 functioning as the bit lines BL, which have been described with reference to FIGS. 40A and 40B, are extracted up to the lanes C along the X-axis. In one lane C, contact plugs CP2 are formed on two of four continuous interconnect layers IC0. The contact plugs CP2 correspond to the contact plugs C1 and C0 described with reference to FIG. 38. For the interconnect layers IC0 in which the contact plugs CP2 are not formed in a lane C, the contact plugs CP2 are formed in the other lane C of the same mat MAT.

Figure 44:
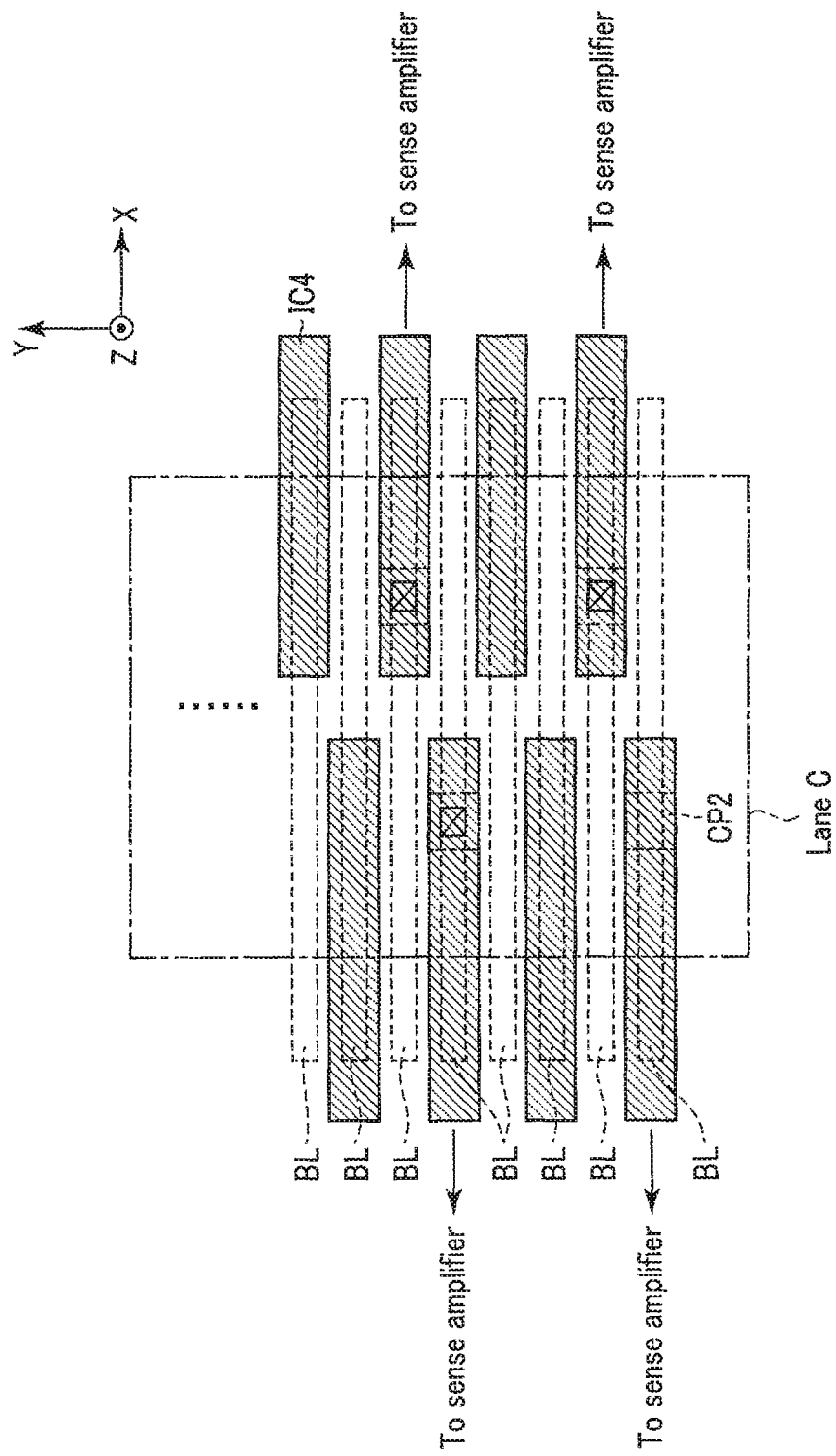
FIG. 44 is a layout diagram of an interconnect M1 in the lane C according to the sixth embodiment.

FIG. 44 shows the pattern of interconnections M2 in the same region as in FIG. 43. Referring to FIG. 44, the particularly hatched regions are the interconnects M2.

As shown in FIG. 44, a plurality of interconnect layers IC4 along the X direction are formed. The interconnect layers IC4 are connected to the corresponding interconnect layers IC0 by the contact plugs CP2, extracted from the lane C to the region immediately under the cell region, and connected to the corresponding sense circuits 10.

Figure 45B:
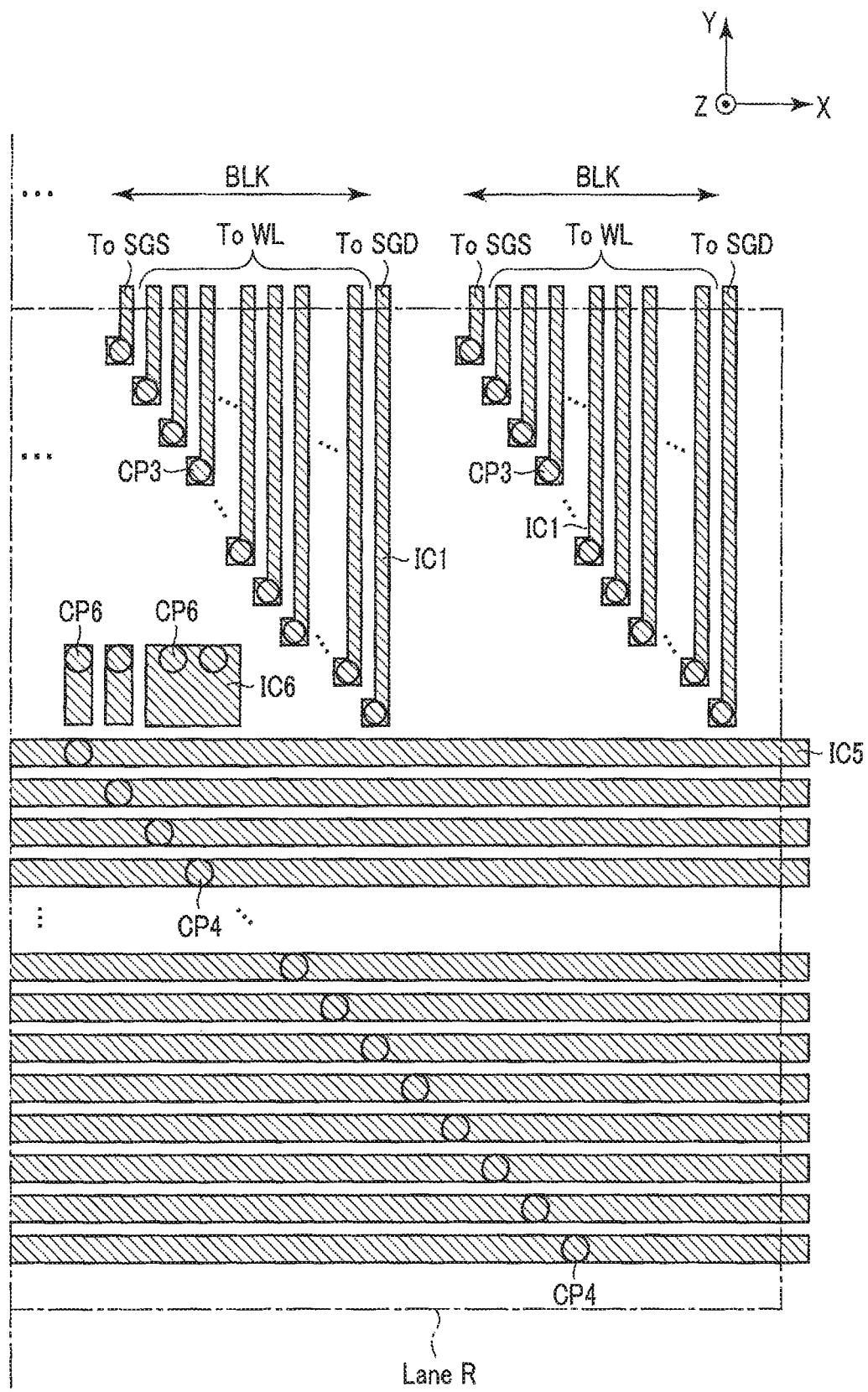

The interconnect pattern in the lane R will be described next. FIGS. 45A and 45B show the layout of the interconnects D1 in a certain lane R, which corresponds to the region shown in FIGS. 40A and 40B. Additionally, in FIGS. 45A and 45B, the hatched regions are the interconnects D1, and the dot dashed line on the right side of the sheet surface of FIG. 45A and the dot dashed line on the left side of the sheet surface of FIG. 45B represent the same position.

As shown in FIGS. 45A and 45B, the interconnect layers IC1 described with reference to FIGS. 40A and 40B are extracted to the lane R. The lengths of the interconnect layers IC1 along the Y-axis direction are different from each other. The interconnect layers IC1 corresponding to lower interconnects of the selection gate lines SGS and SGD and the word lines WL are short, and the interconnect layers IC1 corresponding to upper interconnects are long. However, this is merely an example, and the present embodiment is not limited to such an example. Contact plugs CP3 are formed at ends of the interconnect layers IC1. The contact plugs CP3 correspond to the contact plugs C1 and C0 described with reference to FIG. 38.

Additionally, in the lane R, a plurality of interconnect layers IC5 along the X-axis direction are formed. The interconnect layers IC5 function as the signal lines SGDD, SGSD, and CG. The interconnect layers IC5 may commonly connect the plurality of logical planes LP or may be provided for each logical plane LP. In the interconnect layers IC5, contact plugs CP4 are formed for every two blocks BLK. The contact plugs CP3 correspond to the contact plugs C1 and C0 described with reference to FIG. 38.

In addition, in the lane R, interconnect layers IC6 used to extract column interconnects to the region immediately under the memory cell array 110 are also formed. Contact plugs CP6 are formed at the interconnect layers IC6. The contact plugs CP6 also correspond to the contact plugs C1 and C0 described with reference to FIG. 38.

Figure 46A:
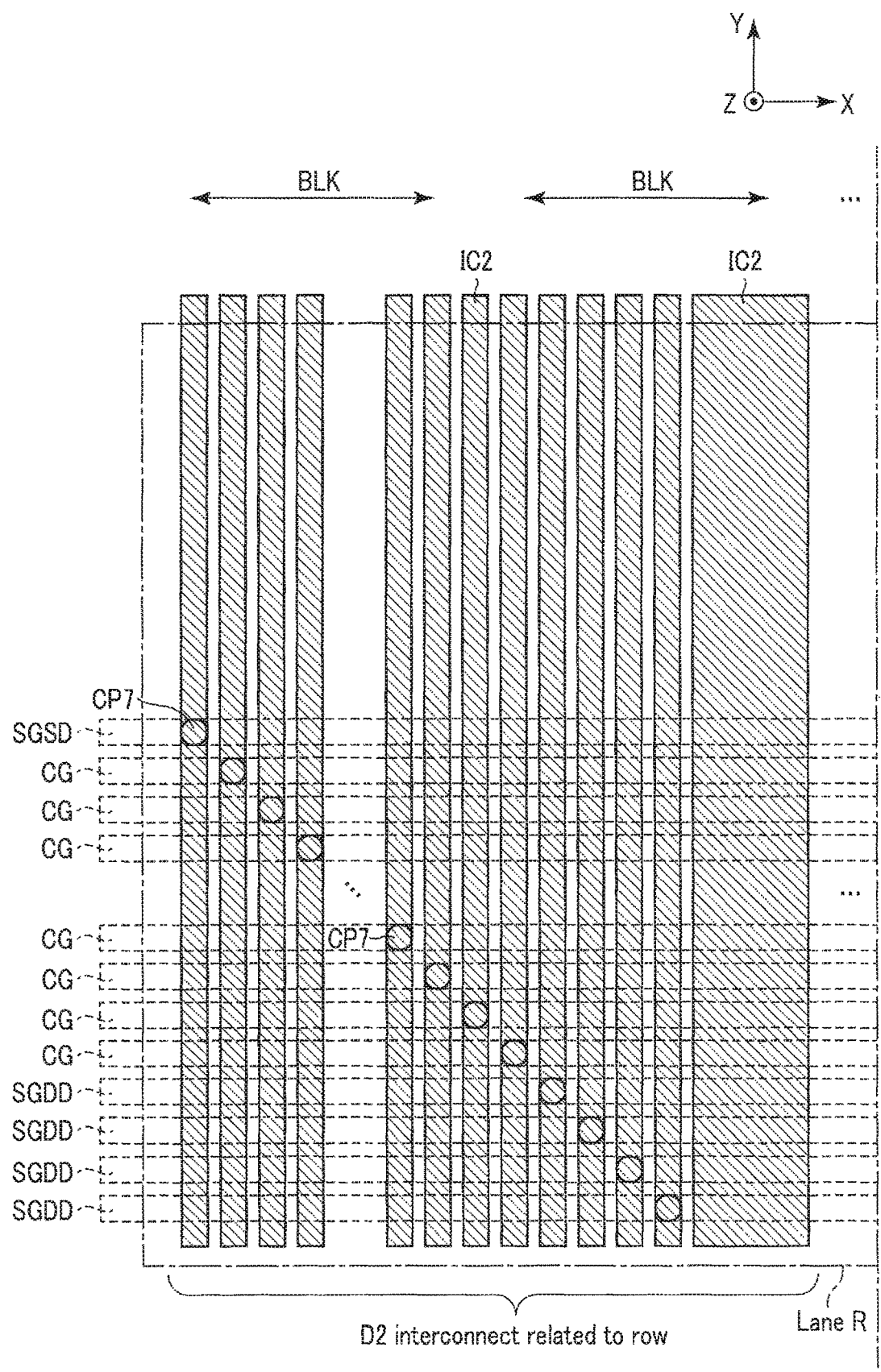
FIG. 46A and FIG. 46B are layout diagrams of the interconnect D2 in the lane R according to the sixth embodiment.
Figure 46B:
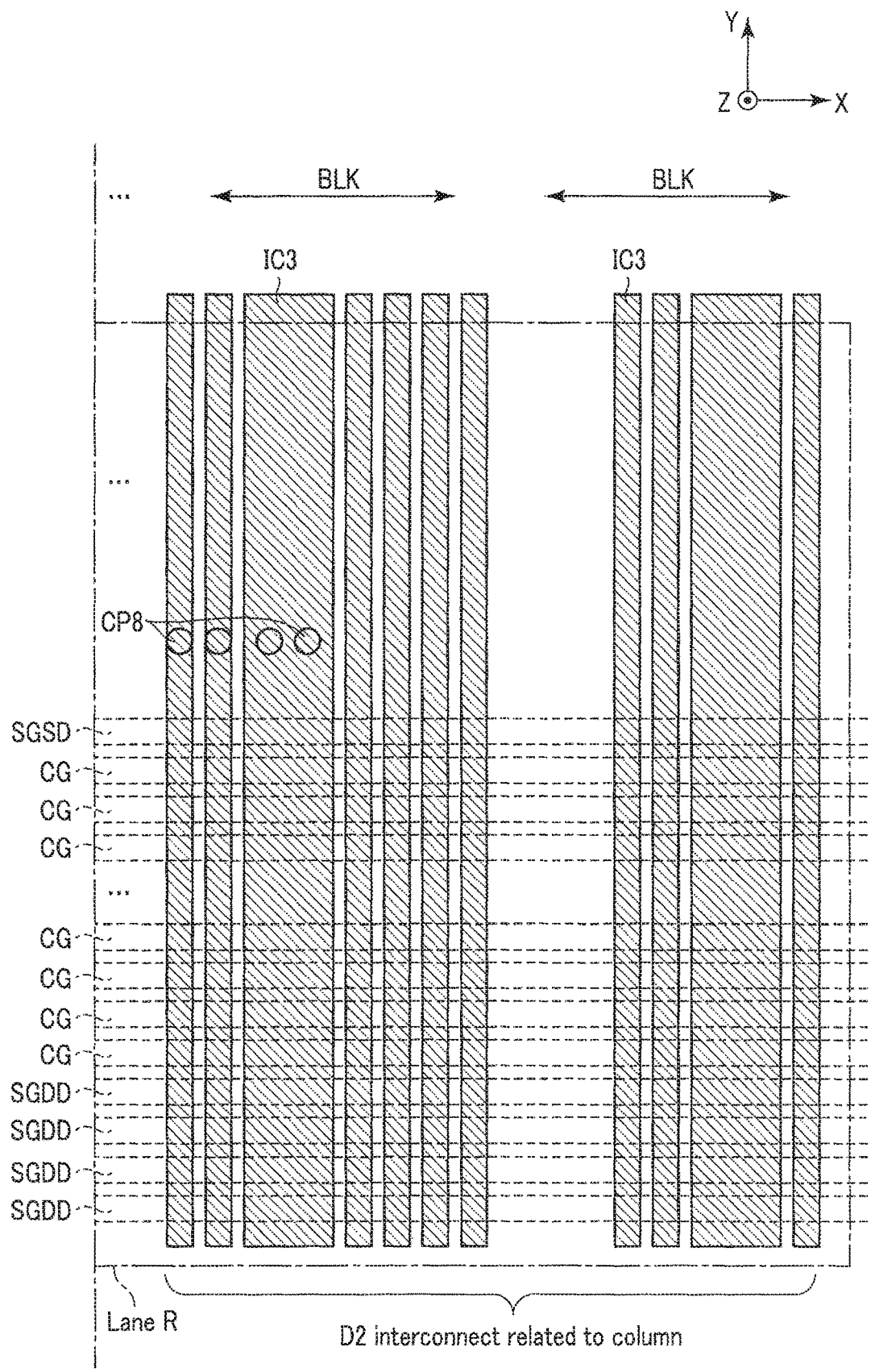

The pattern of the interconnects D2 in the lane R will be described next with reference to FIGS. 46A and 46B. FIGS. 46A and 46B show the pattern of the interconnects D2 in the same region as in FIGS. 45A and 45B. Referring to FIGS. 46A and 46B, the particularly hatched regions are the interconnects D2, and the dot dashed line on the right side of the sheet surface of FIG. 46A and the dot dashed line on the left side of the sheet surface of FIG. 46B represent the same position.

As shown in FIGS. 46A and 46B, the interconnect layers IC2 and IC3 described with reference to FIGS. 42A and 42B are extracted to the lane R. The interconnect layers IC2 and IC3 commonly connect the plurality of mats MAT included in the same logical plane LP. Contact plugs CP7 are provided in interconnect layers IC7, and the interconnect layers IC7 are connected to the interconnect layers IC5 by the contact plugs CP7. In addition, contact plugs CP8 are provided in the interconnect layers IC3, and the interconnect layers IC3 and IC6 are connected by the contact plugs CP8. Note that the contact plugs CP7 and CP8 correspond to the contact plugs C2 in FIG. 38.

Figure 47B:
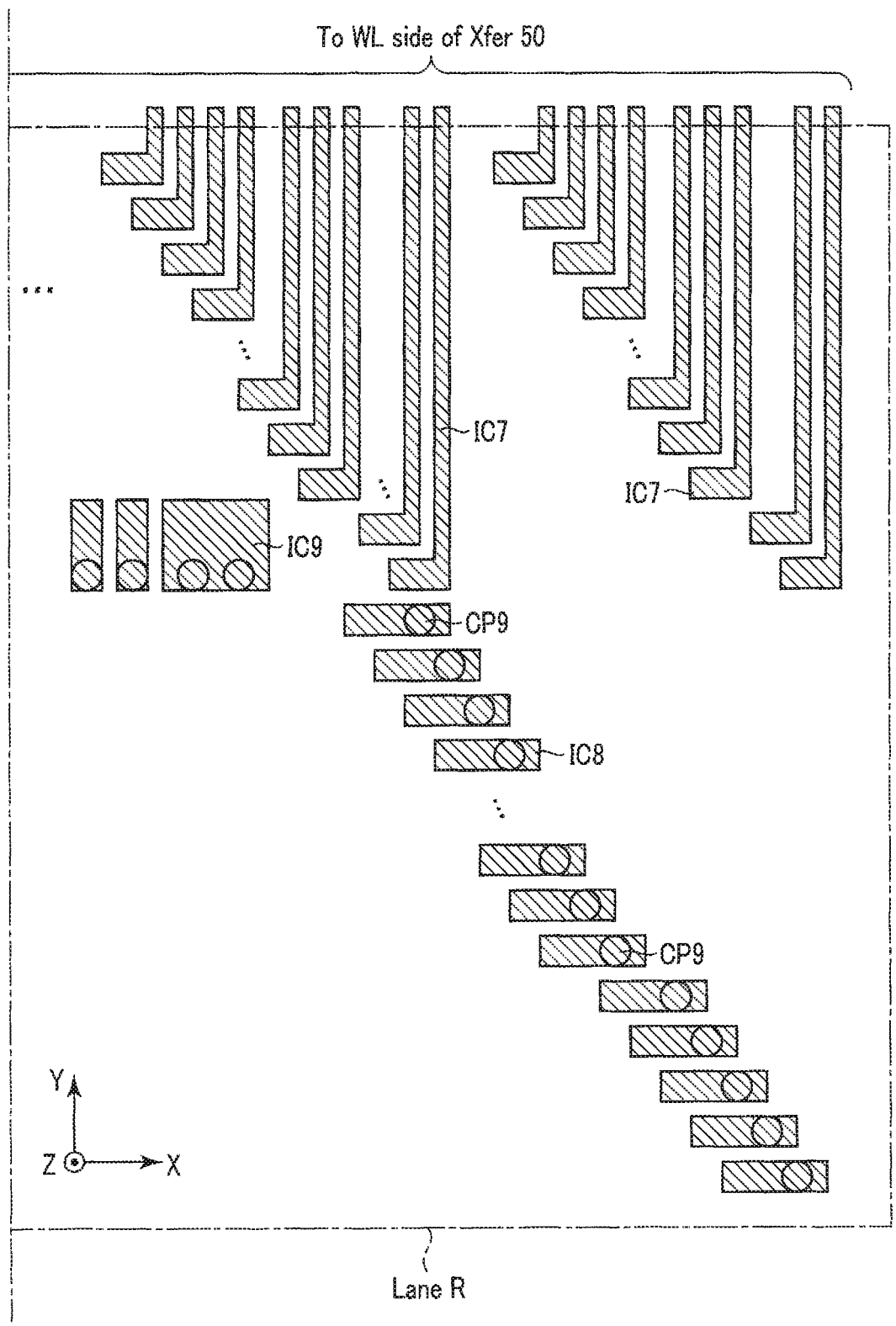

FIGS. 47A and 47B show the pattern of the interconnects M1 in the lane R, which corresponds to the region shown in FIGS. 45A and 45B and FIGS. 46A and 46B. Referring to FIGS. 47A and 47B, the particularly hatched regions are the interconnects M1, and the dot dashed line on the right side of the sheet surface of FIG. 47A and the dot dashed line on the left side of the sheet surface of FIG. 47B represent the same position.

As shown in FIGS. 47A and 47B, the plurality of interconnection layers IC7 associated with the contact plugs CP7 are provided in parallel. The interconnect layers IC7 are provided along the Y-axis direction and connected to the sources of the transistors 50 in the row decoder 120. Additionally, in the lane R, a plurality of interconnect layers IC8 and IC9 associated with the contact plugs CP4 and CP6, respectively, are provided. Contact plugs CP9 and CP10 are further provided at the interconnect layers IC8 and IC9. The contact plugs CP9 and CP10 correspond to the contact plugs V1 described with reference to FIG. 38.

Figure 48A:
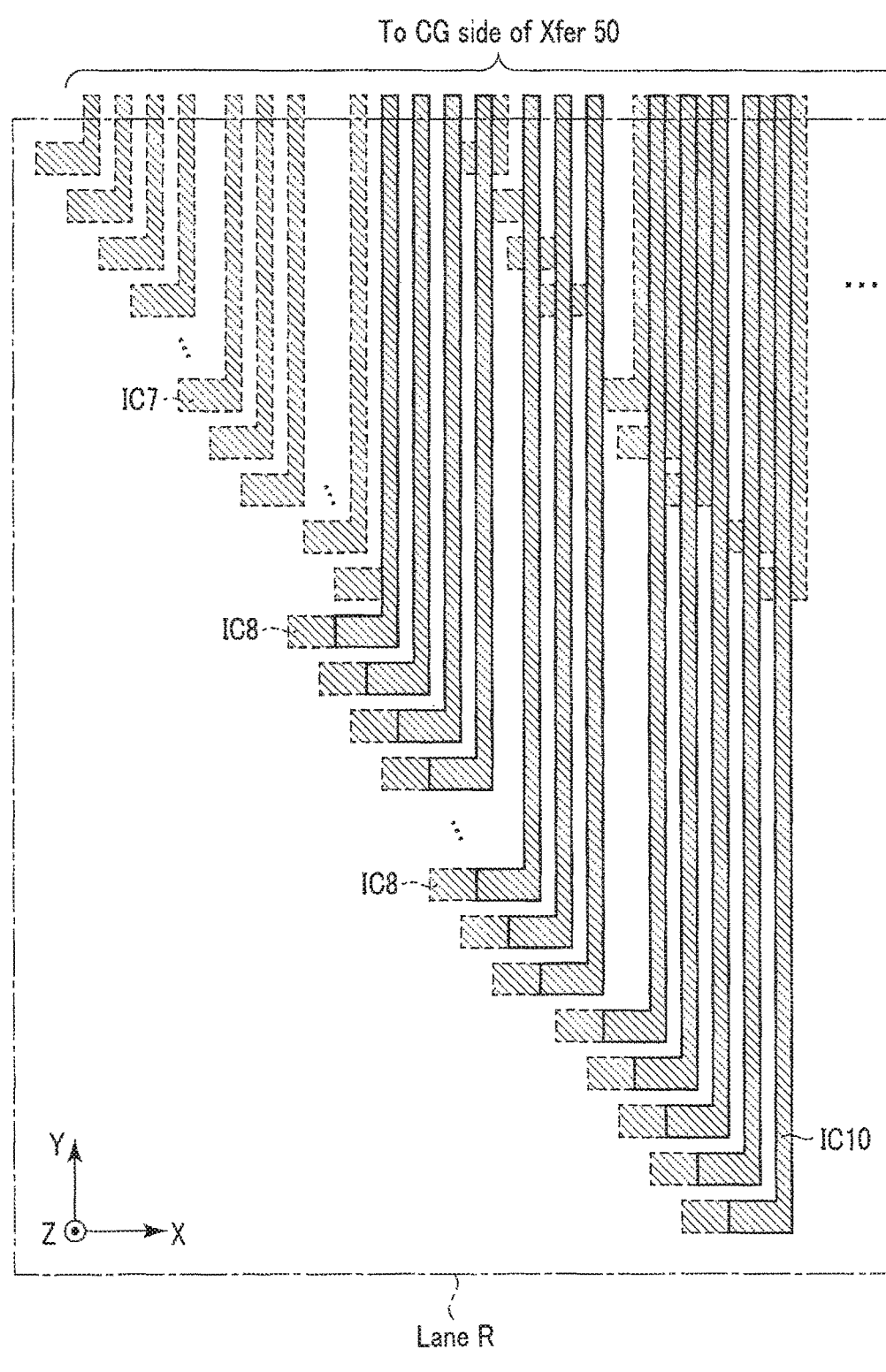
FIG. 48A and FIG. 48B are layout diagrams of the interconnect M0 under the memory cell array in the lane R according to the sixth embodiment.
Figure 48B:
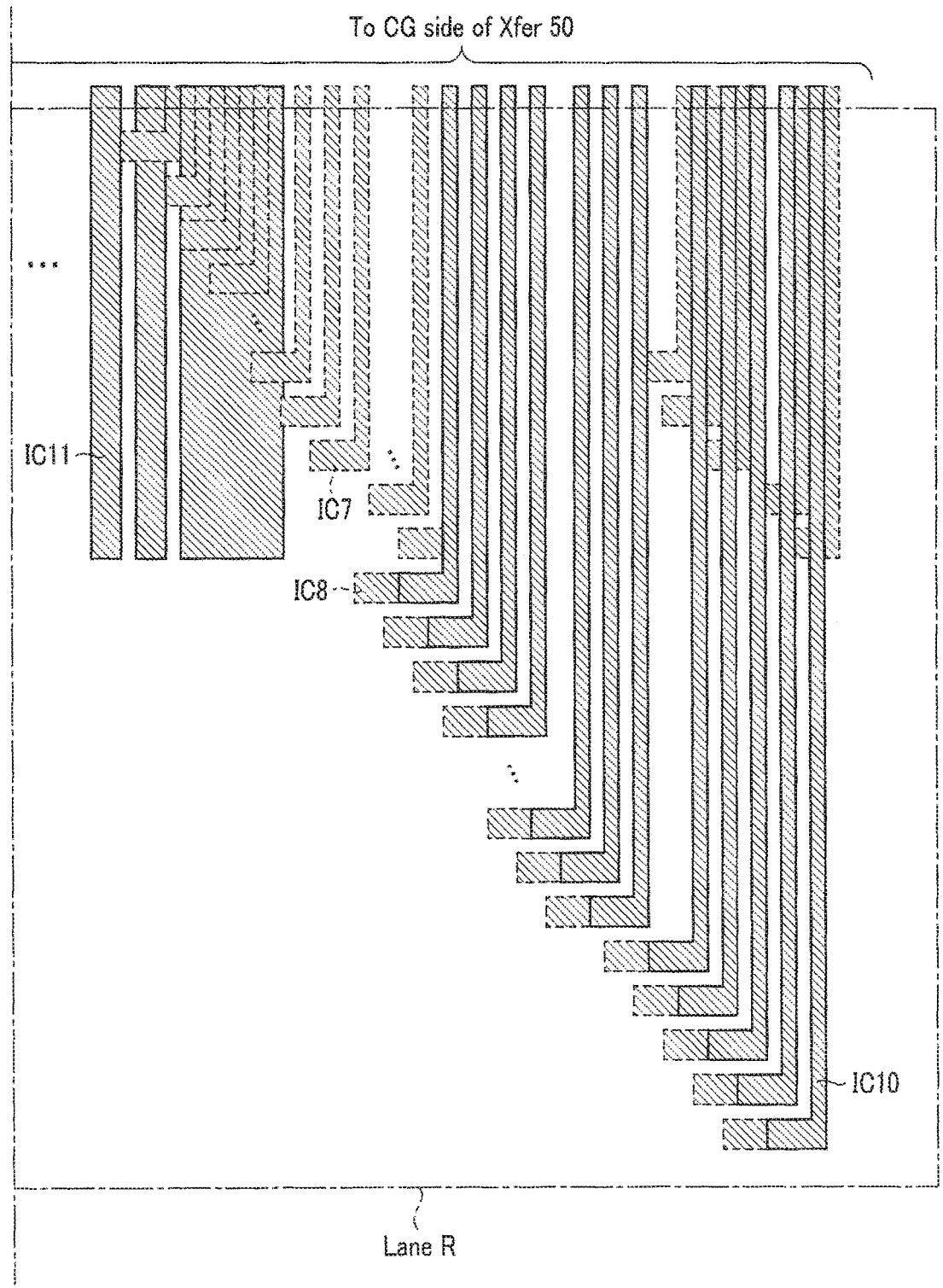

FIGS. 48A and 48B show the pattern of the interconnects M0 in the lane R, which corresponds to the region shown in FIGS. 45A and 45B, FIGS. 46A and 46B, and FIGS. 47A and 47B. Referring to FIGS. 48A and 48B, the hatched regions particularly indicated by solid lines are the interconnects M0. For reference, the interconnect layers IC7 and IC8 are illustrated as hatched regions indicated by broken lines, and the dot dashed line on the right side of the sheet surface of FIG. 48A and the dot dashed line on the left side of the sheet surface of FIG. 48B represent the same position.

As shown in FIGS. 48A and 48B, a plurality of interconnect layers IC10 associated with the contact plugs CP9 are provided in parallel. The interconnect layers IC10 are provided along the Y-axis direction and connected to the drains of the transistors 50 in the row decoder 120. Additionally, in the lane R, a plurality of interconnect layers IC11 associated with the contact plugs CP10 are provided. The interconnect layers IC11 are also provided along the Y-axis direction and connected to, for example, the sense circuits 10.

With the above-described arrangement, the interconnect layers functioning as the selection gate lines SGD and SGS and the word lines WL described with reference to FIGS. 40A and 40B are connected to the sources of the transistors 50 via the contact plug CP1, the interconnect layers IC1, the contact plugs CP3, and the interconnect layers IC7. In addition, the drains of the transistors 50 are connected to the driver circuit 130 via the interconnect layers IC10, the contact plugs CP9, the interconnect layers IC8, the contact plugs CP4, the interconnect layers IC5, the contact plugs CP7, and the interconnect layers IC2.

Figure 49:
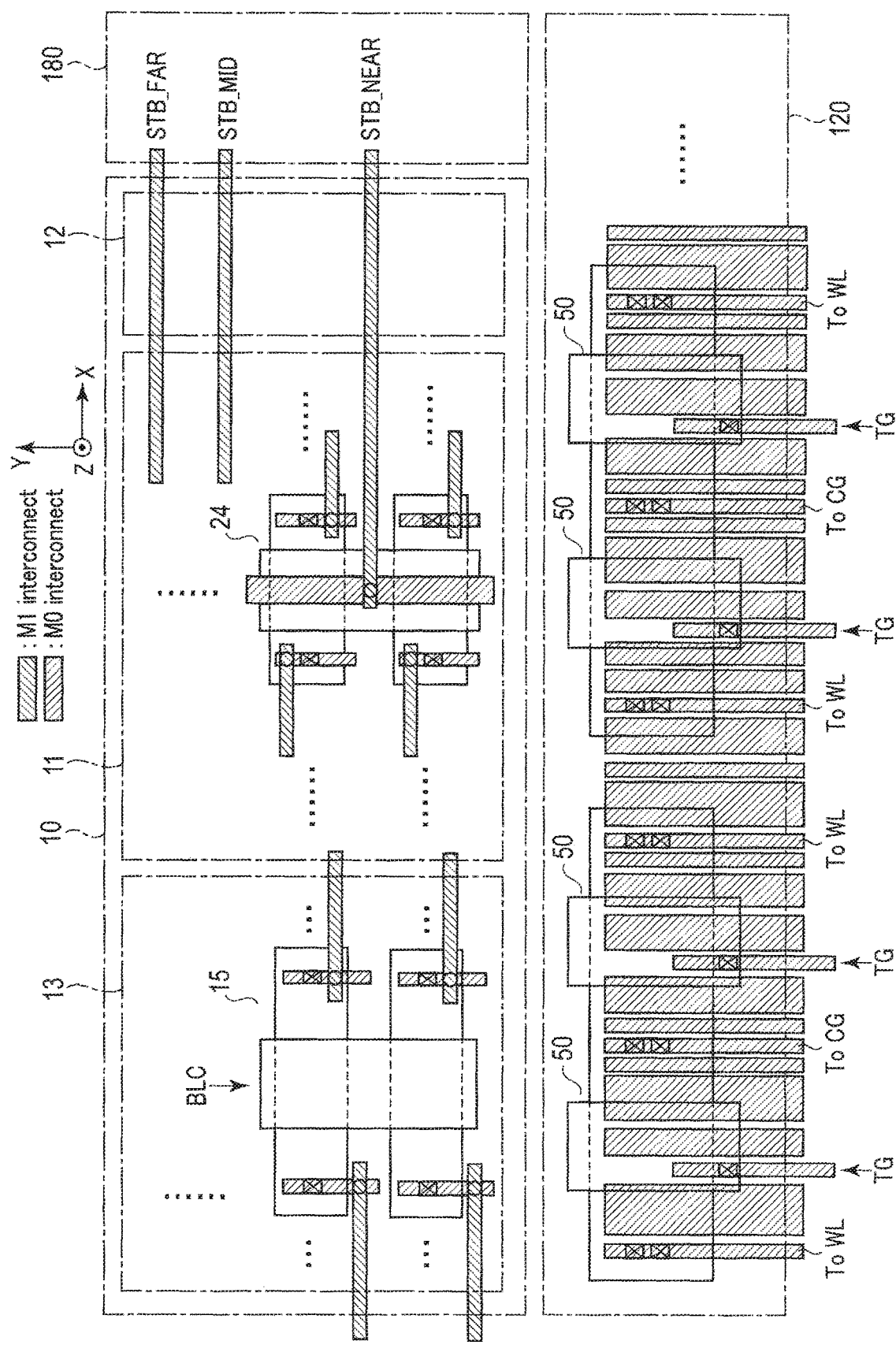
FIG. 49 is a layout diagram of the sense amplifier and a row decoder according to the sixth embodiment.

FIG. 49 shows the layout of the sense circuit 10 and the transistors 50 of the row decoder 120 on the semiconductor substrate 500 immediately under the cell region. As shown in FIG. 49, the plurality of transistors 50 are arranged along the X-axis direction, and two transistors 50 share a drain. The interconnect layers IC10 are connected to the drains of the transistors 50 by the interconnects M0, and the interconnect layers IC7 are connected to the sources of the transistors 50 by the interconnects M0.

In addition, the signals STB_NEAR, STB_MID, and STB_FAR are applied from the STB generation circuit 180 to the gate of a transistor 24 of the corresponding sense circuit 10 using for example, the interconnect M1 via, for example, the interconnects M0. Note that in the arrangement described in the fifth embodiment, the STB generation circuit 180 generates signals BLC_NEAR, BLC_MID, and BLC_FAR by, for example, the interconnects M0, and supplies them to the gate of a transistor 15 of the corresponding sense circuit 10.

6.2 Propagation Method of Signal STB

A supply method of the signal STB in the above-described arrangement will be described. In FIG. 50, the arrangement described as the second example or the third example of the second embodiment is applied. FIG. 50 is a schematic view of one logical plane.

As shown in FIG. 50, a sequencer 170 supplies a signal STB_SEED and a clock CLK to the memory cell array 110 using the interconnect D2. These signals are propagated to the interconnect M1 or M0 via a contact plug CP20 provided in the lane R and further supplied to the STB generation circuit 180. Then, the STB generation circuit 180 shown in FIG. 12 or 14 generates the signals STB_NEAR, STB_MID, and STB_FAR.

Figure 51:
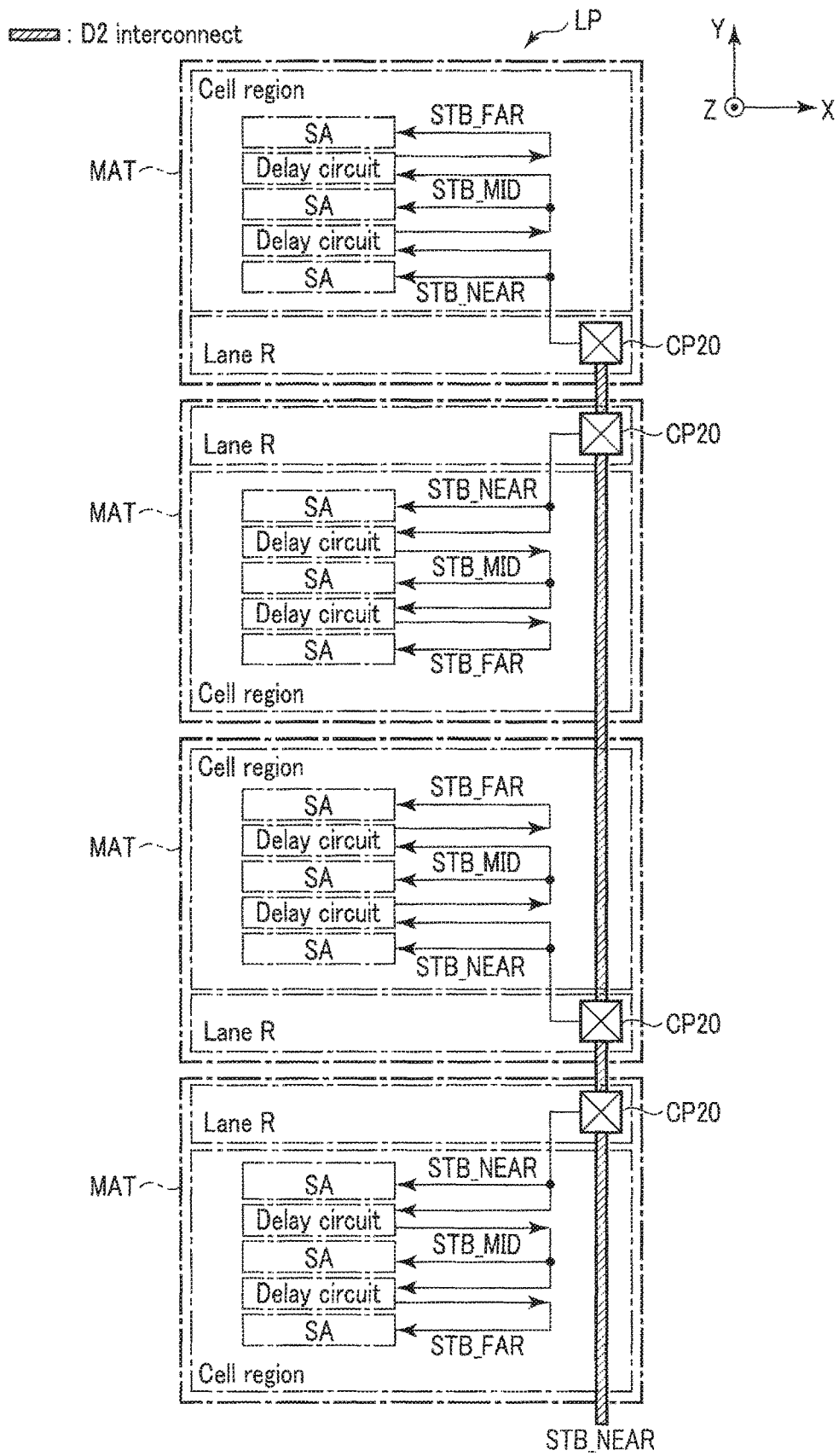
FIG. 51 is a schematic view showing the second example of the transfer method of the signal STB in the semiconductor memory device according to the sixth embodiment.

In FIG. 51, the arrangement described as the first example of the second embodiment is applied. FIG. 51 is a schematic view of one logical plane.

As shown in FIG. 51, the sequencer 170 supplies the signal STB_NEAR to the memory cell array 110 using the interconnect D2. The signal STB_NEAR is propagated to the interconnect M1 or M0 via the contact plug CP20 provided in the lane R and further supplied to the sense amplifier unit SA and a delay circuit corresponding to the group GP1. The delay circuit is formed on the semiconductor substrate 500, like the STB generation circuit 180, has, for example, the arrangement described with reference to FIG. 10, and generates the signal STB_MID by delaying the signal STB_NEAR. The signal STB_MID is supplied to the sense amplifier unit SA and the delay circuit corresponding to the group GP2 by the interconnect M1 or M0. The delay circuit generates the signal STB_FAR by delaying the signal STB_MID. The signal STB_FAR is supplied to the sense amplifier unit SA corresponding to the group GP3.

In FIG. 52, the arrangement described with reference to FIG. 6 in the first embodiment is applied. That is, the sequencer 170 generates the signals STB_NEAR, STB_MID, and STB_FAR, and these signals are supplied to the memory cell array 110 using the interconnect D2. The signals STB_NEAR, STB_MID, and STB_FAR are propagated to the interconnect M1 or M0 via the contact plug CP20 provided in the lane R and supplied to the sense amplifier units SA corresponding to the groups GP1 to GP3, respectively.

6.3 Effect According to this Embodiment

As described above, the arrangements described in the first to fifth embodiments can be applied to the semiconductor memory device having the arrangement described in this embodiment.

Figure 53:
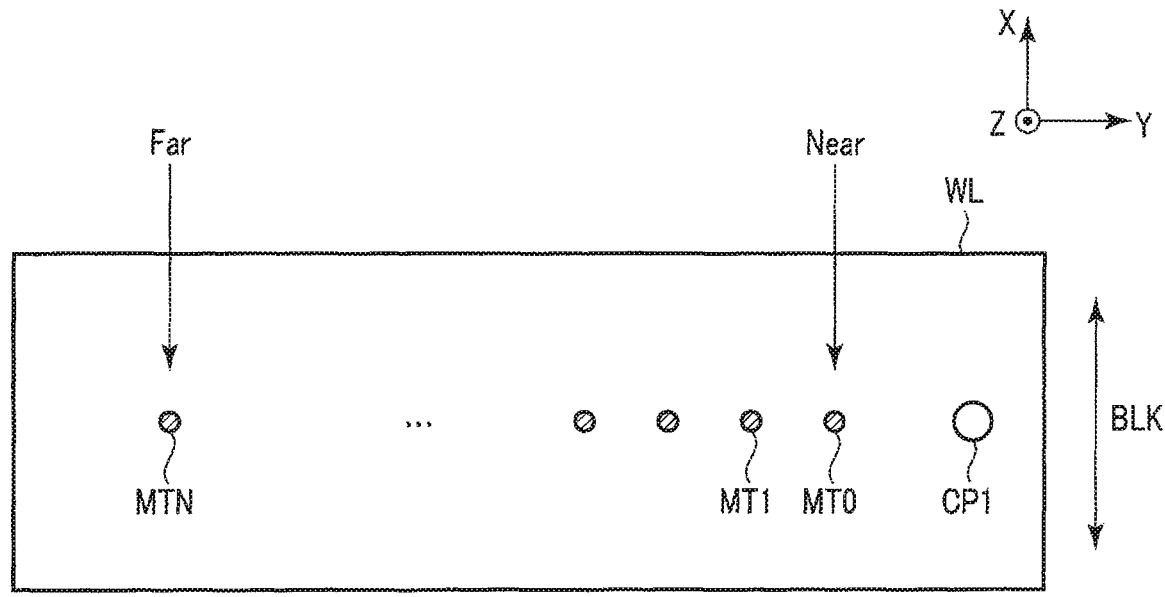
FIG. 53 is a plan view of a word line in the semiconductor memory device according to the sixth embodiment.
Figure 54:
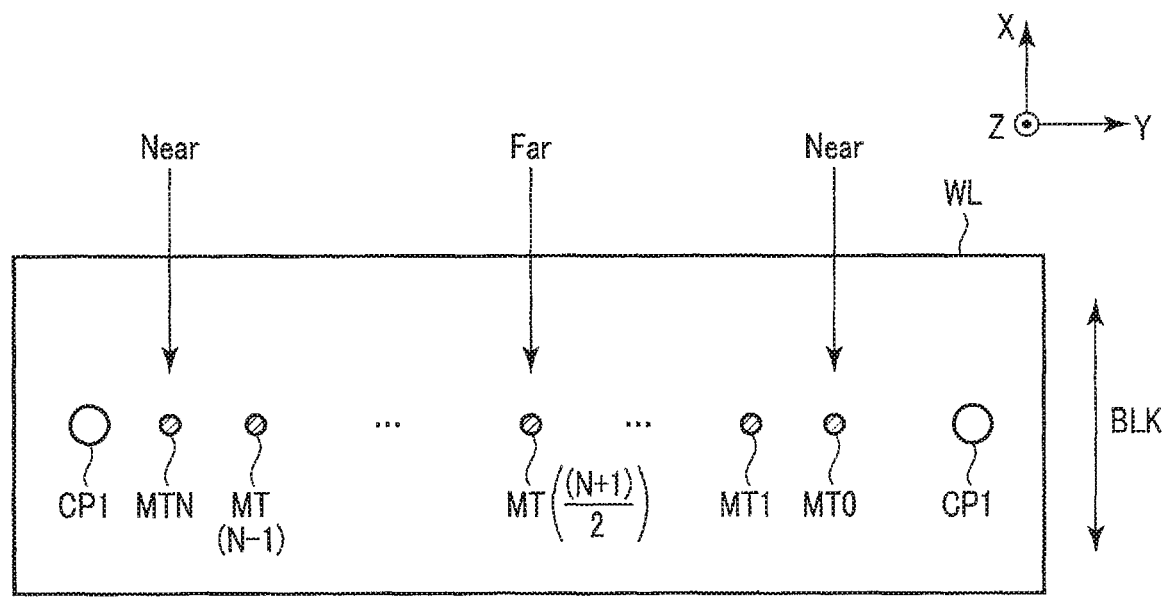
FIG. 54 is a plan view of a word line in a semiconductor memory device according to the first modification of the sixth embodiment.

Note that to which one of the groups GP1 to GP3 the memory cell transistor MT belongs changes depending on the shape of the word line WL or the position of the contact plug CP1. This example will be described with reference to FIGS. 53, 54, and 55. FIGS. 53, 54, and 55 are plan views (X-Y plane) of the word line WL. FIGS. 53 and 54 each show the word line WL of one block, and FIG. 55 shows the word lines WL of two blocks. Note that the word line WL in FIGS. 53, 54, and 55 to be described below means a conductive layer formed in the interlayer dielectric film 502 and provided between a conductive layer functioning as a source line and an interconnect D1 in, for example, FIG. 38 or the like. This conductive layer is a conductive layer that contacts the silicon pillar MH with a gate insulating film, a charge accumulation layer, and a block insulating film interposed therebetween. In other words, the word line WL means a plurality of conductive layers, for example, polysilicon layers stacked between a conductive layer functioning as the selection gate line SGS and a conductive layer functioning as the selection gate line SGD along the Z-axis direction. The contact plug CP1 means a contact plug formed on such a conductive layer (see, for example, FIGS. 39A and 39B and FIGS. 40A and 40B). In the following explanation, "the distance between the contact plug CP1 and the memory cell transistor MT" is, in other words, "the distance between the contact plug CP1 and the gate of the memory cell transistor MT", and can also be expressed in other words as "the distance between the contact plug CP1 and the silicon pillar MH corresponding to each memory cell transistor MT". In addition, a "physical distance" between them means the physical linear distance between them. On the other hand, a "current path length" means the length of a path to actually propagate a voltage until the gate potential of the memory cell transistor MT is raised when, for example, the voltage is applied from the contact plug CP1 to the memory cell transistor MT.

FIG. 53 shows a case in which the contact plug CP1 is provided only at one end of the word line WL along the Y direction. In this case, to which one of the groups GP1 to GP3 the memory cell transistor MT belongs simply corresponds to the physical distance (in this example, equal to the current path length) from the contact plug CP1. That is, a memory cell transistor MT1 close to the contact plug CP1 belongs to the group GP1, and a memory cell transistor MTN farthest from the contact plug CP1 belongs to the group GP3.

FIG. 54 shows a case in which the contact plugs CP1 are provided at the two ends of the word line WL along the Y direction. In this case as well, to which one of the groups GP1 to GP3 the memory cell transistor MT belongs simply corresponds to the physical distance (in this example, equal to the current path length) from the contact plug CP1. However, the correspondence relationship is different from the case shown in FIG. 53. In this example, not only the memory cell transistor MT1 but also the memory cell transistor MTN belong to the group GP1. A memory cell transistor MT((N+1)/2) located at the center along the Y direction belongs to the group GP3.

In FIG. 55, the word line WL is bent in the X direction on one end side, and the contact plug CP1 is provided in that region. FIG. 55 shows two word lines WLa and WLb, and suffixes "a" and "b" are added to the memory cell transistors MT and the contact plugs CP1 corresponding to the word lines WLa and WLb.

As shown in FIG. 55, the physical distance between a contact plug CP1a and a memory cell transistor MT0a is larger than the physical distance between the contact plug CP1a and a memory cell transistor MTNb. However, concerning the current path length, the relationship is reversed. That is, hence, the memory cell transistor MT0a belongs to the group GP1. This also applies to a memory cell transistor MTNa. The physical distance between the memory cell transistor MTNa and a contact plug CP1b is smaller than the physical distance between the memory cell transistor MTNa and the contact plug CP1a. However, concerning the current path length, the relationship is reversed. Hence, the memory cell transistor MTNa belongs to the group GP3.

As described above, to which one of the groups GP1 to GP3 the memory cell transistor MT belongs is decided not only by the physical distance from the contact plug CP1 but by the length of the current path used to actually transmit a voltage for the driver circuit 130 to the gate potential of the memory cell transistor MT.

7. Modifications and the Like

As described above, a semiconductor memory device 100 according to the above embodiment includes first to 32nd memory cells, a first set (C0 in FIG. 5) including first to 16th bit lines (BL0-BL15 in FIG. 5) consecutively arranged and connected to the first to 16th memory cells, a second set (C2 in FIG. 5) including 17th to 32nd bit lines (BL16-BL23 in FIG. 5) consecutively arranged and connected to the 17th to 32nd memory cells, a first word line connected to gates of the first to 32nd memory cells, first to 16th sense amplifiers (SA0-SA7 in FIG. 5) configured to determine data read from the first to 16th memory cells at a first timing (t1 in FIG. 9), and 17th to 32nd sense amplifiers (SA16-SA23 in FIG. 5) configured to determine data read to the 17th to 32nd memory cells at a second timing (t2 in FIG. 9). The first timing is different from the second timing (t1≠t2 in FIG. 9).

Alternatively, the semiconductor memory device 100 according to the above embodiment includes a first memory cell (GP1 in FIG. 5) and a second memory cell (GP2 in FIG. 5), a first word line connected to gates of the first memory cell and the second memory cell, a first bit line (BL0-BL15 in FIG. 5) connected to the first memory cell, a second bit line (BL16-BL31 in FIG. 5) connected to the second memory cell, a first sense amplifier (SA0-SA15 in FIG. 5) configured to determine data read from the first memory cell at a timing of asserting a first signal (STB_NEAR in FIG. 5), a second sense amplifier (SA16-SA31 in FIG. 5) configured to determine data read from the second memory cell at a timing of asserting a second signal (STB_MID in FIG. 5) different from the first signal, and a delay circuit (Delay 30 or STB generator 180 in FIG. 5) configured to generate the second signal (STB_MID in FIG. 5).

In addition, the semiconductor memory device 100 according to the above embodiment has a first read mode (ramped sensing) and a second read mode (fast read). The semiconductor memory device includes a first memory cell (GP1 in FIG. 5) and a second memory cell (GP2 in FIG. 5), a first word line connected to gates of the first memory cell and the second memory cell, a first bit line (BL0-BL15 in FIG. 5) connected to the first memory cell, a second bit line (BL16-BL31 in FIG. 5) connected to the second memory cell, a first sense amplifier (SA0-SA15 in FIG. 5) configured to determine data read from the first memory cell at a first timing (STB_NEAR, t2 in FIG. 14 or 16) in the first and second read modes, and a second sense amplifier (SA16-SA31 in FIG. 5) configured to determine data read from the second memory cell at a second timing (STB_MID, t4 in FIG. 14) different from the first timing in the first read mode and determine the data at the first timing (STB_MID, t2 in FIG. 16) in the second read mode. The first timing is different from the second timing (t1≠t4 in FIG. 14 or 16). In the first read mode (ramped sensing), a voltage of the first word line is continuously raised (FIG. 9), and in the second read mode (fast read), the voltage of the first word line is stepped up (FIG. 17).

According to this arrangement, even if the voltage variation of the selected word line has a position dependence, data can be strobed at an appropriate timing, and as a result, the read operation reliability can be improved.

Note that the embodiments are not limited to the above-described forms, and various modifications can be made.

For example, in the above embodiments, the description has been made using an example in which the signals STB_NEAR, STB_MID, and STB_FAR are prepared. However, preparing two or more signals suffices. When the number of types of signals STB is increased to four or more, more accurate reading can be performed. In addition, the generation methods of the signals STB_NEAR, STB_MID, and STB_FAR are not limited to those described in the embodiments, and any arrangement capable of generating, at an appropriate timing, a signal to be asserted can be employed.

Additionally, in the sixth embodiment, a case in which the sense amplifier and the row decoder are formed on the semiconductor substrate, and the memory cell array is formed above them has been described as an example. However, the arrangement is not limited to this, and the memory cell array may be formed on the semiconductor substrate. In addition, various arrangements can be applied to the memory cell array. An arrangement of the memory cell array is described in, for example, U.S. patent application Ser. No. 12/407,403 filed on Mar. 19, 2009 and entitled "THREE DIMENSIONAL STACKED NONVOLATILE SEMICONDUCTOR MEMORY". Arrangements are also described in U.S. patent application Ser. No. 14/406,524 filed on Mar. 18, 2009 and entitled "THREE DIMENSIONAL STACKED NONVOLATILE SEMICONDUC- TOR MEMORY", U.S. patent application Ser. No. 12/679,991 filed on Mar. 25, 2010 and entitled "NON-VOLATILE SEMICONDUCTOR STORAGE DEVICE AND METHOD OF MANUFACTURING THE SAME", and U.S. patent application Ser. No. 14/532,030 filed on Mar. 23, 2009 and entitled "SEMICONDUCTOR MEMORY AND METHOD FOR MANUFACTURING SAME". These patent applications are entirely incorporated herein by reference.

Furthermore, the arrangement of the sense amplifier is not limited to that described in the embodiments, and any arrangement that senses and strobes data at a specific timing can be used.

Moreover, as for details of distribution read and Vth tracking described in the fourth embodiment, a method described in, for example, U.S. patent application Ser. No. 13/544,147 filed on Jul. 9, 2012 and entitled "SEMICONDUCTOR MEMORY DEVICE WHICH STORES MULTI-VALUED DATA" can be applied. This patent application is entirely incorporated herein by reference.

The above-described embodiments can be applied not only to a NAND flash memory but also to a general memory device capable of reducing the influence of signal delay in an interconnect by controlling the strobe timing. In addition, although the embodiments may be executed independently, a plurality of combinable embodiments may be executed in combination.

Furthermore, the terms "connect" and "couple" used in the embodiments include both a case in which direct connection is done and a case in which some constituent element intervenes.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device having a first read mode and a second read mode, comprising:
    a first memory cell and a second memory cell;
    a first word line electrically connected to a gate of the first memory cell and a gate of the second memory cell;
    a first bit line electrically connected to the first memory cell;
    a second bit line electrically connected to the second memory cell;
    a first sense amplifier configured to determine data read from the first memory cell at a first timing in the first and second read modes;
    a second sense amplifier configured to determine data read from the second memory cell at a second timing different from the first timing in the first read mode, and to determine the data at the first timing in the second read mode;
    a delay circuit configured to generate a second signal by delaying a first signal in the first read mode; and
    a controller,
    wherein in the second read mode, the first sense amplifier determines the data based on the first signal, and the second sense amplifier determines the data based on the second signal, and
    the controller is configured to:
    upon receipt of a first command set, supply the second signal to the second sense amplifier with a delay with respect to the first signal supplied to the first sense amplifier, thereby executing a read operation on the first memory cell and the second memory cell in the first read mode, and
    upon receipt of a second command set, supply the second signal to the second sense amplifier without the delay with respect to the first signal supplied to the first sense amplifier, thereby executing a read operation on the first memory cell and the second memory cell in the second read mode.

2. The device according to claim 1, further comprising a row decoder configured to transfer a voltage to the first word line,
    wherein a distance between the row decoder and the first memory cell is larger than a distance between the row decoder and the second memory cell.

3. The device according to claim 1, further comprising a driver circuit configured to apply a voltage to the first word line,
    wherein when the driver circuit applies the voltage to the first word line, a gate potential of the second memory cell rises later than a gate potential of the first memory cell rises.

4. The device according to claim 1, wherein the delay circuit is provided on a semiconductor substrate, and the first and second memory cells are provided above the delay circuit.

5. The device according to claim 1, wherein the first and second sense amplifiers are provided on a semiconductor substrate, and the first word line is provided above the first and second sense amplifiers,
    the device further comprises:
    a first transistor provided on the semiconductor substrate and connected to a driver circuit configured to supply a voltage; and
    a first contact plug provided on the first word line, and
    a current path length from the first contact plug to the second memory cell is larger than a current path length from the first contact plug to the first memory cell.

6. The device according to claim 5, wherein
    the first and second sense amplifiers are provided on the semiconductor substrate, and the first word line is provided above the first and second sense amplifiers,
    the device further comprises second and third contact plugs provided in a first region and connected to the first and second bit lines, and
    the first and second bit lines are connected to the first and second sense amplifiers via the second and third contact plugs.

7. The device according to claim 5, further comprising:
    a first wiring connected between the driver circuit and the first transistor,
    wherein when executing a read operation on the first memory cell and the second memory cell in the first read mode, the driver circuit supplies the voltage to the first wiring such that the voltage is increased in a proportional manner, and when executing the read operation on the first memory cell and the second memory cell in the second read mode, the driver circuit supplies the voltage to the first wiring such that the voltage is increased in a stepwise manner.

* * * * *